US010672762B2

(12) United States Patent
Yamano et al.

(10) Patent No.: US 10,672,762 B2
(45) Date of Patent: Jun. 2, 2020

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Akio Yamano, Matsumoto (JP); Aiko Takasaki, Matsumoto (JP); Hiroaki Ichikawa, Azumino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/429,086

(22) Filed: Jun. 3, 2019

(65) Prior Publication Data

US 2019/0287964 A1    Sep. 19, 2019

Related U.S. Application Data

(63) Continuation of application No. PCT/JP2018/020425, filed on May 28, 2018.

(30) Foreign Application Priority Data

Jun. 9, 2017 (JP) ................................. 2017-114661

(51) Int. Cl.
*H01L 27/07* (2006.01)
*H01L 23/522* (2006.01)
(Continued)

(52) U.S. Cl.
CPC ...... *H01L 27/0716* (2013.01); *H01L 21/3205* (2013.01); *H01L 21/768* (2013.01);
(Continued)

(58) Field of Classification Search
CPC . H01L 27/0716; H01L 21/768; H01L 27/718; H01L 23/522; H01L 27/0727
See application file for complete search history.

(56) References Cited

U.S. PATENT DOCUMENTS 5,437,405 A * 8/1995 Asanasavest ........ B23K 20/005
                                                         228/180.5
5,891,745 A * 4/1999 Dunaway ................ H01L 22/20
                                                         257/E21.525
(Continued)

FOREIGN PATENT DOCUMENTS

JP    H05283706 A    10/1993
JP    H07235672 A     9/1995
(Continued)

OTHER PUBLICATIONS

International Search Report for International Patent Application No. PCT/JP2018/020425, issued/mailed by the Japan Patent Office dated Aug. 7, 2018.

(Continued)

*Primary Examiner* — William Coleman

(57) ABSTRACT

A semiconductor device is provided to reduce thermal fatigue in a junction portion of an external wiring to enhance long-term reliability, where the semiconductor device includes a semiconductor substrate, a transistor portion and a diode portion that are alternately arranged along a first direction parallel to a front surface of the semiconductor substrate inside the semiconductor substrate, a surface electrode that is provided above the transistor portion and the diode portion and that is electrically connected to the transistor portion and the diode portion, an external wiring that is joined to the surface electrode and that has a contact width with the surface electrode in the first direction, the contact width being larger than at least one of a width of the transistor portion in the first direction and a width of the diode portion in the first direction.

26 Claims, 41 Drawing Sheets

(51) Int. Cl.
*H01L 23/00* (2006.01)
*H01L 29/66* (2006.01)
*H01L 29/739* (2006.01)
*H01L 29/861* (2006.01)
*H01L 29/78* (2006.01)
*H01L 21/3205* (2006.01)
*H01L 29/417* (2006.01)
*H01L 21/768* (2006.01)
*H01L 27/06* (2006.01)
*H01L 21/8234* (2006.01)

(52) U.S. Cl.
CPC ........ *H01L 21/8234* (2013.01); *H01L 23/522* (2013.01); *H01L 24/49* (2013.01); *H01L 27/06* (2013.01); *H01L 29/417* (2013.01); *H01L 29/66348* (2013.01); *H01L 29/739* (2013.01); *H01L 29/7397* (2013.01); *H01L 29/78* (2013.01); *H01L 29/8611* (2013.01); *H01L 2224/4826* (2013.01); *H01L 2224/4847* (2013.01); *H01L 2224/49175* (2013.01); *H01L 2224/49431* (2013.01)

(56) References Cited

U.S. PATENT DOCUMENTS

| | | | |
|---|---|---|---|
| 5,962,919 A * | 10/1999 | Liang | H01L 24/05 257/748 |
| 6,107,650 A | 8/2000 | Takahashi | |
| 6,281,959 B1 * | 8/2001 | Kim | G02F 1/13458 349/152 |
| 6,313,541 B1 * | 11/2001 | Chan | H01L 24/05 257/786 |
| 8,207,612 B2 * | 6/2012 | Torii | H01L 24/03 257/773 |
| 8,450,796 B2 * | 5/2013 | Nakata | H01L 29/41741 257/330 |
| 9,704,797 B2 * | 7/2017 | Lu | H01L 24/48 |
| 2008/0048295 A1 | 2/2008 | Takahashi | |
| 2009/0315175 A1 | 12/2009 | Okada | |
| 2010/0237480 A1 * | 9/2010 | Mii | H01L 23/49517 257/676 |

FOREIGN PATENT DOCUMENTS

| | | |
|---|---|---|
| JP | 2000004017 A | 1/2000 |
| JP | 2003188378 A | 7/2003 |
| JP | 2008047772 A | 2/2008 |
| JP | 2008053648 A | 3/2008 |
| JP | 2008258499 A | 10/2008 |
| JP | 2010283205 A | 12/2010 |
| JP | 2016225469 A | 12/2016 |

OTHER PUBLICATIONS (ISA/237) Written Opinion of the International Search Authority for International Application No. PCT/JP2018/020425, issued/mailed by the International Bureau of WIPO dated Aug. 7, 2018.

* cited by examiner

CROSS SECTION B-B'

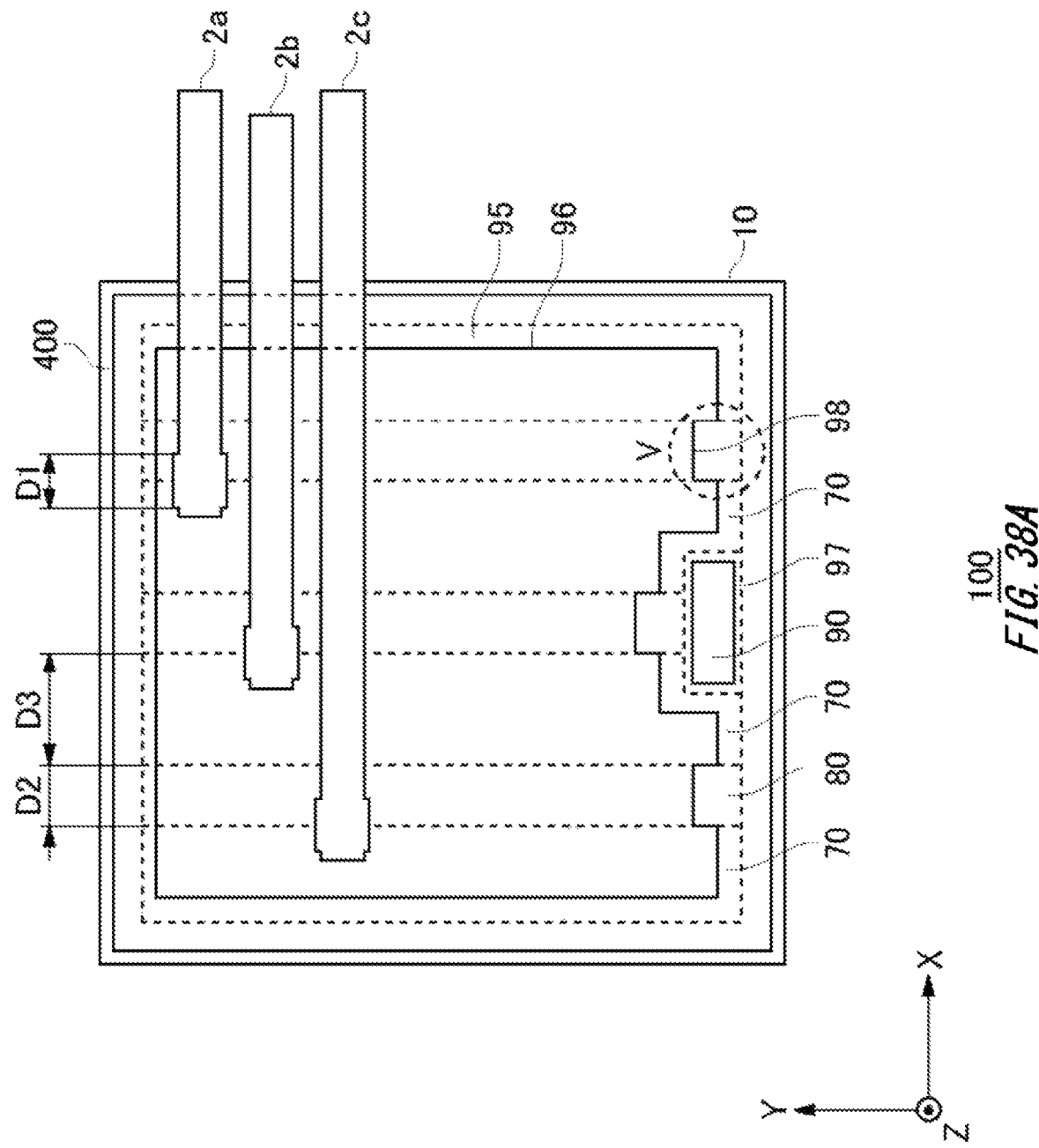

SEMICONDUCTOR DEVICE AND METHOD OF MANUFACTURING SEMICONDUCTOR DEVICE

The contents of the following Japanese patent applications are incorporated herein by reference:
NO. 2017-114661 filed on Jun. 9, 2017, and
NO. PCT/JP2018/020425 filed on May 28, 2018.

BACKGROUND

1. Technical Field

The present invention relates to a semiconductor device and a method of manufacturing a semiconductor device.

2. Related Art

Conventionally, a semiconductor device has been known, which has a transistor portion that includes an insulated gate bipolar transistor (IGBT), and a diode portion that includes a diode (for example, refer to Patent Document 1). The semiconductor device shown in Patent Document 1 has a planar shape in which the transistor portion and the diode portion are alternately arranged in a stripe pattern when viewed from a principal surface direction of the substrate. Also, an external wiring may be joined to a surface electrode outside the semiconductor device. A technology to set the number of a plurality of external wirings joined to a periphery portion of a surface electrode to be less than the number of external wirings joined to a central portion of the surface electrode has been known (for example, refer to Patent Document 2).

PATENT DOCUMENT

[Patent Document 1] Japanese Patent Application Publication No. 2008-53648
[Patent Document 2] Japanese Patent Application Publication No. 2003-188378

SUMMARY

For a semiconductor device, it is preferable to reduce thermal fatigue in a junction portion of an external wiring to enhance long-term reliability.

In a first aspect of the present invention, a semiconductor device may include a semiconductor substrate. The semiconductor device may include a transistor portion and a diode portion. The transistor portion and the diode portion may be alternately arranged along a first direction inside the semiconductor substrate. The first direction may be a direction parallel to a front surface of the semiconductor substrate. The semiconductor device may include a surface electrode. The surface electrode may be provided above the transistor portion and the diode portion. The surface electrode may be electrically connected to the transistor portion and the diode portion. The semiconductor device may include an external wiring. The external wiring may be joined to the surface electrode. The external wiring may have a contact width with the surface electrode in the first direction, where the contact width is larger than at least one of a width of the transistor portion in the first direction and a width of the diode portion in the first direction.

The contact width may be larger than each of the width of the transistor portion in the first direction and the width of the diode portion in the first direction.

The width of the transistor portion in the first direction may be larger than a width of the diode portion in the first direction.

The thickness of the semiconductor substrate may be larger than the half of the width of the diode portion in the first direction.

The thickness of the semiconductor substrate may be larger than the half of the width of the transistor portion in the first direction.

The external wiring may extend along the first direction.

The external wiring may be provided such that a region in which the external wiring is in contact with the surface electrode overlaps a boundary between the transistor portion and the diode portion when viewed from the front surface side of the semiconductor substrate.

If the surface electrode is distinguished into a central portion and an outer circumferential portion that surrounds the central portion when viewed from the front surface of the semiconductor substrate, the external wiring may be joined to the outer circumferential portion.

The external wiring may include at least one first external wiring and at least one second external wiring. The first external wiring and the second external wiring may be joined to opposite corners of the surface electrode when viewed from the front surface of the semiconductor substrate.

The semiconductor device may further include a solder layer below the semiconductor substrate. A sum of the thickness of the semiconductor substrate and the thickness of the solder layer may be larger than the width of the transistor portion in the first direction.

The semiconductor device may further include a solder layer below the semiconductor substrate. A sum of the thickness of the semiconductor substrate and the thickness of the solder layer may be larger than the width of the diode portion in the first direction.

The width of the diode portion in the first direction may be smaller than 540 μm. The width of the diode portion in the first direction may be smaller than 320 μm. The width of the transistor portion in the first direction may be two times or more and three times or less as large as the width of the diode portion in the first direction.

A junction portion in which the external wiring is in contact with the surface electrode may be disposed across the regions of the transistor portion and the diode portion.

A center in the first direction of the junction portion in which the external wiring is in contact with the surface electrode may be arranged above the boundary between the transistor portion and the diode portion.

The junction portion in which the external wiring is in contact with the surface electrode may extend in a direction orthogonal to the first direction.

The junction portion in which the external wiring is in contact with the surface electrode may extend in a direction parallel to the first direction.

The surface electrode may be a conductive material including aluminum.

The external wiring may include a plurality of external wirings each of which extends while being in contact with the surface electrode in a plurality of junction portions.

Each of the plurality of junction portions may overlap the boundary between the transistor portion and the diode portion when viewed from the front surface side of the semiconductor substrate.

The semiconductor device may include a protective film on an upper surface of the surface electrode. The protective film may include a first opening that exposes the surface electrode. The first opening may have a protruded portion in a plan view. A protruded part of the protruded portion may be arranged in a direction parallel to the first direction. An edge portion of the protruded portion perpendicular to the first direction may be arranged along the boundary between the transistor portion and the diode portion. The first opening may have a recessed portion in a plan view. A bottom portion of the recessed portion may be arranged in a direction parallel to the first direction. An edge portion of the recessed portion perpendicular to the first direction may be arranged along the boundary between the transistor portion and the diode portion.

In a second aspect of the present invention, a method of manufacturing a semiconductor device is provided. The semiconductor device may include a semiconductor substrate, a transistor portion and a diode portion that are alternately arranged along a first direction parallel to a front surface of the semiconductor substrate inside the semiconductor substrate, a surface electrode that is provided above the transistor portion and the diode portion and that is electrically connected to the transistor portion and the diode portion, and an external wiring that is joined to the surface electrode and that has a contact width with the surface electrode in the first direction, where the contact width is larger than at least one of a width of the transistor portion in the first direction and a width of the diode portion in the first direction. The manufacturing method may include a step of forming a protective film on an upper surface of the surface electrode. The manufacturing method may include a step of forming, in the protective film, a first opening that exposes the surface electrode after the step of forming the protective film. The external wiring may be positioned by using the first opening to be connected to the surface electrode.

The first opening may have a protruded portion in a plan view. The protruded part of the protruded portion may be formed in a direction parallel to the first direction. An edge portion of the protruded portion perpendicular to the first direction may be formed along the boundary between the transistor portion and the diode portion.

The first opening may have a recessed portion in the plan view. A bottom portion of the recessed portion may be formed in a direction parallel to the first direction. The edge portion of the recessed portion perpendicular to the first direction may be formed along the boundary between the transistor portion and the diode portion.

The summary clause does not necessarily describe all necessary features of the embodiments of the present invention. The present invention may also be a sub-combination of the features described above.

BRIEF DESCRIPTION OF THE DRAWINGS

FIG. 38A shows one example of positioning of the wire bonding of the semiconductor device 100.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, technical matters are described by using orthogonal coordinate axes of an X axis, a Y axis, and a Z axis. The orthogonal coordinate axes are merely used to specify relative positions of the components and are not intended to limit particular directions. For example, the Z axis does not indicate a direction limited to a height direction with respect to the ground. Note that a positive Z-axis direction and a negative Z-axis direction are directions that are opposite to each other. When the term "Z-axis direction" is described without describing the terms "positive" and "negative", it means a direction parallel to the positive Z axis and the negative Z axis.

Figure 1:
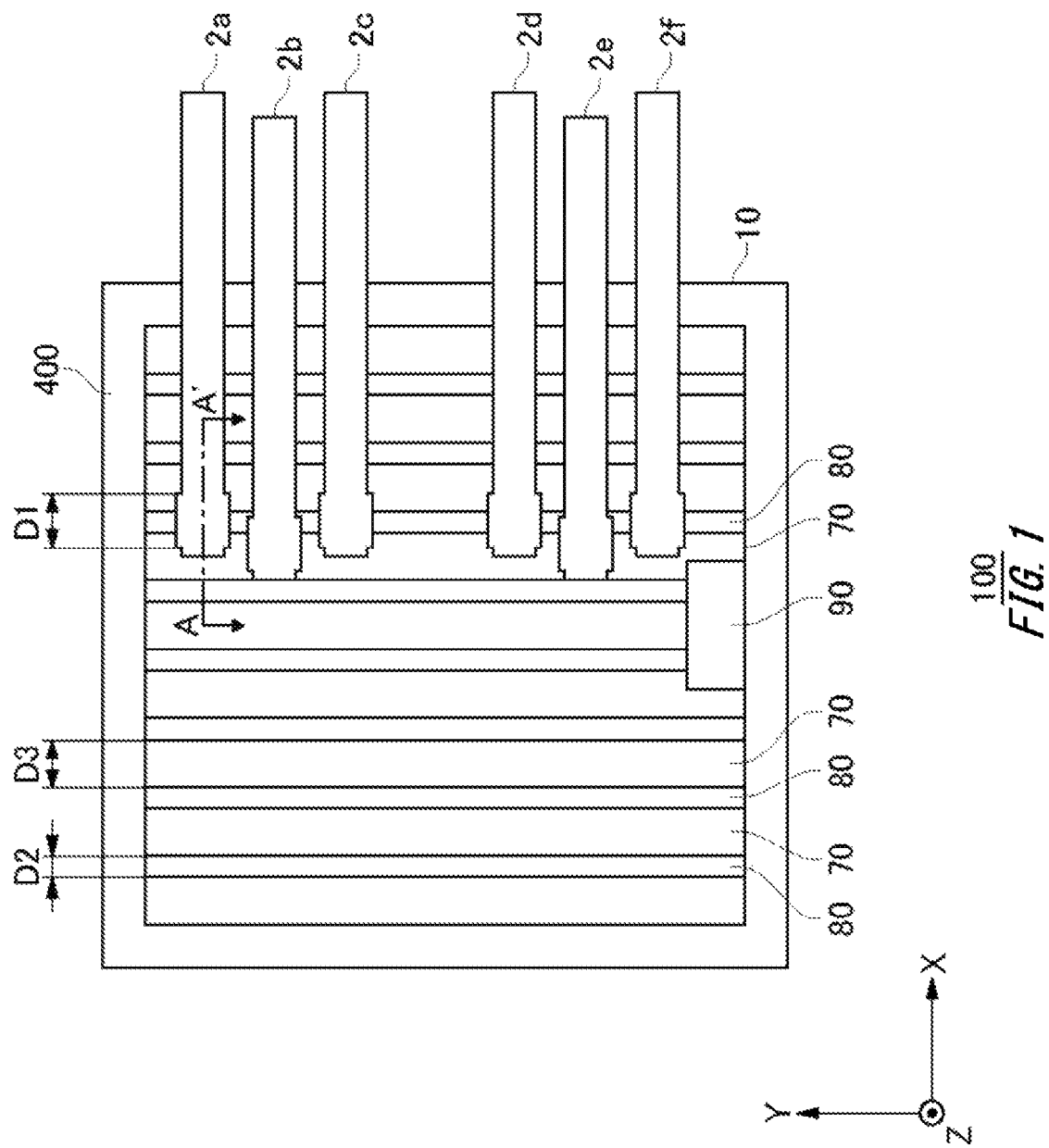
FIG. 1 shows a front surface of a semiconductor device 100 in an embodiment of the present invention.

FIG. 1 shows a front surface of a semiconductor device 100 in an embodiment of the present invention. The semiconductor device 100 of the present example is a semiconductor that has a transistor portion 70 and a diode portion 80 inside a semiconductor substrate 10. An edge termination structure portion 400 is included on an outer circumference of the transistor portion 70 and of the diode portion 80. According to the semiconductor device 100 of the present example, by restricting at least one of a width of the transistor portion 70 and a width of the diode portion 80 to a predetermined value or less, a temperature fluctuation range corresponding to positions within an XY plane of the semiconductor device 100 is small.

The semiconductor substrate 10 of the present example is a silicon (hereinafter, Si) substrate. In another example, the semiconductor substrate 10 may also be a compound semiconductor substrate, such as silicon carbide (SiC). The transistor portion 70 is a region including a transistor such as Insulated Gate Bipolar Transistor (IGBT). The diode portion 80 is a region including a diode such as Free Wheel Diode (FWD).

In the present example, the transistor portion 70 and the diode portion 80 are alternately arranged along the X-axis direction. The semiconductor substrate 10 may have a planar shape in which the transistor portion 70 and the diode portion 80 are alternately arranged in a stripe pattern when viewed from the front surface direction of the semiconductor substrate 10. The transistor portion 70 and the diode portion 80 may each extend in the Y-axis direction. The X-axis direction is a first direction parallel to the front surface of the semiconductor substrate 10. The Y-axis direction is a second direction that is parallel to the front surface of the semiconductor substrate 10 and is orthogonal to the first direction. In the present example, the front surface of the semiconductor substrate 10 is parallel to the XY plane.

A surface electrode is provided above the semiconductor substrate 10. In FIG. 1, to show an arrangement of the transistor portion 70 and the diode portion 80, the surface electrode is omitted. The surface electrode is electrically connected to the transistor portion 70 and the diode portion 80 through a contact hole and the like. A gate electrode 90 may be provided above the semiconductor substrate 10. The surface electrode and the gate electrode 90 are provided apart from each other. The gate electrode 90 is in contact with a gate wiring through a contact hole.

The surface electrode and the gate electrode 90 are formed of a material including metal. For example, at least a partial region of each electrode is formed of aluminum or aluminum alloy. Each electrode may have, in a lower layer of the region formed of aluminum and the like, barrier metal that is formed of titanium, titanium compound or the like. Further, within the contact hole, a plug may also be provided, the plug formed by embedding tungsten and the like such than the barrier metal is in contact with aluminum and the like. Note that at least a partial region of each electrode may also be formed of copper or copper alloy, and a proper material is selected according to a material of an external wiring 2.

The semiconductor device 100 has external wirings 2a, 2b, 2c, 2d, 2e, and 2f (hereinafter, they may be collectively referred to as the external wiring 2). The external wiring 2 may be a wire electrically connected to an emitter of the transistor portion 70. The external wiring 2 is joined to the surface electrode. The external wiring 2 may be an aluminum wire, an aluminum alloy wire, an aluminum-silicon wire, a copper wire, a copper alloy wire, a gold wire or a clad wire. The clad wire has a core material and an outer circumferential portion surrounding the core material. The core material may be formed of iron or iron alloy, and the outer circumferential portion may be formed of aluminum or aluminum alloy. A wire diameter of the external wiring 2 is preferably 300 μm or more and 600 μm or less, and more preferably 400 μm or more and 500 μm or less.

In the present example, a plurality of external wirings 2 are arranged by dividing into a group of the external wirings 2a, 2b and 2c, and a group of the external wirings 2d, 2e and 2f. However, the number and the arrangement of external wirings 2 are not limited to the case shown in FIG. 1. The external wiring 2 has a contact width D1 with a surface electrode in the X-axis direction, where the contact width D1 is larger than at least one of a width D3 of the transistor portion 70 in the X-axis direction and a width D2 of the diode portion 80 in the X-axis direction. Each of the plurality of external wirings 2 has the contact width D1 with the surface electrode in the X-axis direction, where the contact width D1 may be larger than at least one of the width D3 of the transistor portion 70 in the X-axis direction and the width D2 of the diode portion 80 in the X-axis direction.

Figure 2:
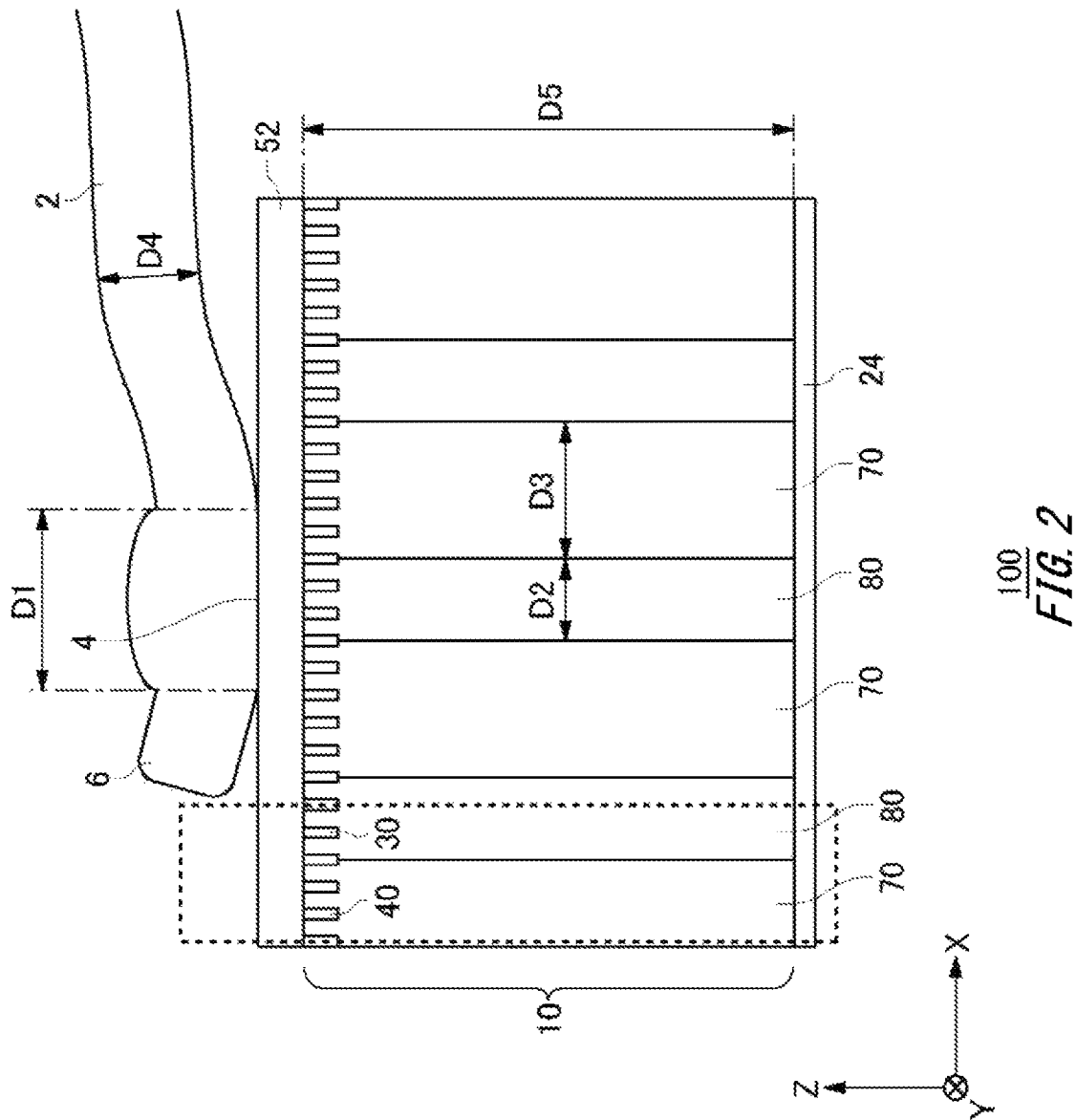
FIG. 2 shows one example of the cross section A-A' in FIG. 1.

FIG. 2 shows one example of the cross section A-A' in FIG. 1. FIG. 2 shows a schematic structure of the cross section A-A', a detailed structure is omitted. In the present example, a principal surface on the surface electrode 52 side of the semiconductor substrate 10 is referred to as a front surface, and the other principal surface on the opposite side to the front surface is referred to as a back surface. A direction toward the front surface from the back surface is conveniently referred to as an "upper" direction, and a direction opposite to the direction is conveniently referred to as a "lower" direction.

The semiconductor device 100 includes a gate trench portion 40 and a dummy trench portion 30 that are formed inside the semiconductor substrate 10 near the front surface. The gate trench portion 40 and the dummy trench portion 30 are examples of a trench portion. The semiconductor device 100 includes a collector electrode 24. The collector electrode 24 is formed on the back surface of the semiconductor substrate 10. In the present specification, a direction connecting the surface electrode 52 and the collector electrode 24 is referred to as a depth direction.

The width D3 of the transistor portion 70 in the X-axis direction is larger than the width D2 of the diode portion 80 in the X-axis direction. The width D3 of the transistor portion 70 may be two times or more and three times or less as large as the width D2 of the diode portion. The width D2 of the diode portion 80 may be 100 µm or more, and further preferably, the width D2 of the diode portion 80 may be 150 µm or more. On the other hand, the width D3 of the transistor portion 70 may be 200 µm or more. Further preferably, the width D3 of the transistor portion 70 may be 300 µm or more.

As at least one of the width D2 of the diode portion 80 and the width D3 of the transistor portion 70 is smaller, I-V characteristic when a forward voltage $V_f$ is applied to the diode portion 80 is more easily affected by a gate voltage of the transistor portion 70. Specifically, as the width D2 of the diode portion 80 or the like is smaller, a resistance value of the diode portion 80 when a forward current flows is larger. It is considered that this is caused by the increase of the number of boundaries between the transistor portion 70 and the diode portion 80 as at least one of the width D2 of the diode portion 80 and the width D3 of the transistor portion 70 is smaller.

Therefore, from a point of view of reducing the influence to the characteristic when the forward voltage $V_f$ is applied thereto, the width D2 of the diode portion 80 is preferably 100 µm or more, and more preferably may be 150 µm or more. Similarly, from a point of view of preventing the number of the boundaries between the diode portion 80 and the transistor portion 70 from excessively increasing, the width D3 of the transistor portion 70 is preferably 200 µm or more, and more preferably, may be 300 µm or more.

On the other hand, from a point of view of uniformizing a temperature distribution in the semiconductor substrate 10 during the operation of the transistor portion 70 and during the operation of the diode portion 80, it is desirable that the width D2 of the diode portion 80 is 320 µm or less. Similarly, from the point of view of uniformizing the temperature distribution, the width D3 of the transistor portion 70 is preferably 1000 µm or less, and more preferably, is 500 µm or less.

The external wiring 2 may include a junction portion 4 and a feed portion 6. The junction portion 4 is a portion joined to the surface electrode 52 when wire bonding is performed. In the junction portion 4, a length along an extending direction of the external wiring 2 is a junction length. The junction portion 4 extends in the extending direction of the external wiring 2. Therefore, in the present example, the junction portion 4 extends in a direction parallel to the first direction. A width of a direction perpendicular to the extending direction of the external wiring 2 in the junction portion 4 is a crushed width. In the present example, the external wiring 2 extends along the X-axis direction. When the external wiring 2 extends along the X-axis direction, the junction length is contact width D1. Therefore, by making the junction length long without depending on the crushed width, the contact width D1 can be made wide.

The contact width D1 of the external wiring 2 with the surface electrode 52 in the X-axis direction may be larger than each of the width D3 of the transistor portion 70 in the X-axis direction and the width D2 of the diode portion 80 in the X-axis direction. In other words, a pitch interval of the transistor portion 70 in the X-axis direction and a pitch interval of the diode portion 80 in the X-axis direction may be determined such that the width D3 of the transistor portion 70 in the X-axis direction and the width D2 of the diode portion 80 in the X-axis direction are smaller compared to the contact width D1 of the external wiring 2.

Further, the width D3 of the transistor portion 70 in the X-axis direction and the width D2 of the diode portion 80 in the X-axis direction may be smaller than a wire diameter D4 of the external wiring 2. As the width D3 of the transistor portion 70 and the width D2 of the diode portion 80 are smaller than the wire diameter D4 of the external wiring 2, the width D3 of the transistor portion 70 in the X-axis direction and the width D2 of the diode portion 80 in the X-axis direction can be made smaller compared to the contact width D1 of the external wiring 2 regardless of a process condition for wire bonding.

The external wiring 2 may be provided such that a contact region (that is, a region of the junction portion 4) in which the external wiring 2 is in contact with the surface electrode 52 overlaps the boundary between the transistor portion 70 and the diode portion 80 when viewed from the front surface side of the semiconductor substrate 10. In other words, the junction portion 4 in which the external wiring 2 is in contact with the surface electrode 52 is disposed across the region of the transistor portion 70 and the region of the diode portion 80. The region of the transistor portion 70 is a region occupied by the transistor portion 70 when viewed from the front surface side of the semiconductor substrate 10. The region of the diode portion 80 is a region occupied by the diode portion 80 when viewed from the front surface side of the semiconductor substrate 10. In the example shown in FIG. 2, as the boundary between the transistor portion 70 and the diode portion 80, a plurality of boundaries therebetween overlap the contact region. However, one boundary may also overlap the region of the junction portion 4.

A thickness D5 of the semiconductor substrate 10 may be larger than the half of the width D2 of the diode portion 80 in the X-axis direction. In other words, the width D2 of the diode portion 80 in the X-axis direction may be smaller than two times as large as the thickness D5 of the semiconductor substrate 10. Also, the thickness D5 of the semiconductor substrate 10 may be larger than the half of the width D3 of the transistor portion 70 in the X-axis direction. In other words, the width D3 of the transistor portion 70 in the X-axis direction may be smaller than two times as large as the thickness D5 of the semiconductor substrate 10. The thickness D5 of the semiconductor substrate 10 may be 100 μm or more, and more preferably, may be 100 μm or more and 200 μm or less.

As the thickness D5 of the semiconductor substrate 10 is thinner, heat conduction from a region that is generating heat to an adjacent region is difficult and the temperature distribution is easily nonuniform. Therefore, as the thickness D5 of the semiconductor substrate 10 is thinner, it is preferable to make the width D2 of the diode portion 80 in the X-axis direction and the width D3 of the transistor portion 70 in the X-axis direction small to achieve uniformity of the temperature distribution.

Figure 3:
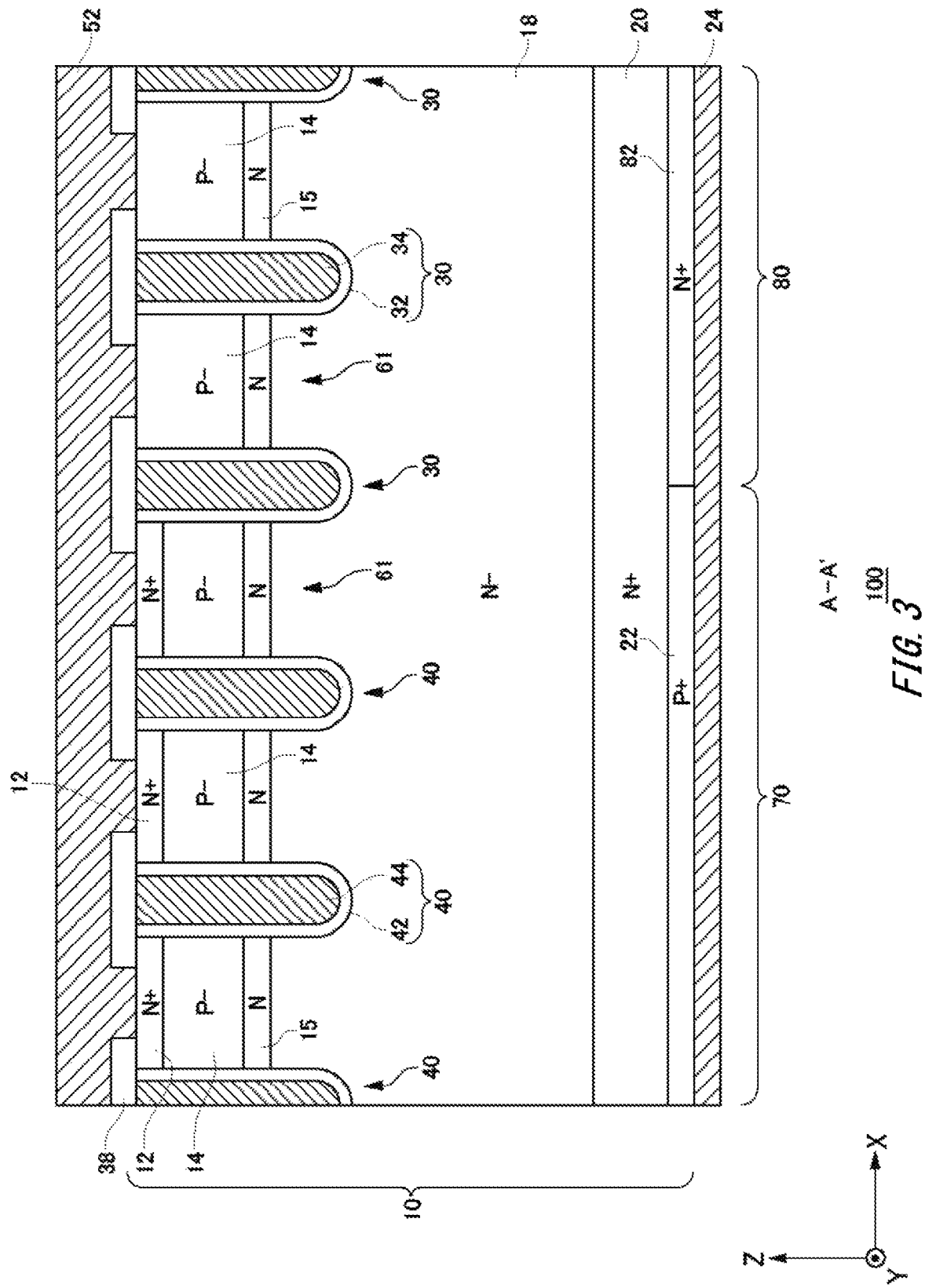
FIG. 3 shows an enlarged view of one example of the cross section A-A' in FIG. 1.

FIG. 3 is an enlarged view of one example of the cross section A-A' in FIG. 1. FIG. 3 shows the portion surrounded by the dotted line in FIG. 2. The semiconductor device 100 of the present example has the semiconductor substrate 10, an interlayer dielectric film 38, the surface electrode 52 and the collector electrode 24. The surface electrode 52 of the present example is an emitter electrode. However, the surface electrode 52 can be any electrode that can be joined to the external wiring 2 and that can be electrically connected to the transistor portion 70 and the diode portion 80, and is not limited to an emitter electrode. In one example, the surface electrode 52 may be a metal layer stacked above the emitter electrode via a second interlayer dielectric film. In this case, the surface electrode 52 may be electrically connected to the emitter electrode via a contact hole that is provided in the second interlayer dielectric film.

The surface electrode 52 and the collector electrode 24 are formed of a conductive material such as metal. In one example, the surface electrode 52 may also be an Al—Si electrode in which silicon (Si) atoms at a solid solubility limit or more are added to aluminum (Al). The surface electrode 52 may also be an Al—Si—Cu electrode in which Si and copper (Cu) are added to Al. Also, in one example, the collector electrode 24 may also be an electrode in which titanium (Ti), nickel (Ni), gold (Au) are stacked on Al—Si in which silicon (Si) atoms at a solid solubility limit or more are added to aluminum (Al). The collector electrode 24 may also an Al—Si—Cu electrode in which Si and copper (Cu) are added to Al. Also, the collector electrode may also be an Al electrode.

At the cross section shown in FIG. 3, a base region 14 is formed in a mesa portion 61 that is sandwiched by respective trench portions such as the gate trench portion 40 and the dummy trench portion 30. The mesa portion 61 is a region closer to the front surface than the deepest bottom portion of the trench portion in a region of the semiconductor substrate 10 sandwiched by the trench portions. The base region 14 is of a second conductivity type and has a lower doping concentration than that of a well region. In the transistor portion 70, an emitter region 12 of a first conductivity type is selectively formed in a part of an upper surface of the base region 14, the emitter region 12 having a higher doping concentration than that of the semiconductor substrate. The emitter region 12 in the present example is an N+ type. Also, an accumulating layer 15 of a first conductivity type is selectively formed on a lower surface of the base region 14, the accumulating layer 15 having a doping concentration that is higher than that of the semiconductor substrate and is lower than that of the emitter region 12. The accumulating layer 15 of the present example is an N type.

Therefore, on a front surface side of the transistor portion 70, the emitter region 12 of an N+ type and the base region 14 of a P− type, and the accumulating layer 15 of an N type are formed in this order from the front surface side of the semiconductor substrate 10. At the cross section A-A', the base region 14 of a P− type is formed on a front surface side of the diode portion 80.

In the transistor portion 70, the accumulating layer 15 of an N type is formed between a lower surface of the base region 14 of a P− type and a drift region 18 of an N− type. In the diode portion 80, the accumulating layer 15 of an N type is formed between a lower surface of the base region 14 and the drift region 18. A buffer region 20 of an N+ type is formed on a lower surface of the drift region 18 in both of the transistor portion 70 and the diode portion 80.

The buffer region 20 is formed on the lower surface side of the drift region 18. A doping concentration of the buffer region 20 is higher than a doping concentration of the drift region 18. The buffer region 20 may function as a field stop layer that prevents a depletion layer spreading from the lower surface side of the base region 14 from reaching a collector region 22 of a P+ type and a cathode region 82 of an N+ type.

In the transistor portion 70, the collector region 22 of a P+ type is formed on a lower surface of the buffer region 20. In the diode portion 80, the cathode region 82 of an N+ type is formed on the lower surface of the buffer region 20. Note that in an active region, a region on the lower surface corresponding to the cathode region 82 is set as the diode portion 80. Also, a projected region on which the cathode region 82 is projected in a direction perpendicular to the back surface of the semiconductor substrate 10 relative to the front surface of the semiconductor substrate 10 may also be set as the diode portion 80. Also, in the active region, a projected region on which the collector region 22 is projected in the direction perpendicular to the back surface of the semiconductor substrate 10 relative to the front surface of the semiconductor substrate, the projected region being a region in which a predetermined unit structure including the emitter region 12 is regularly arranged is set to the transistor portion 70.

On the front surface side of the semiconductor substrate 10, one or more gate trench portions 40 and one or more dummy trench portions 30 are formed. Each trench portion penetrates the base region 14 from the front surface of the semiconductor substrate 10 and reaches the drift region 18. In the region in which the emitter region 12 is provided, each trench portion also penetrates the emitter region 12 and reaches the drift region 18. That the trench portion penetrates the doping region is not limited to a manufacturing process that is performed in an order of forming the doping region and subsequently forming the trench portion. That the doping region is formed between the trench portions after forming the trench portions is included in that the trench portion penetrates the doping region.

The gate trench portion 40 has a gate trench, a gate insulating film 42 and a gate conductive portion 44 that are formed on the front surface side of the semiconductor substrate 10. The gate insulating film 42 is formed covering an inner wall of the gate trench. The gate insulating film 42 may be formed by oxidizing or nitriding a semiconductor in the inner wall of the gate trench. The gate conductive portion 44 is formed on the inside of the gate insulating film 42 inside the gate trench. That is, the gate insulating film 42 insulates the gate conductive portion 44 and the semiconductor substrate 10. The gate conductive portion 44 is formed of conductive material such as polysilicon.

The gate conductive portion 44 includes a region in a depth direction, which sandwiches the gate insulating film 42 and is opposite to at least an adjacent base region 14. The gate trench portion 40 at the cross section A-A' is covered by an interlayer dielectric film 38 on the front surface of the semiconductor substrate 10. When a predetermined voltage is applied to the gate conductive portion 44, a channel by an inversion layer of electrons is formed on a surface layer of an interface in contact with the gate trench of the base region 14.

The dummy trench portion 30 may have the same structure as to that of the gate trench portion 40 at the cross section A-A'. The dummy trench portion 30 has a dummy trench, a dummy insulating film 32 and a dummy conductive portion 34 that are formed on the front surface side of the semiconductor substrate 10. The dummy insulating film 32 is formed covering an inner wall of the dummy trench. The dummy conductive portion 34 is formed inside the dummy trench and is formed on the inside of the dummy insulating film 32. The dummy insulating film 32 insulates the dummy conductive portion 34 and the semiconductor substrate 10. The dummy conductive portion 34 may be formed of the same material as that of the gate conductive portion 44. For example, the dummy conductive portion 34 is formed of a conductive material such as polysilicon. The dummy conductive portion 34 may have the same length of that of the gate conductive portion 44 in the depth direction. The dummy trench portion 30 at the cross section is covered by the interlayer dielectric film 38 on the upper surface of the semiconductor substrate 10. Note that a bottom portion of the dummy trench portion 30 and of the gate trench portion 40 may have a downwardly convex curved surface shape (a curved line shape at the cross section).

Figure 4:
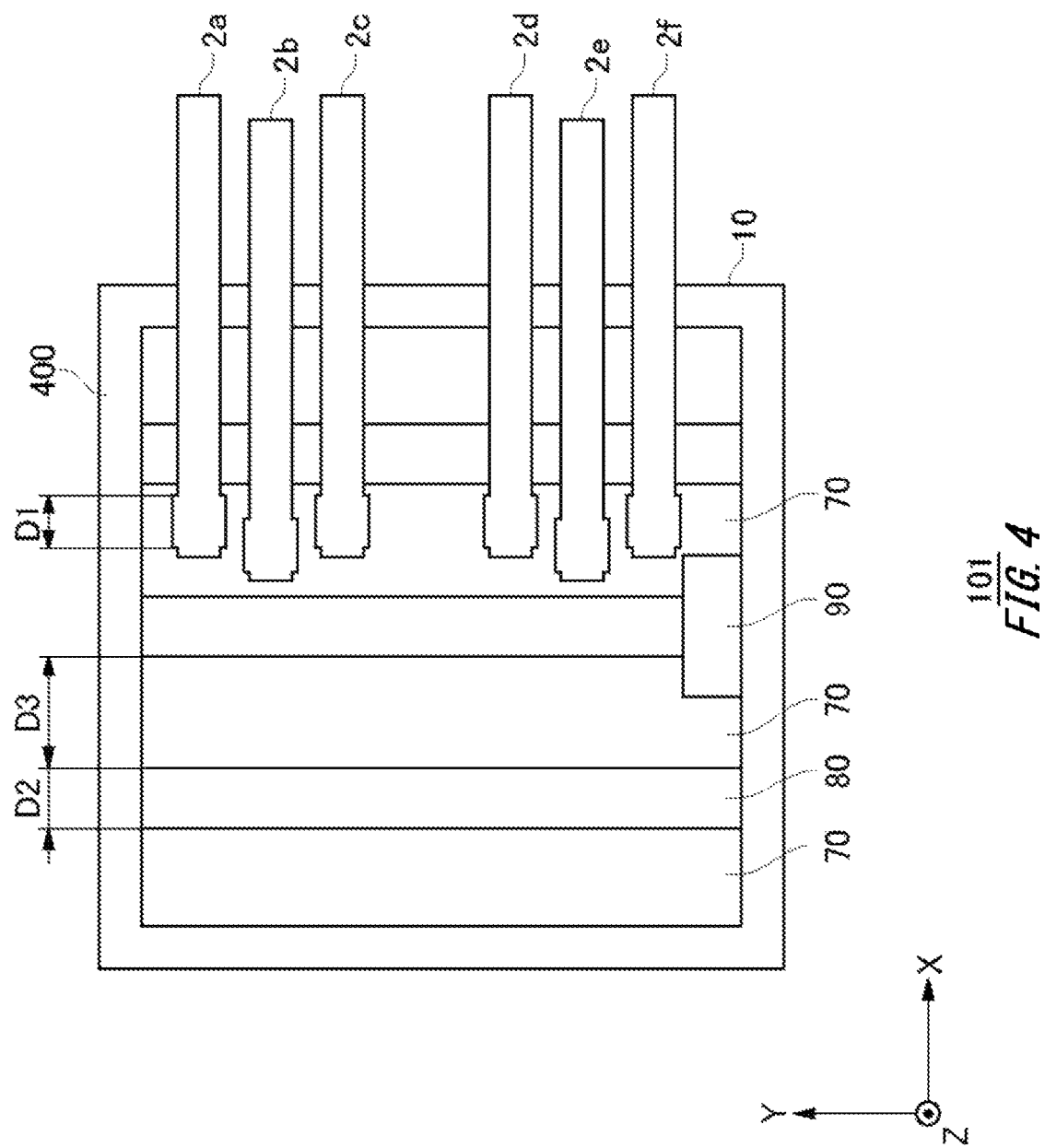
FIG. 4 shows a front surface of a semiconductor device 101 in a comparative example.

The semiconductor device 100 configured as described above is described by comparing to a comparative example. FIG. 4 shows the front surface of the semiconductor device 101 in the comparative example. In the semiconductor device 101 of comparative example, the width D3 of the transistor portion 70 and the width D2 of the diode portion 80 are larger compared to the semiconductor device 100 in the embodiment of the present invention. In the semiconductor device 101 of the comparative example, the contact width D1 with the surface electrode in the X-axis direction is smaller than each of the width D3 of the transistor portion 70 in the X-axis direction and the width D2 of the diode portion 80 in the X-axis direction.

In the example shown in FIG. 4, a state is shown that a contact region in which the external wiring 2 is in contact with the surface electrode 52 does not overlap the boundary between the transistor portion 70 and the diode portion 80 when viewed from the front surface side of the semiconductor substrate 10. The position of the junction portion 4 of the external wiring 2 may change according to a process step. Therefore, according to the change of the position of the junction portion 4 of the external wiring 2, the external wiring 2 may be arranged such that a contact region in which the external wiring 2 is in contact with the surface electrode 52 does not overlap the boundary between the transistor portion 70 and the diode portion 80 when viewed from the front surface side of the semiconductor substrate 10.

Figure 5:
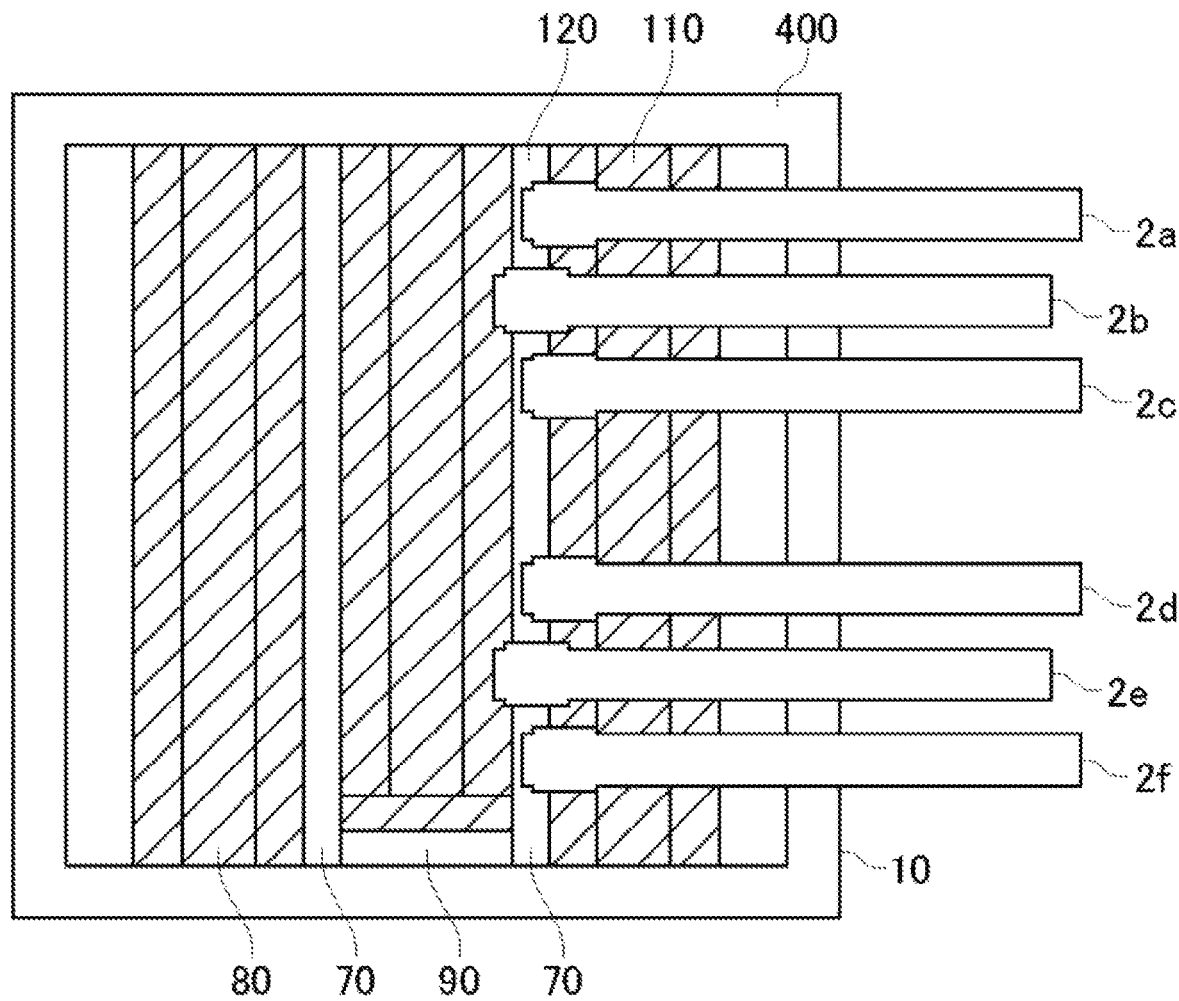
FIG. 5 shows one example of heat diffusion during an operation of a diode portion 80 in the comparative example.
Figure 6:
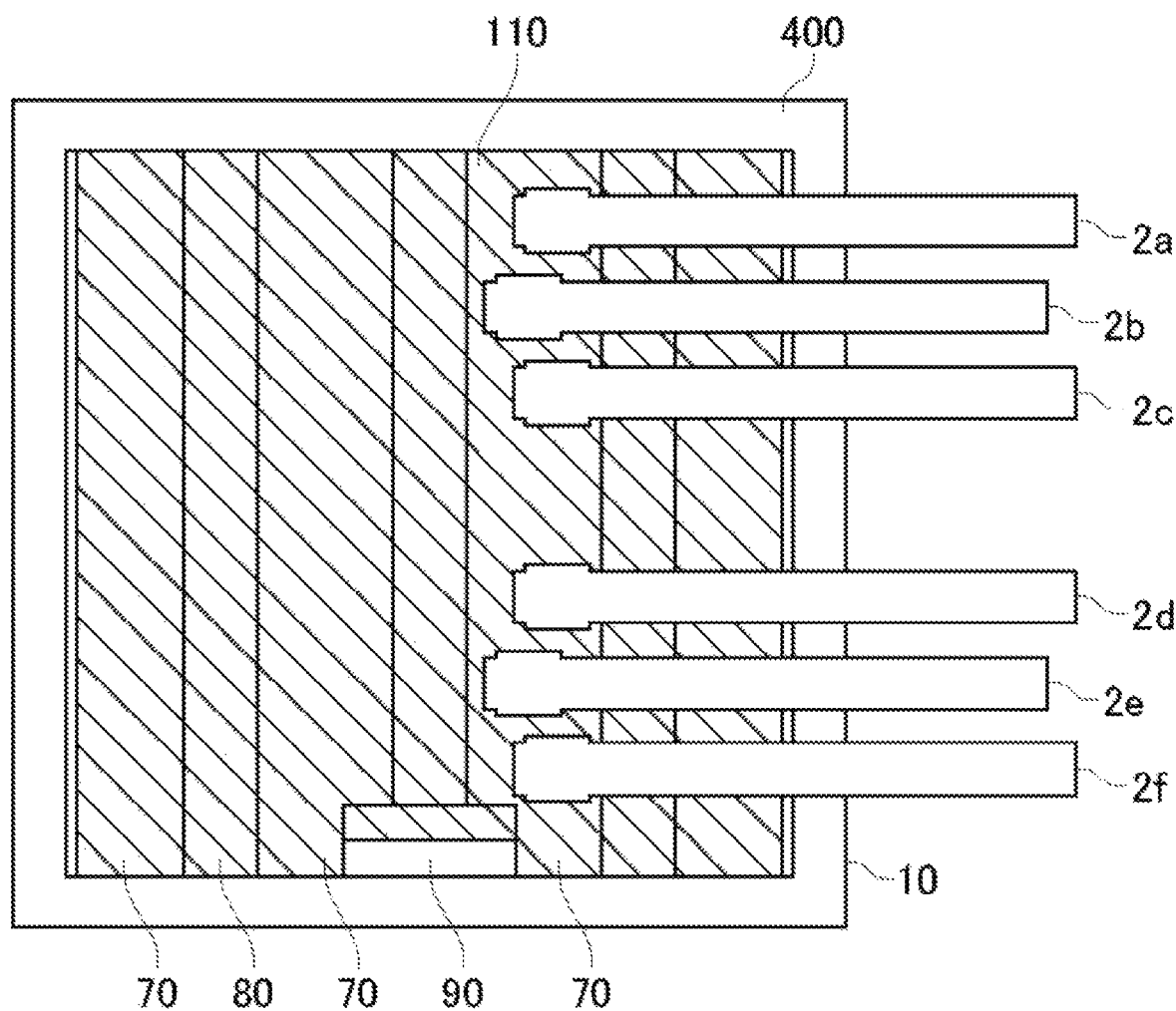
FIG. 6 shows one example of heat diffusion during an operation of a transistor portion 70 in the comparative example.

FIG. 5 shows one example of heat diffusion during an operation of the diode portion 80 in the comparative example. FIG. 6 shows one example of heat diffusion during an operation of the transistor portion 70 in the comparative example. In the semiconductor device 101, when the transistor portion 70 is operated and is generating heat, the diode portion 80 may be paused and may not generate heat. On the contrary, when the diode portion 80 is operated and is generating heat, the transistor portion 70 may be paused and may not generate heat.

In FIG. 5 and FIG. 6, a heat diffused region 110 in which heat is diffused and the temperature becomes high to a predetermined value or more is shown by hatching. On the other hand, a heat-not-diffused region 120 in which heat is not sufficiently diffused and the temperature is less than the predetermined value is shown without hatching. The width D3 of the transistor portion 70 in the X-axis direction and the width D2 of the diode portion 80 in the X-axis direction in the semiconductor device 101 of the comparative example are larger compared to the widths D3 and D2 in the semiconductor device 100 in the embodiment of the present invention. Therefore, as shown in FIG. 5, in the semiconductor device 101 of the comparative example, the heat diffused region 110 and the heat-not-diffused region 120 are generated, and the temperature distribution on a plane may be nonuniform.

Also, as shown in FIG. 5 and FIG. 6, a temperature difference occurring on the junction portion 4 of the external wiring 2 during the operation of the diode portion 80 and during the operation of the transistor portion 70 is larger compared to the semiconductor device 100 in the embodiment of the present invention. In the junction portion 4, thermal fatigue is easily generated due to repeated increase and decrease of the temperature.

Figure 7:
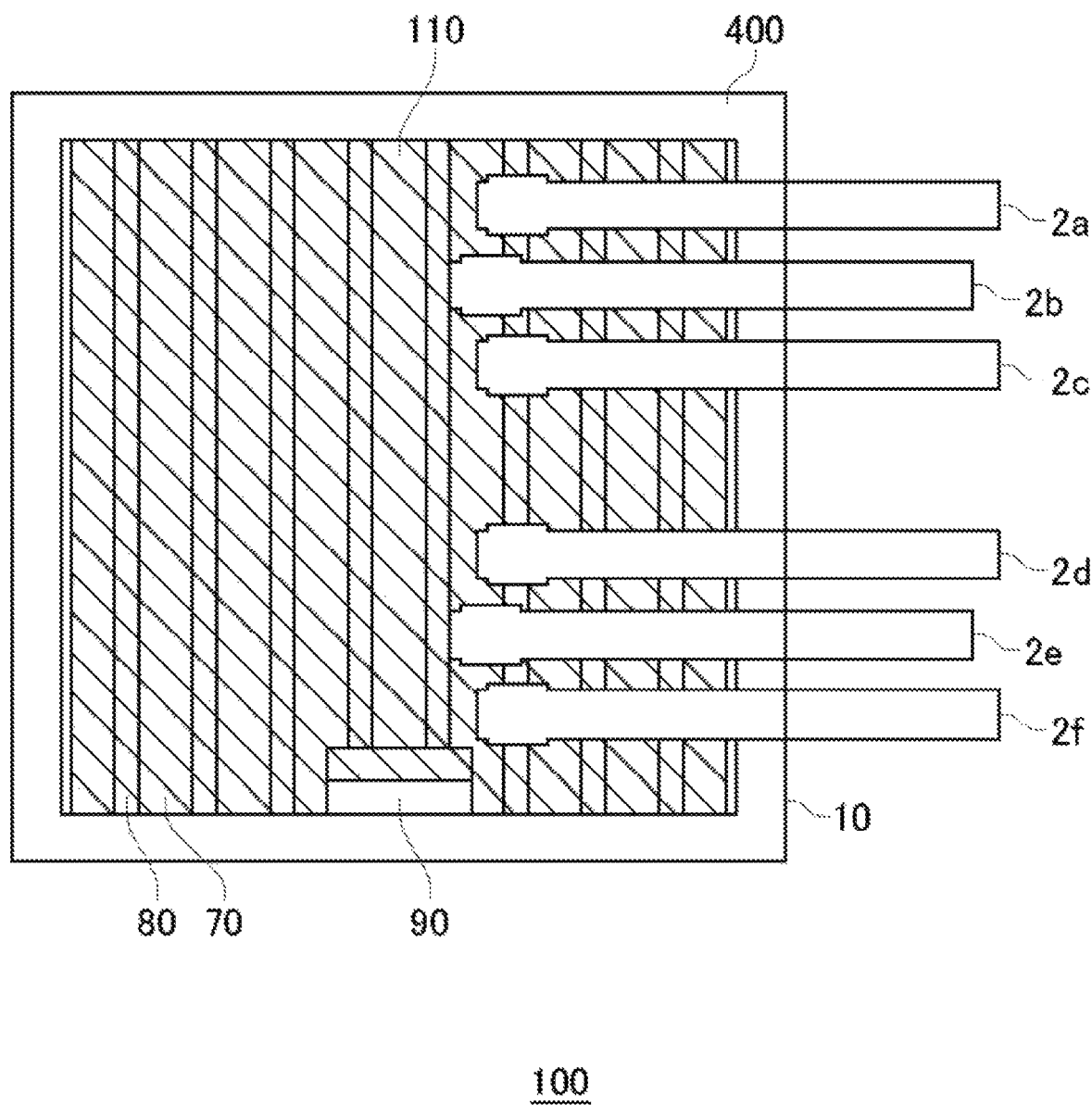
FIG. 7 shows one example of heat diffusion in the semiconductor device 100 in the embodiment of the present invention.

FIG. 7 shows one example of heat diffusion in the semiconductor device 100 in the embodiment of the present invention. FIG. 7 shows one example of heat diffusion during the operation of the diode portion 80 in the semiconductor device 100. A width of the transistor portion 70 in the X-axis direction and the width of the diode portion 80 in the X-axis direction in the semiconductor device 100 are smaller compared to the respective widths in the semiconductor device 101 of the comparative example.

Therefore, even during the operation of the diode portion 80, because the width D3 of the adjacent transistor portion 70 is smaller compared to the case of the comparative example, heat is sufficiently diffused in the entire region of the adjacent transistor portion 70. For that reason, uniformity of a plane temperature distribution of the semiconductor device 100 is higher compared to the case of the comparative example. Even during the operation of the transistor portion 70, because the width D2 of the adjacent diode portion 80 is smaller compared to the case of the comparative example, heat is sufficiently diffused in the entire region of the adjacent diode portion 80. Therefore, the temperature difference occurring in the junction portion 4 of the external wiring 2 during the operation of the diode portion 80 and during the operation of the transistor portion 70 is smaller compared to the case of the comparative example. Accordingly, thermal fatigue is reduced in the junction portion 4, long-term reliability of the semiconductor device 100 can be enhanced.

In particular, when the semiconductor device 100 is driven, if the boundary between the transistor portion 70 and the diode portion 80 overlaps the contact region of the external wiring 2, either transistor portion 70 or diode portion 80 is generating heat in the region overlapping the contact region of the external wiring 2. The junction portion 4 is arranged so as to be disposed across the region of the transistor portion 70 and the region of the diode portion 80, thereby reducing the difference in the temperatures given to the junction portion 4 of the external wiring 2 between the case where the transistor portion 70 is operated and the case where the diode portion 80 is operated. Therefore, the fluctuation of the temperature in the junction portion 4 is small and thermal fatigue is reduced, thereby enhancing the long-term reliability of the semiconductor device 100.

When the contact width D1 with the surface electrode 52 of the external wiring 2 in the X-axis direction is larger than each of the width D3 of the transistor portion 70 in the X-axis direction and the width D2 of the diode portion 80 in the X-axis direction, even if the position of the junction portion 4 of the external wiring 2 changes, the contact region of the external wiring 2 overlaps the boundary between the transistor portion 70 and the diode portion 80 when viewed from the front surface side of the semiconductor substrate 10. Therefore, even if the position of the junction portion 4 of the external wiring 2 changes according to the process step, the long-term reliability of the semiconductor device 100 can be enhanced, as described above.

Figure 8:
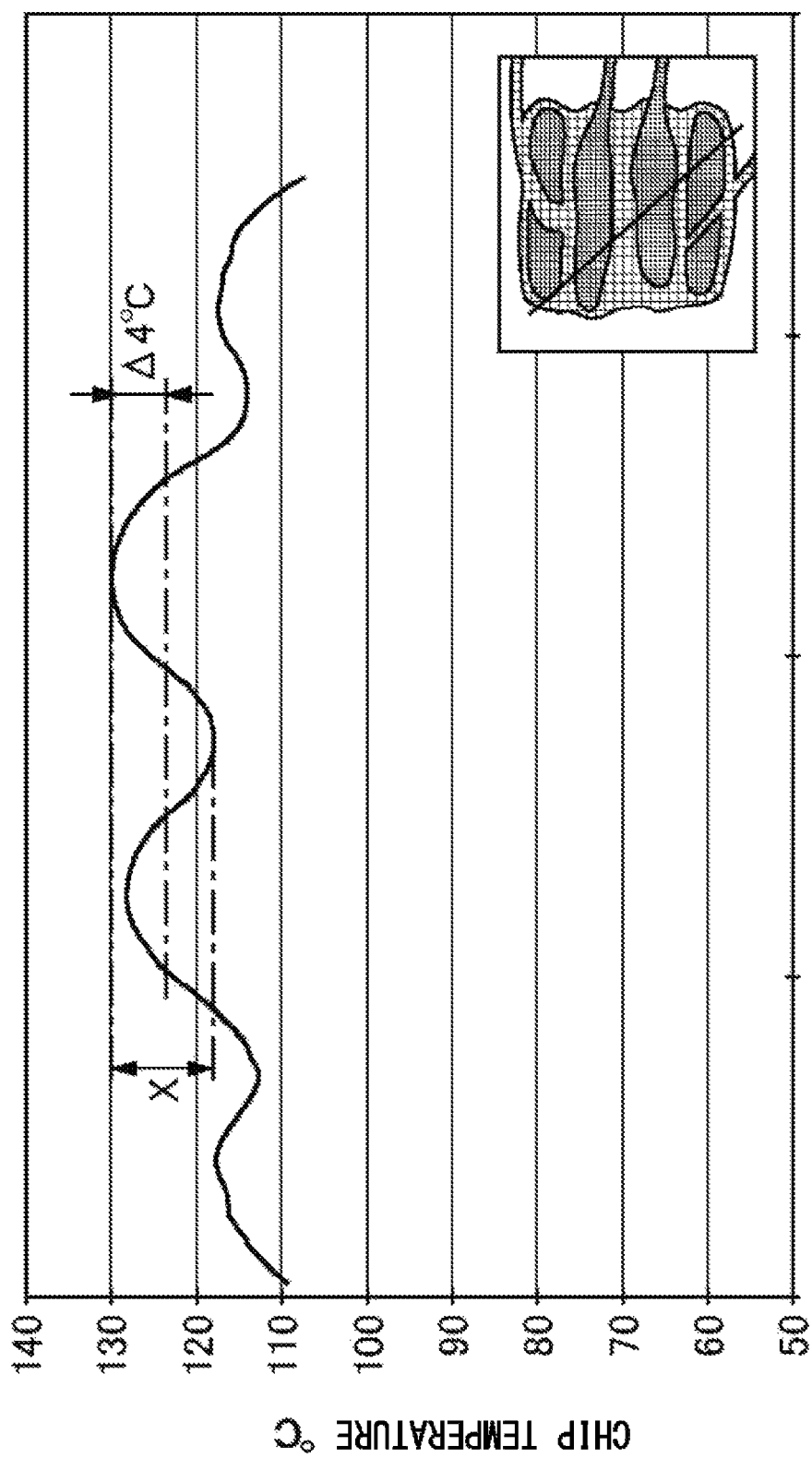
FIG. 8 shows one example of a temperature distribution in a case where current flows through the transistor portion 70 in the semiconductor device 100 in which the diode portion 80 has a width of 540 μm.
Figure 9:
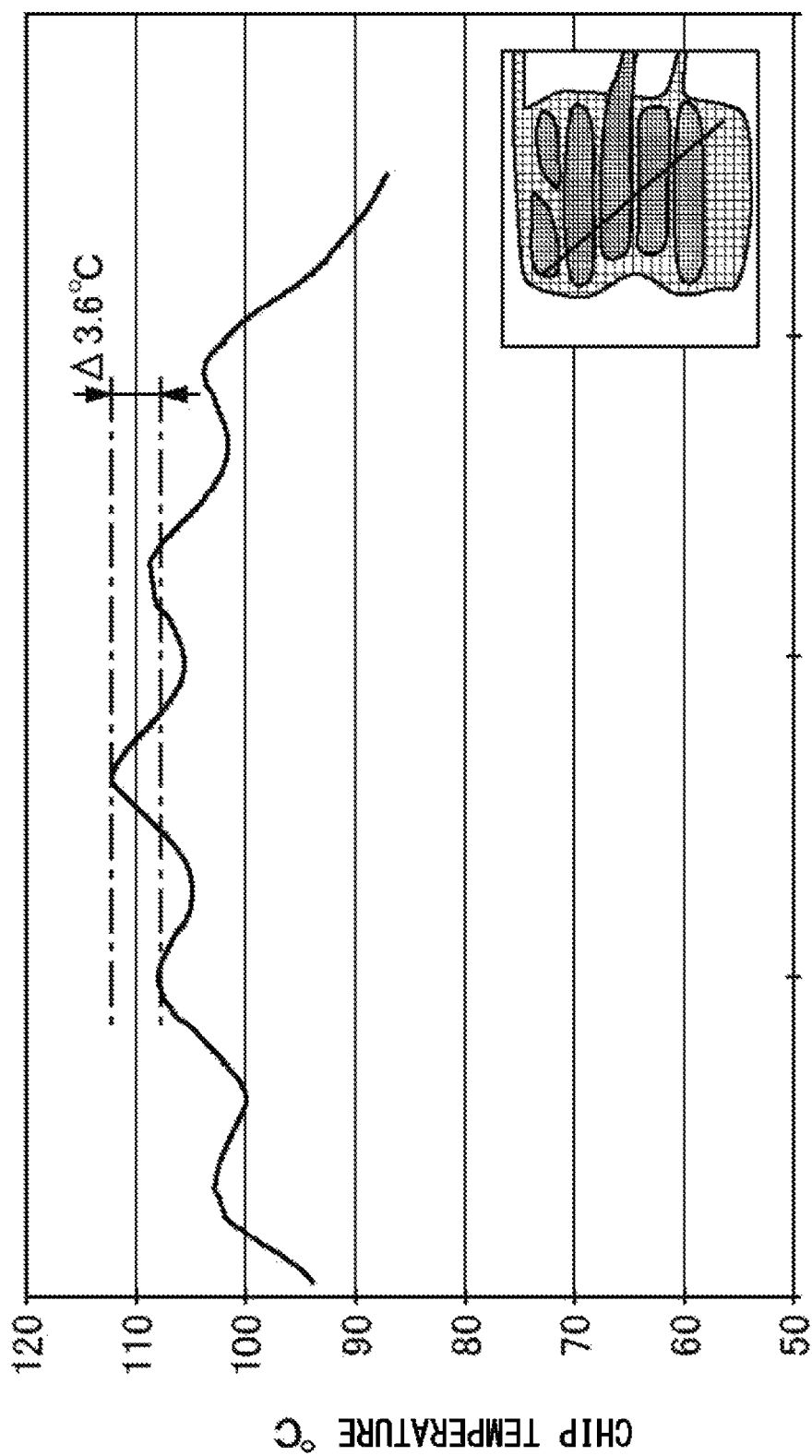
FIG. 9 shows one example of a temperature distribution in a case where current flows through the transistor portion 70 in the semiconductor device 100 in which the diode portion 80 has a width of 310 μm.
Figure 10:
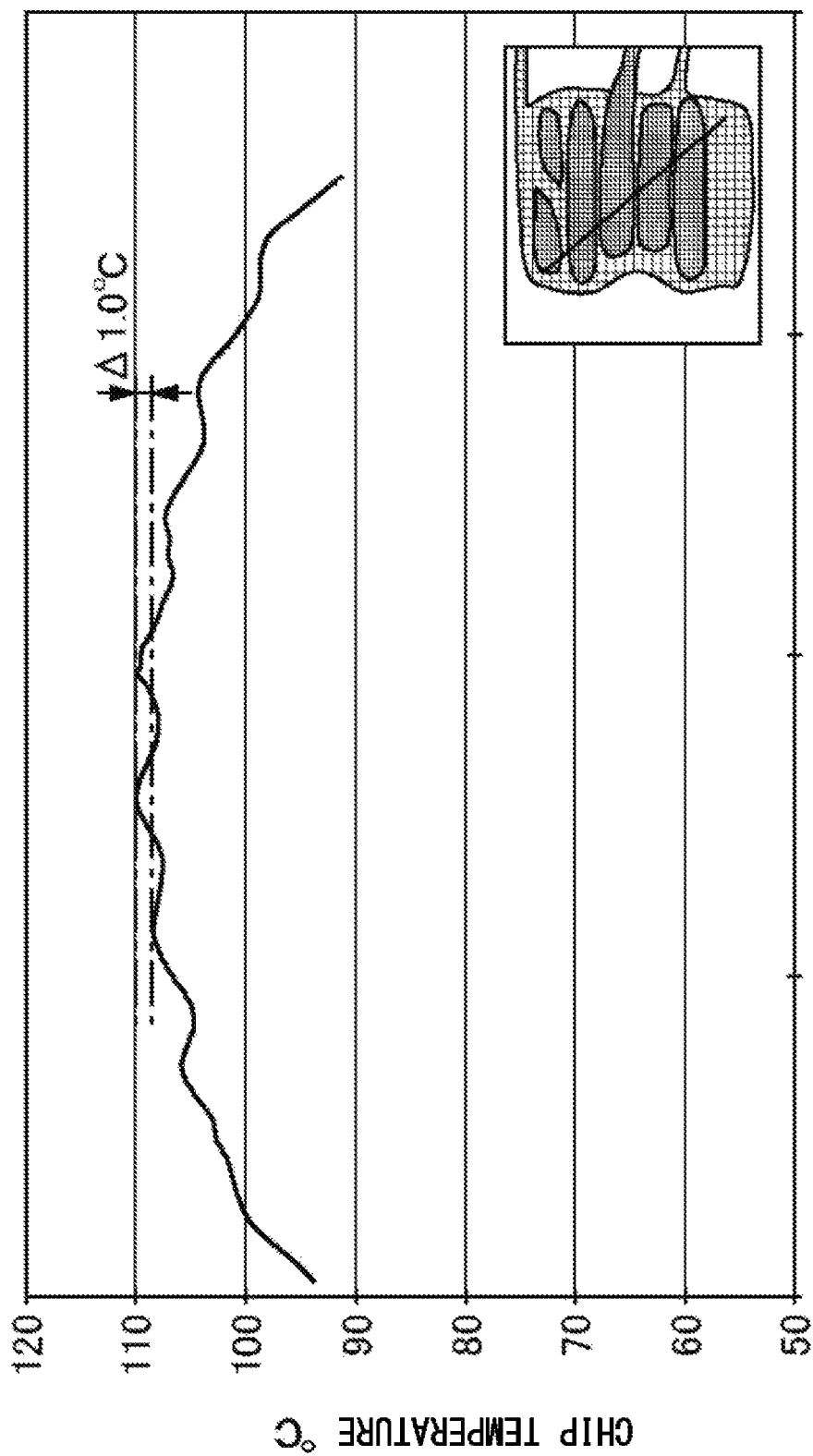
FIG. 10 shows one example of a temperature distribution in a case where current flows through the transistor portion 70 in the semiconductor device 100 in which the diode portion 80 has a width of 200 μm.

FIG. 8 shows one example of the temperature distribution in a case where current flows through the transistor portion 70 in the semiconductor device 100 in which the diode portion 80 has the width D2 of 540 μm. The width D3 of the transistor portion 70 is 1050 μm that is approximately twice as large as the width D2 of the diode portion 80. FIG. 9 shows one example of the temperature distribution in a case where current flows through the transistor portion 70 in the semiconductor device 100 in which the diode portion 80 has the width D2 of 310 μm. The width D3 of the transistor portion 70 is 710 μm that is approximately 2.3 times as large as the width D2 of the diode portion 80. FIG. 10 shows one example of the temperature distribution in a case where current flows through the transistor portion 70 in the semiconductor device 100 in which the diode portion 80 has the width D2 of 200 μm. The width D3 of the transistor portion 70 is 470 μm that is approximately 2.4 times as large as the width D2 of the diode portion 80.

The vertical axis respectively in FIG. 8, FIG. 9 and FIG. 10 indicates a chip temperature (° C.) of the semiconductor device 100. The horizontal axis indicates the positions on a diagonal line of the semiconductor device 100. In FIG. 8, FIG. 9 and FIG. 10, driving conditions of the semiconductor device 100, that is, conditions of current, voltage and frequency are the same.

As shown in FIG. 8, FIG. 9 and FIG. 10, when the semiconductor device 100 is driven, the temperature is fluctuated in response to the position in the plane of the semiconductor device 100. The temperature repeatedly increases and decreases in accordance with the position, and has a distribution in a wave shape. The fluctuation range of the temperature in a case of FIG. 8 (in a case where the D2 is 540 μm) is Δ4.0° C., the fluctuation range of the temperature in a case of FIG. 9 (in a case where the D2 is 310 μm) is Δ3.6° C. and the fluctuation range of the temperature in a case of FIG. 10 (in a case where the D2 is 200 μm) us Δ1.0° C. The fluctuation range of the temperature means amplitude of the temperature distribution in a wave shape, that is, a ripple width of the temperature distribution. The amplitude may be the half of a value of a difference X between a local maximal value and a local minimal value of the temperature distribution in a wave shape.

Figure 11:
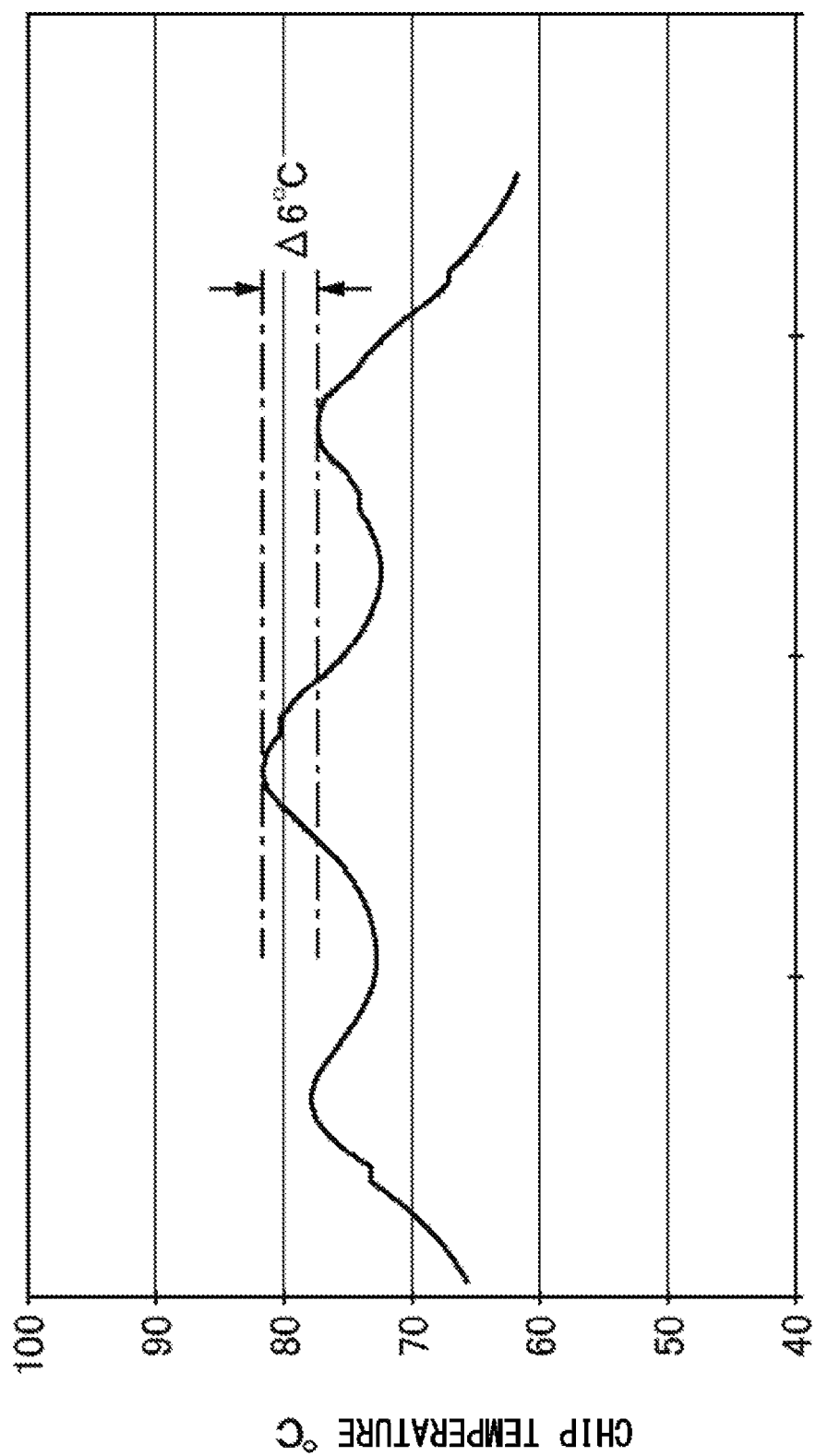
FIG. 11 shows one example of a temperature distribution in a case where current flows through the diode portion 80 in the semiconductor device 100 in which the diode portion 80 has a width of 540 μm.
Figure 12:
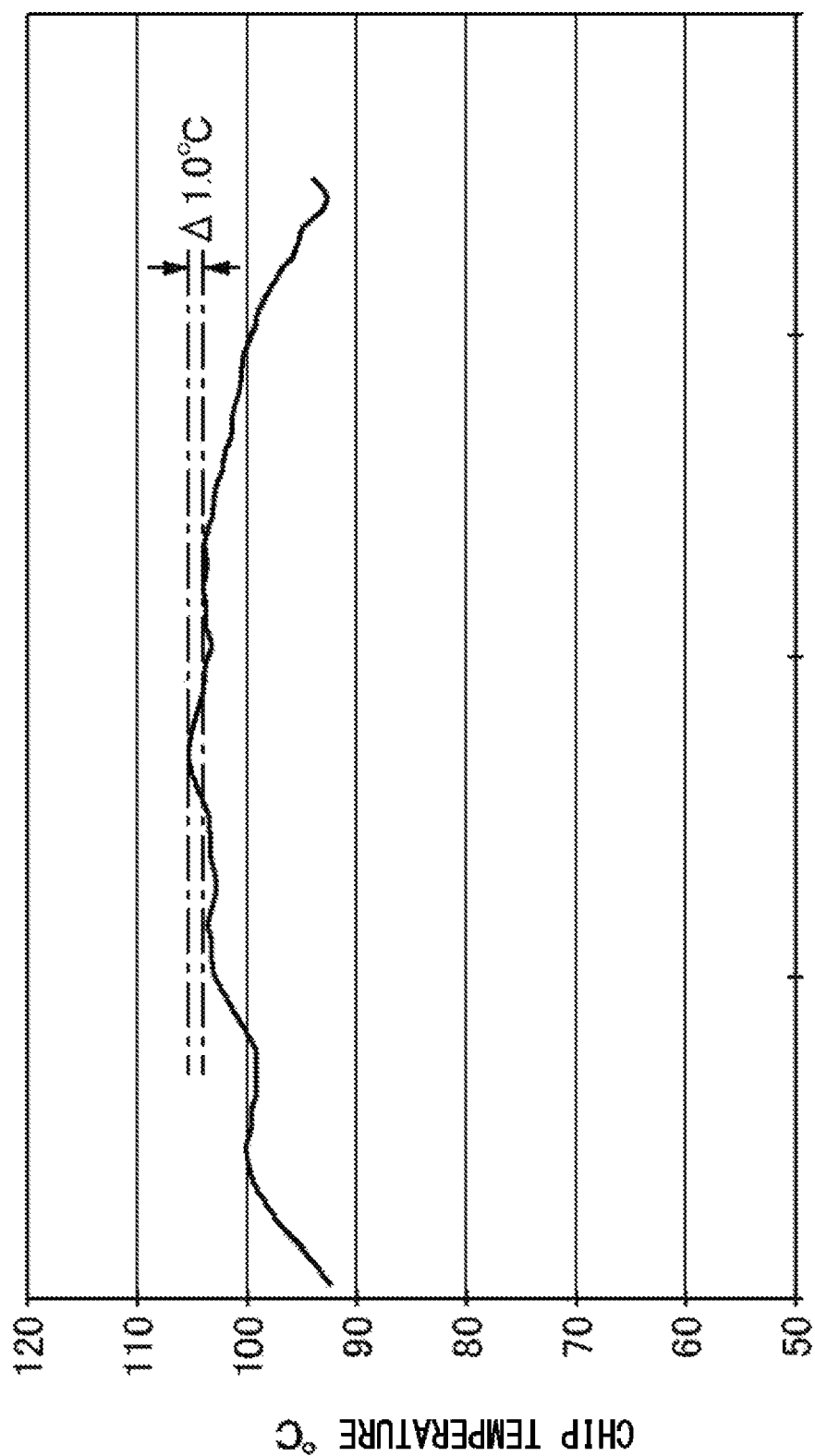
FIG. 12 shows one example of a temperature distribution in a case where current flows through the diode portion 80 in the semiconductor device 100 in which the diode portion 80 has a width of 310 μm.

FIG. 11 shows one example of the temperature distribution in a case where current flows through the diode portion 80 in the semiconductor device 100 in which the diode portion 80 has the width of 540 μm. The width D3 of the transistor portion 70 is 1050 μm. The semiconductor device 100 used in FIG. 11 is similar to the semiconductor device 100 used in FIG. 8. FIG. 12 shows one example of the temperature distribution in a case where current flows through the diode portion 80 in the semiconductor device 100 in which the diode portion 80 has the width of 310 μm. The width D3 of the transistor portion 70 is 710 μm. The semiconductor device 100 used in FIG. 12 is similar to the semiconductor device 100 used in FIG. 9.

The vertical axis respectively in FIG. 11 and FIG. 12 indicates the chip temperature (° C.) of the semiconductor device 100. The horizontal axis indicates the position on the diagonal line of the semiconductor device 100. In FIG. 11 and FIG. 12, the driving conditions of the semiconductor device 100, that is, the conditions of current, voltage and frequency are the same.

In a case of FIG. 11 (D2 is 540 μm), the fluctuation range of the temperature within the semiconductor device 100 is Δ6.0° C., and in a case of FIG. 12 (D2 is 310 μm), the fluctuation range of the temperature within the semiconductor device 100 is Δ1.0° C. Therefore, by setting the width of the diode portion 80 to be 310 μm and the width D3 of the transistor portion 70 to be 710 μm, the fluctuation range (ripple width) of the temperature with the semiconductor device 100 can be significantly reduced compared to a case where the width of the diode portion 80 is 540 μm and the width of the transistor portion 70 is 1050 μm. By setting the width D2 of the diode portion 80 to be smaller than 320 μm, an effect of significantly reducing the fluctuation range of the temperature of the semiconductor device 100 while current flows through the FWD is obtained.

Figure 13:
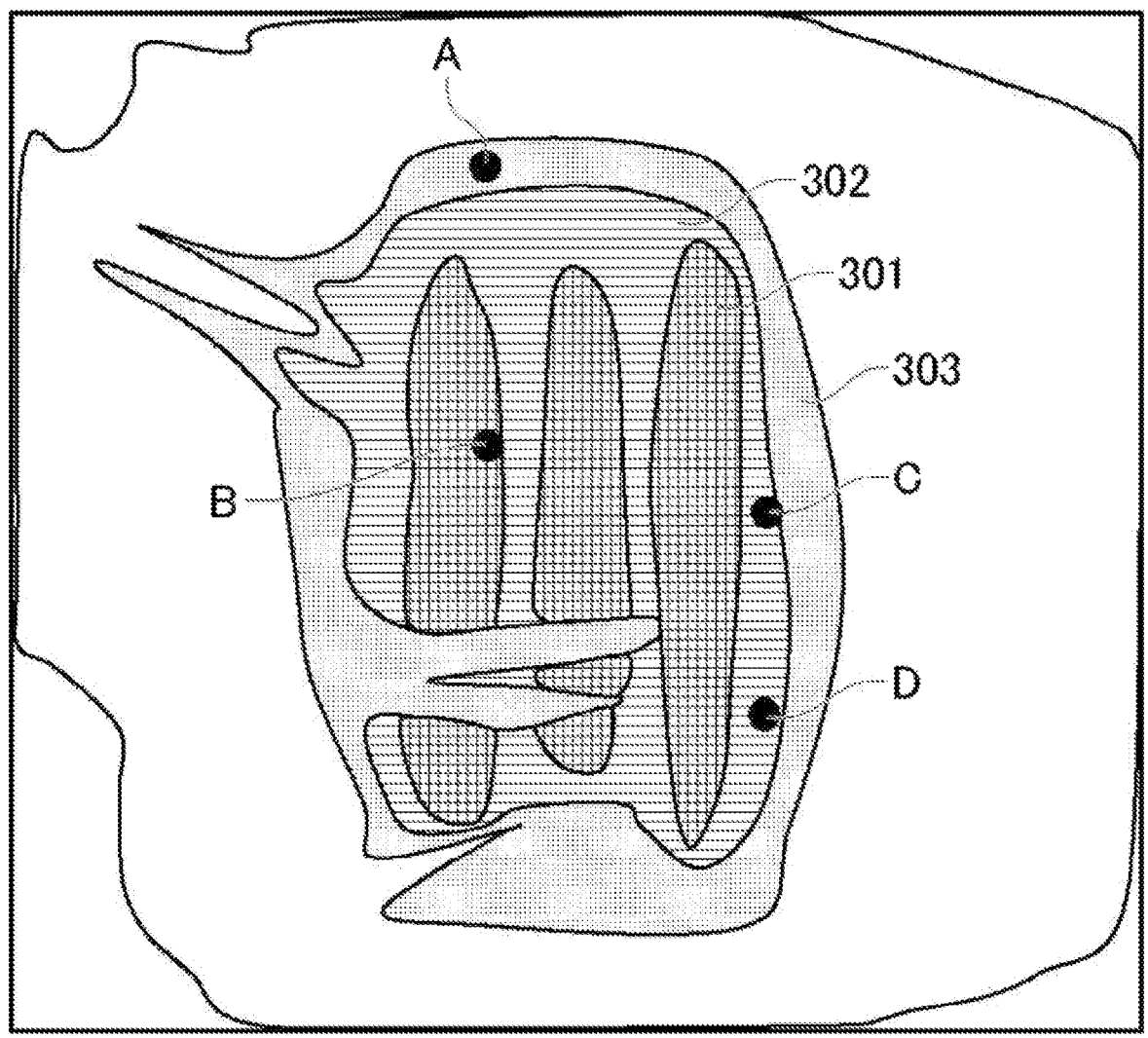
FIG. 13 shows one example of heat diffusion in a case where current flows through the diode portion 80 in the semiconductor device 100 in which the diode portion 80 has a width of 540 μm.
Figure 14:
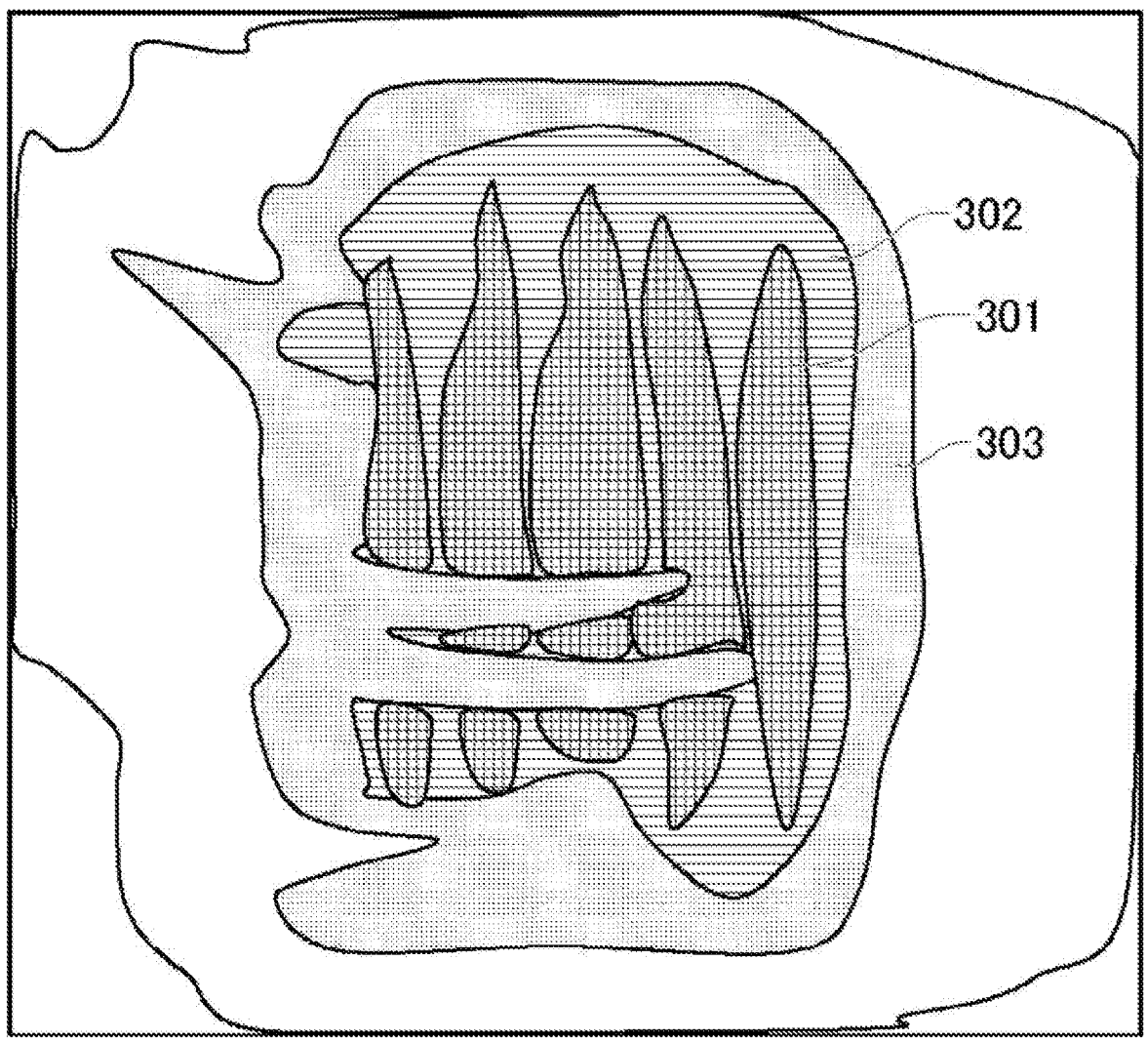
FIG. 14 shows one example of heat diffusion in a case where current flows through the diode portion 80 in the semiconductor device 100 in which the diode portion 80 has a width of 310 μm.
Figure 15:
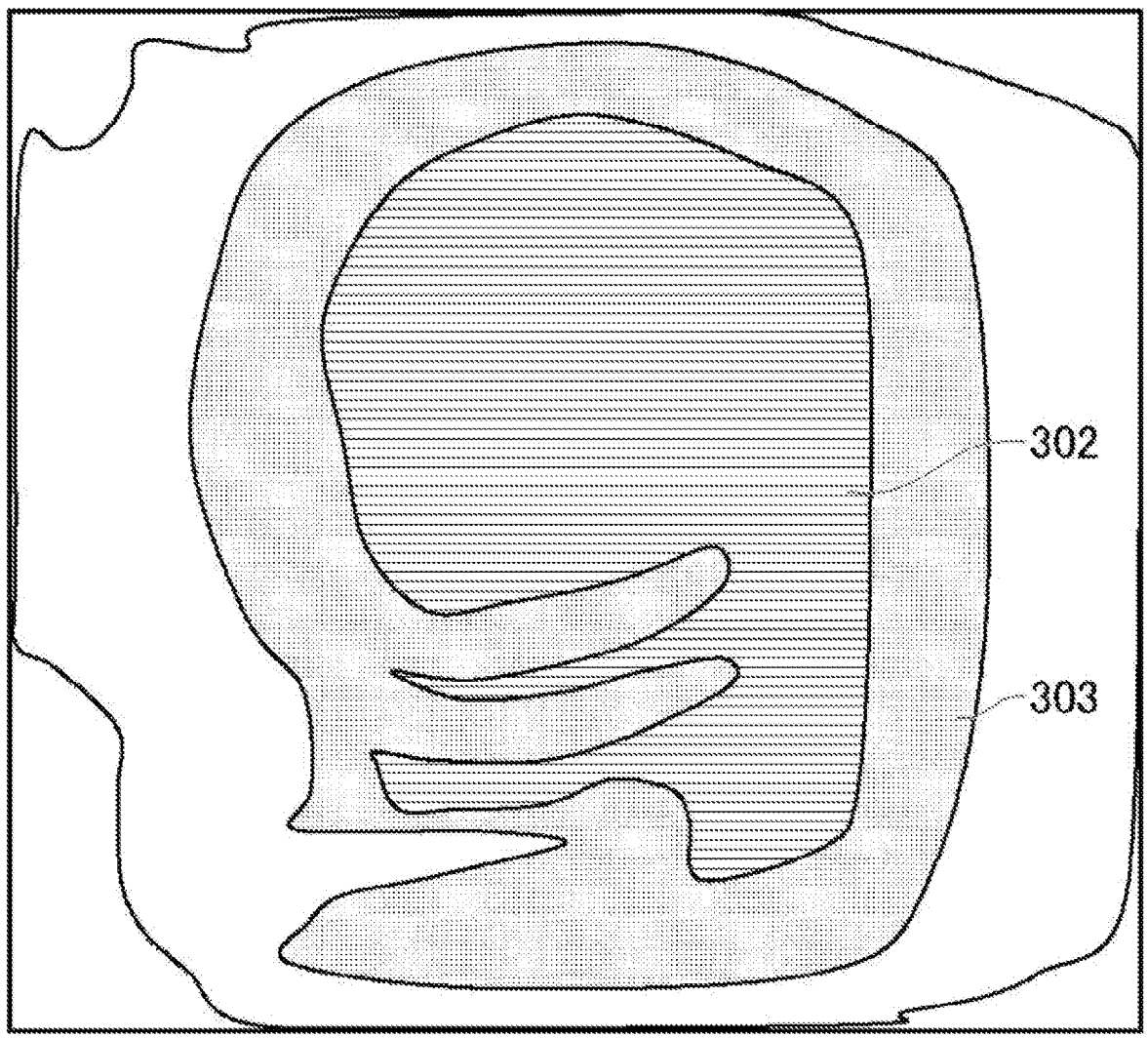
FIG. 15 shows one example of heat diffusion in a case where current flows through the diode portion 80 in the semiconductor device 100 in which the diode portion 80 has a width of 200 μm.

FIG. 13 shows one example of heat diffusion in a case where current flows through the diode portion 80 in the semiconductor device 100 in which the diode portion 80 has the width of 540 μm. FIG. 14 shows one example of heat diffusion in a case where current flows through the diode portion 80 in the semiconductor device 100 in which the diode portion 80 has the width of 310 μm. FIG. 15 shows one example of heat diffusion in a case where current flows through the diode portion 80 in the semiconductor device 100 in which the diode portion 80 has the width of 200 μm. The semiconductor device 100 in FIG. 13, FIG. 14 and FIG. 15 is respectively similar to that used in FIG. 8, FIG. 9 and FIG. 10. FIG. 13, FIG. 14 and FIG. 15 indicate that as a density of the hatching is higher (denser), the temperature is higher. Specifically, a region having the highest temperature is a region 301, and the temperature decreases in the order of a region 302 and a region 303.

A power cycle test condition respectively in FIG. 13, FIG. 14 and FIG. 15 is that the test starts at a temperature Tj of 25° C., ΔTj is 100° C., Z-phase heat generation is performed, and current flows through the diode portion (FWD) for one second to turn on the FWD. The condition respectively in FIG. 13, FIG. 14 and FIG. 15 are the same. A wire contact point temperature was measured at positions A, B, C and D shown in FIG. 13. In FIG. 14 and FIG. 15 as well, the contact point temperature was measured at the same positions as the positions shown in FIG. 13. Also, power cycle resistance was evaluated. The power cycle resistance means a lifetime of the semiconductor device 100 according to heat stress that inner structures of the semiconductor device 100 receive by the increase and decrease of the temperature in the operation condition. An evaluation result is shown in Table 1.

TABLE 1

| POSITION | D2 540 μm D3 1050 μm | D2 310 μm D3 710 μm | D2 200 μm D3 470 μm |
|---|---|---|---|
| A | 121.8° C. | 115.3° C. | 114.0° C. |
| B | 129.0° C. | 124.4° C. | 122.7° C. |
| C | 126.1° C. | 127.9° C. | 125.8° C. |
| D | 124.4° C. | 125.0° C. | 123.0° C. |

As shown in FIG. 13, in a case where the width of the diode portion 80 is 540 µm, within the semiconductor device 100, nonuniformity of the temperature is observed in accordance with a shape of the region of the transistor portion 70 and the shape of the region of the diode portion 80. As shown in FIG. 14, in a case where the width of the diode portion 80 is 310 µm, the nonuniformity of the temperature within the semiconductor device 100 is reduced. Further, as shown in FIG. 15, in a case where the width of the diode portion 80 is 200 µm, the nonuniformity of the temperature within the semiconductor device 100 is further reduced.

Figure 16:
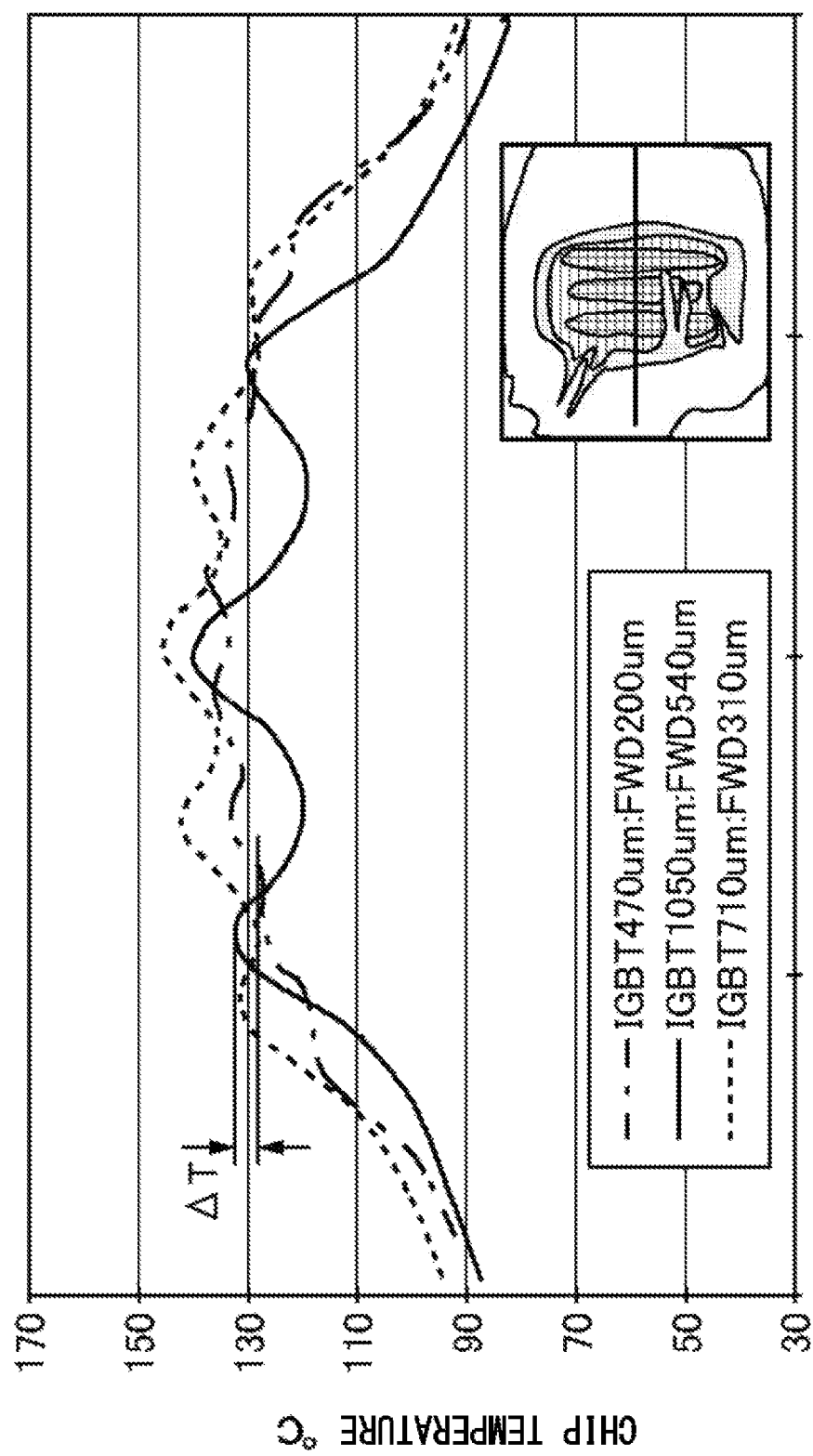
FIG. 16 shows one example of a temperature distribution in a case where current flows through the diode portion 80 in the semiconductor device 100.

FIG. 16 shows one example of the temperature distribution in a case where current flows through the diode portion 80 in the semiconductor device 100. In FIG. 16, the vertical axis indicates the chip temperature (° C.) of the semiconductor device 100. The horizontal axis indicates the positions of the semiconductor device 100 along the first direction. In FIG. 16, the driving conditions of the semiconductor device 100 are similar to a case of the power cycle conditions in FIG. 13, FIG. 14 and FIG. 15. It can be learned from FIG. 16 as well, compared to the case of FIG. 13, the fluctuation range (ripple width) ΔT of the temperature within the semiconductor device 100 is reduced in the case of FIG. 14 and FIG. 15.

Also, as shown in Table 1, as the width D2 of the diode portion 80 and the width D3 of the transistor portion 70 are smaller, the highest value of the wire contact point temperature is decreased respectively to 129.0° C., 127.9° C. and 125.8° C. It is considered that this is because heat is easily sufficiently diffused in the transistor portion 70 as the width D2 of the diode portion 80 and the width D3 of the transistor portion 70 are smaller. Also, by setting the width D2 o the diode portion 80 and the width of the transistor portion 70 to be smaller, the power cycle resistance is improved. It is considered that this is because the wire contact point temperature (change of the contact point temperature) can be lowered by 3.2° C. by setting the width D2 of the diode portion 80 to be small from 540 µm to 200 µm.

As described above, even if the semiconductor device 100 is driven under the same driving condition, by setting the width D2 of the diode portion 80 and the width D3 of the transistor portion 70 small, the fluctuation range of the temperature corresponding to the positions in the plane of the semiconductor device 100 is small. Therefore, even if the position of the junction portion 4 of the external wiring 2 changes in a plane direction of the semiconductor device 100 by the process step, the fluctuation range of the temperature in the junction portion 4 of the external wiring 2 is small. Accordingly, thermal fatigue in the junction portion 4 of the external wiring 2 is reduced, and the long-term reliability of the semiconductor device 100 can be enhanced.

Figure 17:
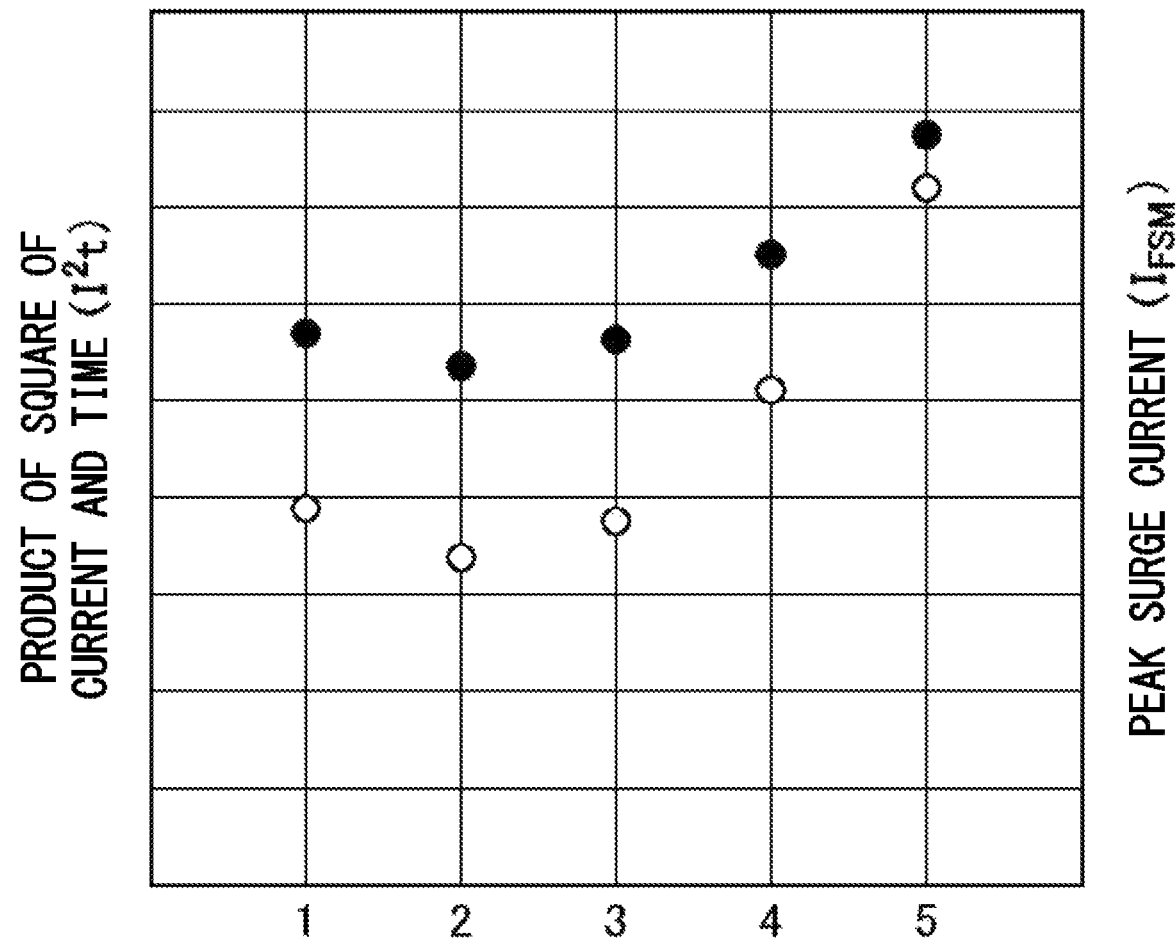
FIG. 17 shows one example of a relation between the width of the diode portion 80 and destructive breakdown withstand capability.

FIG. 17 shows one example of a relation between the width of the diode portion and destructive breakdown withstand capability. The horizontal axis indicates a sample number, and the vertical axis indicates an index of the destructive breakdown withstand capability. Specifically, the white circle indicates a product of square of current and time ($I^2t$), and the black circle indicates peak surge current (IFSM). A larger value of the product of square of current and time ($I^2t$) and of the peak surge current (IFSM) indicates higher destructive breakdown withstand capability of the semiconductor device 100. Therefore, as the product of square of current and time ($I^2t$) and the peak surge current (IFSM) are larger, the long-term reliability of the semiconductor device 100 is higher. Except a condition of the width D3 of the transistor portion 70 and the width D2 of the diode portion 80, other conditions, such as a dosage, for the sample number (1) to the sample number (5) are similar.

TABLE 2

| | WIDTH D3 OF TRANSISTOR PORTION | WIDTH D2 OF DIODE PORTION |
|---|---|---|
| SAMPLE No. 1 | 1060 µm | 540 µm |
| SAMPLE No. 2 | 1060 µm | 540 µm |
| SAMPLE No. 3 | 1060 µm | 540 µm |
| SAMPLE No. 4 | 710 µm | 320 µm |
| SAMPLE No. 5 | 480 µm | 200 µm |

As shown in FIG. 17, there is a correlation between (i) the width D3 of the transistor portion 70 and the width D2 of the diode portion 80 in the semiconductor device 100, and (ii) a breakdown withstand capability of the product of square of current and time and a breakdown withstand capability of the peak surge current. Compared to a case where the width D3 is 1060 µm and the width D2 is 540 µm as the sample numbers (1) to (3), in a case where the width D3 is 710 µm and the width D2 is 320 µm as the sample number (4), the product of square of current and time (the white circles) and the peak surge current (the black circles) are increased.

Further, compared to the case where the width D3 is 710 µm and the width D2 is 320 µm as the sample number (4), in a case where the width D3 is 480 µm and the width D2 is 200 µm as the sample number (5), the product of square of current and time (the white circles) and the peak surge current (the black circles) are increased. Therefore, as the width D3 of the transistor portion 70 and the width D2 of the diode portion 80 are small, the destructive breakdown withstand capability of the semiconductor device 100 can be enhanced.

It is considered that because generated heat is more uniformly dispersed within a chip surface of the semiconductor device 100 as the width D3 of the transistor portion 70 and the width D2 of the diode portion 80 are small, the breakdown withstand capability of the product of square of current and time and the breakdown withstand capability of the peak surge current are enhanced.

The width D3 of the transistor portion 70 and the width D2 of the diode portion 80 are not limited to the case of Table 2. As described above, preferably, the width D2 of the diode portion 80 may be 540 µm or less, and further preferably, the width D2 of the diode portion 80 may be 320 µm or less. The width D3 of the transistor portion 70 may be two times or more and three times or less as large as the width D2 of the diode portion.

As described above, according to the semiconductor device 100 shown in FIG. 1 to FIG. 3, the temperature distribution in the XY plane of the semiconductor device 100 is uniformized. Even during the operation of the diode portion 80 and during the operation of the transistor portion 70, the respectively generated heat can be more uniformly dispersed within the XY plane of the semiconductor device 100.

In the external wiring 2, the contact width D1 with the surface electrode 52 in the X-axis direction is larger than at least one of the width D3 of the transistor portion 70 in the X-axis direction and the width D2 of the diode portion 80 in the X-axis direction. More preferably, the contact width D1 is respectively larger than the width D3 and the width D2. Therefore, even if the position of the junction portion 4 of the external wiring 2 changes caused by the process step, the junction portion 4 of the external wiring 2 overlaps the boundary between the transistor portion 70 and the diode portion 80 when viewed from the front surface side of the semiconductor substrate 10.

As a result, in the junction portion 4 of the external wiring 2, the fluctuation range of the temperature within which the temperature repeatedly increases and decreases can be reduced. Therefore, thermal fatigue in the junction portion 4 of the external wiring 2 can be prevented in advance. Because the thermal fatigue can be prevented, the product of square of current and time ($I^2t$) of the peak surge current (IFSM) are increased. Also, the power cycle resistance of the semiconductor device 100 can be enhanced, and the long-term reliability of the semiconductor device 100 can be enhanced.

Figure 18:
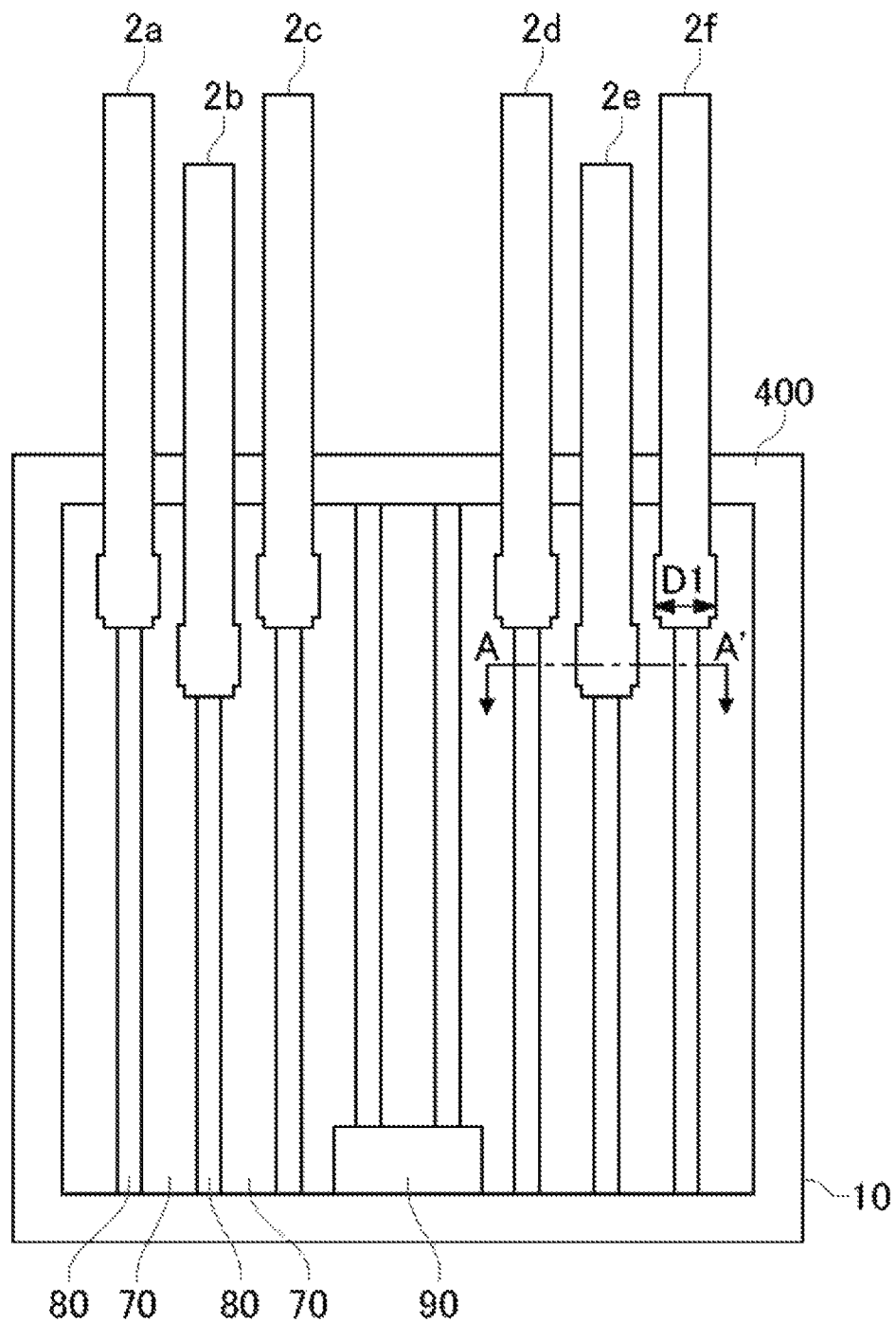
FIG. 18 shows the front surface of the semiconductor device 100 in another example.
Figure 19:
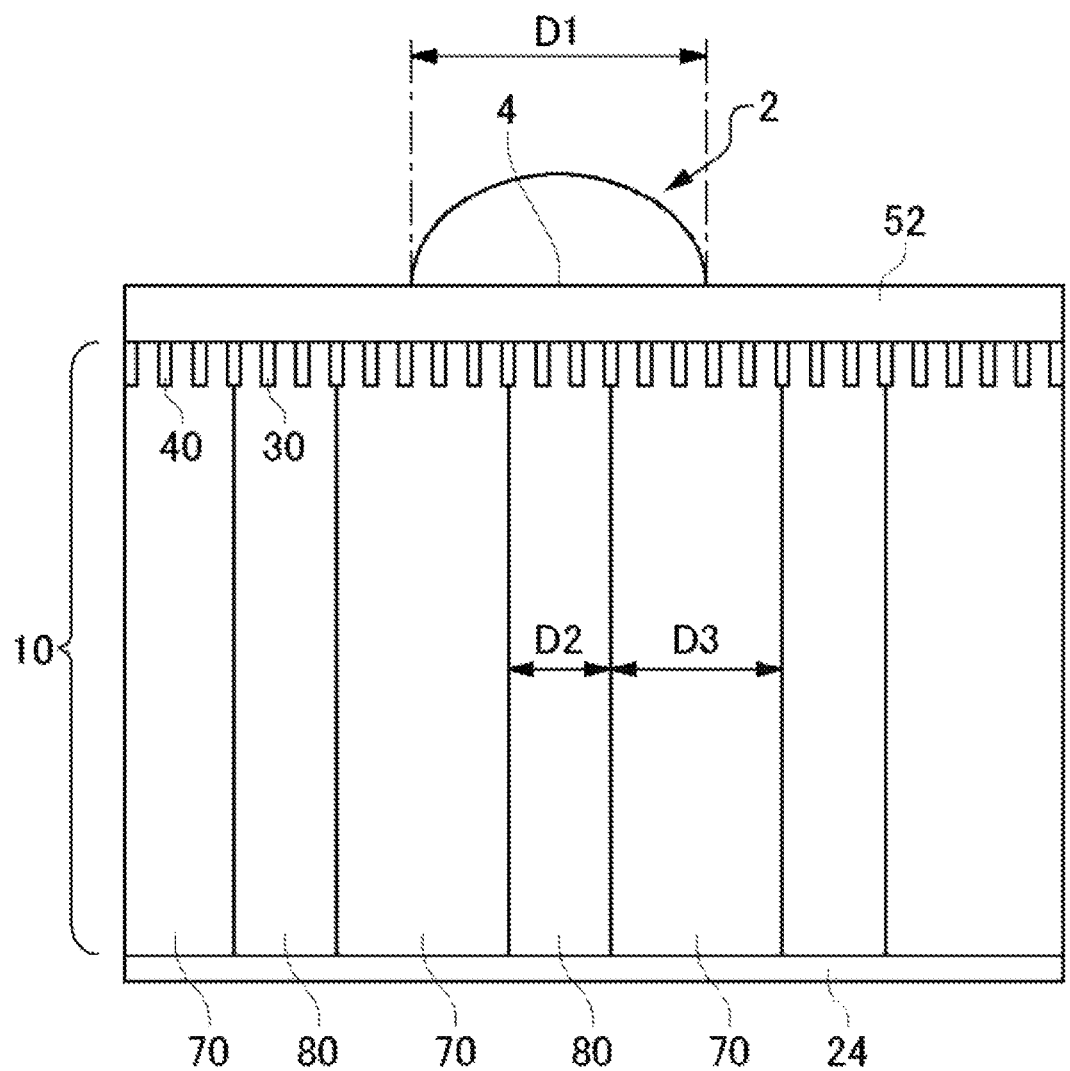
FIG. 19 shows one example of the cross section A-A' in FIG. 18.

FIG. 18 shows the front surface of the semiconductor device 100 in another example. FIG. 19 shows one example of the cross section A-A' in FIG. 18. The semiconductor device 100 shown in FIG. 18 and FIG. 19 includes a similar structure to that of the semiconductor device 100 described in FIG. 1 to FIG. 3, except a direction in which the external wiring 2 extends. Therefore, the repeated descriptions for common parts are omitted.

In the present example, the external wiring 2 extends along the Y-axis direction. Therefore, the external wiring 2 may extend in a direction parallel to a direction in which the transistor portion 70 extends and parallel to a direction in which the diode portion 80 extends. The junction portion 4 of the external wiring 2 extends in a direction orthogonal to the first direction. In the present example as well, in the external wiring 2, the contact width D1 with the surface electrode in the X-axis direction is larger than at least one of the width D3 of the transistor portion 70 in the X-axis direction and the width D2 of the diode portion 80 in the X-axis direction. In the present example, the contact width D1 with the surface electrode in the X-axis direction is respectively larger than the width D3 of the transistor portion 70 and the width D2 of the diode portion 80.

In the junction portion 4 of the external wiring 2, the external wiring 2 is crushed in a wire bonding step and accordingly, the width thereof is widened. The crushed width of the junction portion 4 is the contact width D1 with the surface electrode in the X-axis direction in the external wiring 2. The crushed width of the external wiring 2 is larger than a wire diameter of an external wiring. The crushed width of the external wiring 2 depends on the material of the external wiring 2. The crushed width of the external wiring 2 may be 1.1 times or more as large as the wire diameter of the external wiring. When setting the crushed width of the external wiring 2 to be large, ultrasonic waves that are applied thereto in the wire bonding step become strong, and the semiconductor substrate 10 may be damaged. Also, if the crushed width is set to be large, the thickness of the external wiring 2 may become thin. Therefore, the crushed width of the external wiring 2 may be 1.5 times or less as large as the wire diameter of the external wiring. In the present example as well, a similar effect to that of the semiconductor device 100 shown in FIG. 1 to FIG. 3 is obtained.

Figure 20:
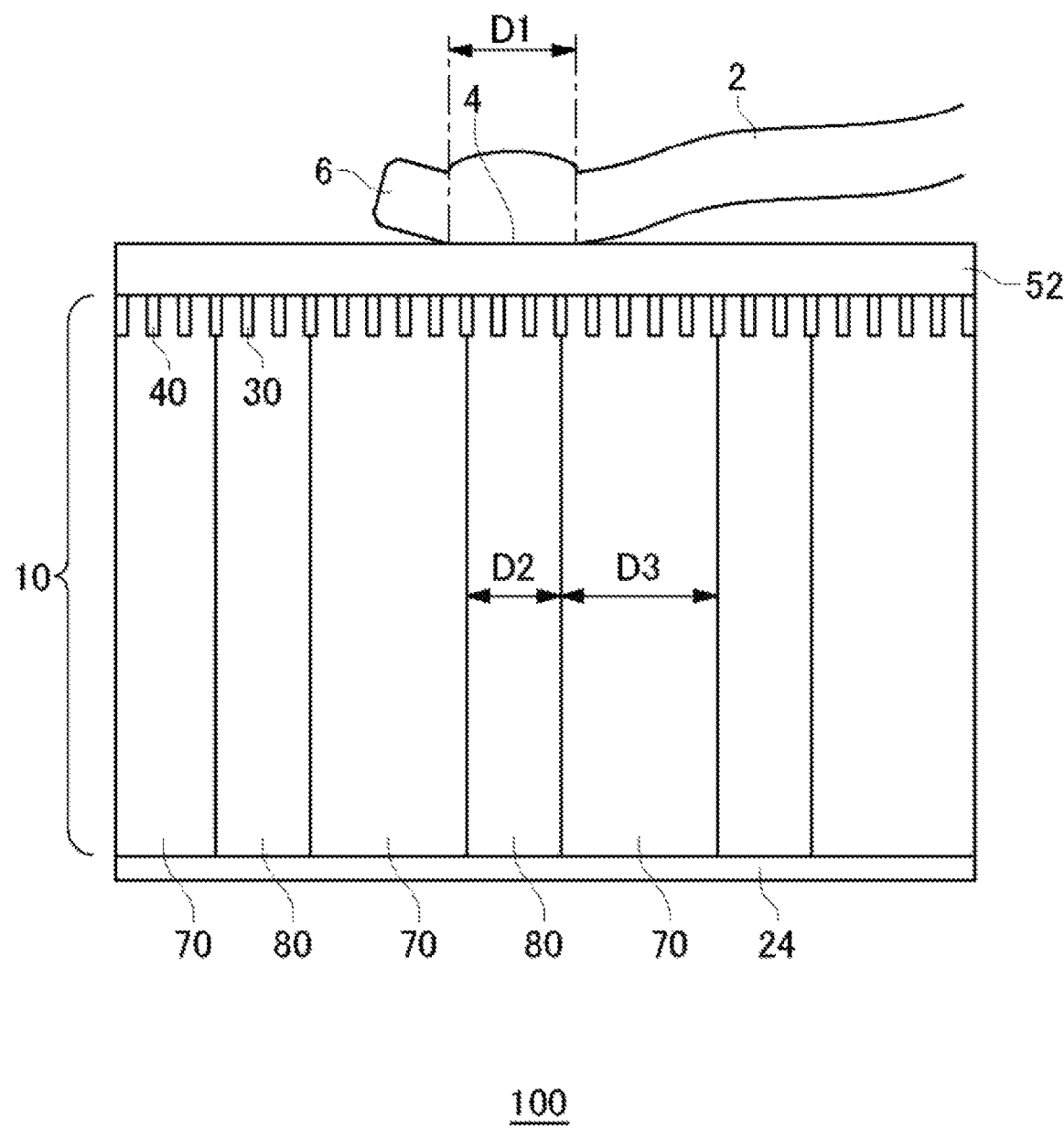
FIG. 20 shows one example of the cross section of the semiconductor device 100 in another example.

FIG. 20 shows one example of the cross section of the semiconductor device 100 in another example. In the present example, in the external wiring 2, the contact width D1 with the surface electrode 52 in the X-axis direction is larger than the width D2 of the diode portion 80 in the X-axis direction, but is smaller than the width D3 of the transistor portion 70 in the X-axis direction. An another structure of the semiconductor device 100 shown in FIG. 20 is similar to that of the semiconductor device 100 shown in FIG. 1 to FIG. 3 or the semiconductor device 100 shown in FIG. 18 and FIG. 19. Therefore, the repeated descriptions for the common structures are omitted.

As the present example, in a case where either the width D2 of the diode portion 80 or the width D3 of the transistor portion 70 is set to be small, compared to the case of the comparative example, the temperature distribution can also be uniformized. Therefore, the power cycle resistance of the semiconductor device 100 can be enhanced and the long-term reliability of the semiconductor device 100 can be enhanced.

Figure 21:
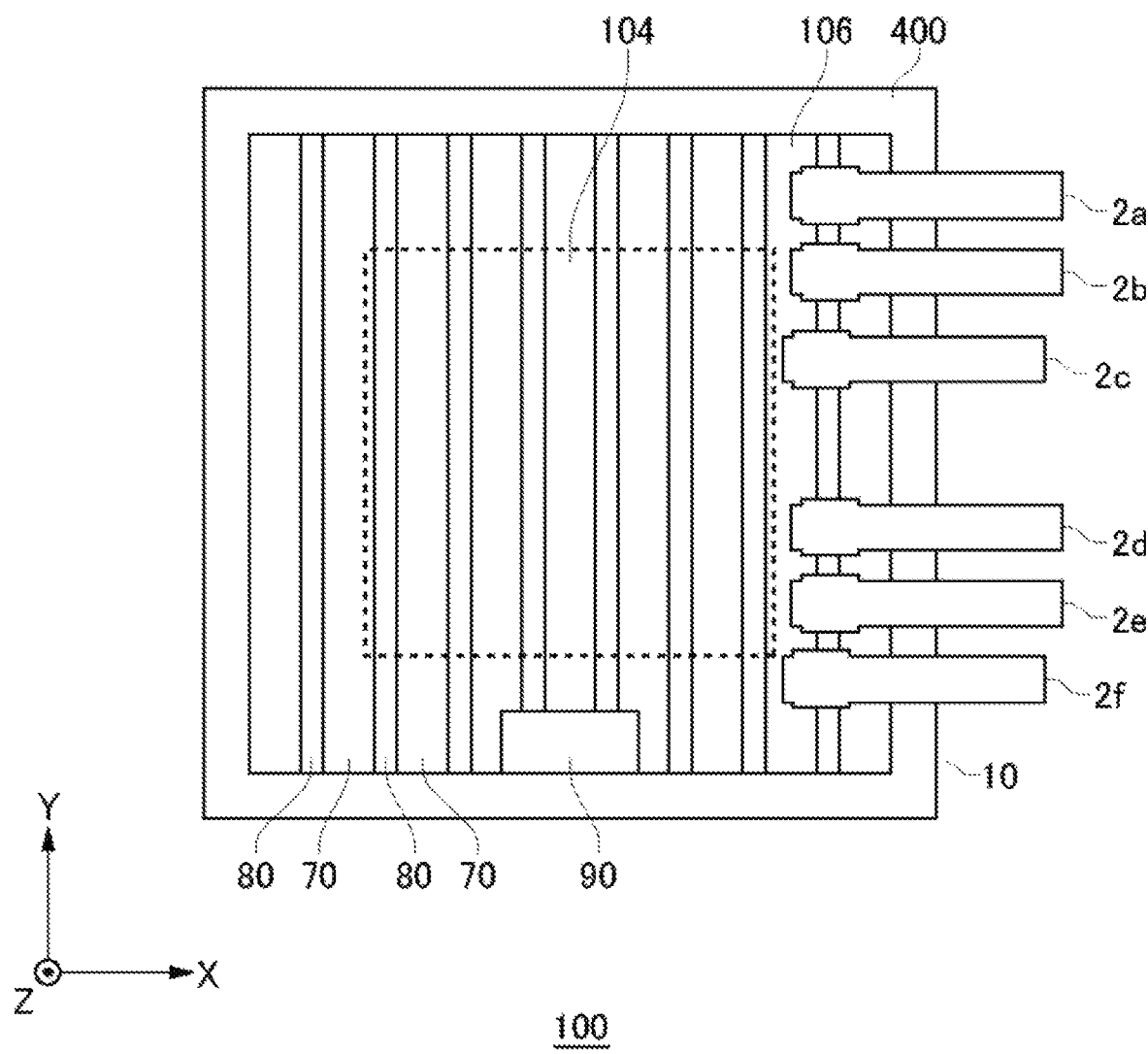
FIG. 21 shows the front surface of the semiconductor device 100 in another example.

FIG. 21 shows the front surface of the semiconductor device 100 in another example. As it is apparent from the temperature distribution shown in FIG. 8 to FIG. 12 as well, the central portion of the semiconductor substrate 10 of the semiconductor device 100 has a higher chip temperature compared to the outer circumferential portion. This is because that heat is easily dissipated in the outer circumferential portion. Therefore, when viewed from the front surface of the semiconductor substrate 10, if the XY plane of the semiconductor device 100 is distinguished into a central portion 104 and an outer circumferential portion 106 surrounding the central portion 104, it is desirable that the external wiring 2 is joined to the outer circumferential portion 106. Accordingly, compared to the case in which the external wiring 2 is in contact with the central portion 104 of the semiconductor substrate 10, because heat stress added to the external wiring 2 is weak, the power cycle resistance of the semiconductor device 100 becomes high. For that reason, the long-term reliability of the semiconductor device 100 can be enhanced.

The central portion 104 and the outer circumferential portion 106 may be appropriately set. In the XY plane of the semiconductor device 100, one line of the transistor portion 70 and one line of the diode portion 80 positioned on edge portions may be also set as the outer circumferential portion 106. In this case, a region in a width of D2+D3 along an end edge of the semiconductor device 100 is the outer circumferential portion 106, and a portion surrounded by this outer circumferential portion 106 is the central portion 104. Also, a region in a width of ¼ of one side in the XY plane of the semiconductor device 100 along the end edge of the semiconductor device 100 may also be the outer circumferential portion 106. A portion surrounded by this outer circumferential portion 106 is the central portion 104.

Figure 22:
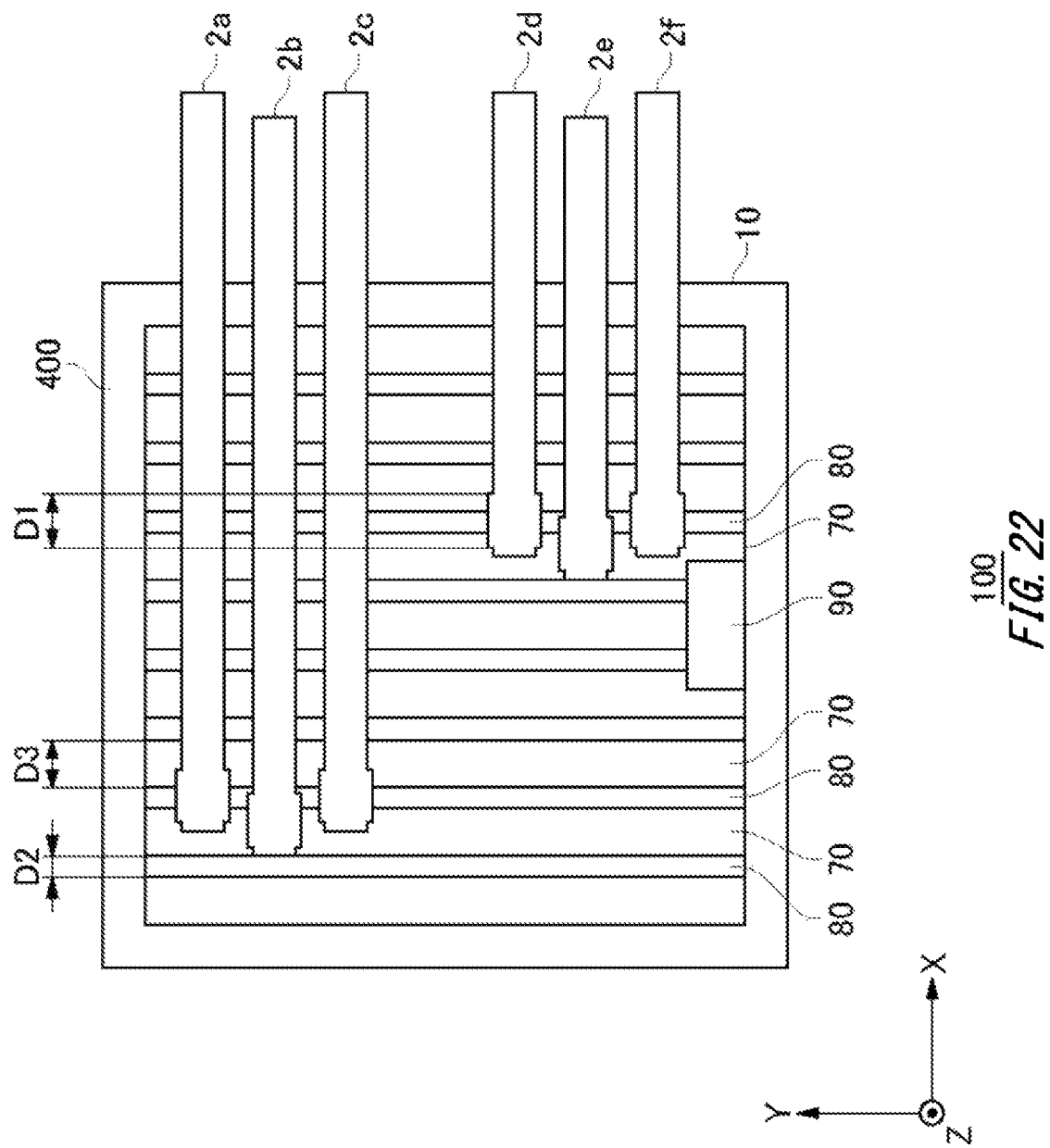
FIG. 22 shows the front surface of the semiconductor device 100 in another example.

FIG. 22 shows the front surface of the semiconductor device 100 in another example. FIG. 22 is a modification example of the semiconductor device 100 shown in FIG. 1. The external wiring 2 of the present example includes at least one first external wiring (2a, 2b, 2c) and at least one second external wiring (2d, 2e, 2f). The first external wiring (2a, 2b, 2c) and the second external wiring (2d, 2e, 2f) are joined to opposite corners of the surface electrode 52 when viewed from the front surface direction of the semiconductor substrate 10. The first external wiring (2a, 2b, 2c) and the second external wiring (2d, 2e, 2f) are joined to the surface electrode 52 at different positions in the respective extending directions (in a case of FIG. 22, the X direction).

In a case where a center of the X axis and the Y axis of the surface electrode 52 is set as the origin (X=0, Y=0), when viewing the surface electrode 52 from the front surface, the surface electrode 52 can be equally divided into four regions that are the first quadrant (X>0, Y>0), the second quadrant (X<0, Y>0), the third quadrant (X<0, Y<0) and the fourth quadrant (X>0, Y<0). That the first external wiring (2a, 2b, 2c) and the second external wiring (2d, 2e, 2f) are joined to opposite corners may include a case where the first external wiring is joined to either the first quadrant or the third quadrant and the second external wiring is joined to the other, or a case where the first external wiring is joined to either the second quadrant or the fourth quadrant and the second external wiring is joined to the other.

Figure 23:
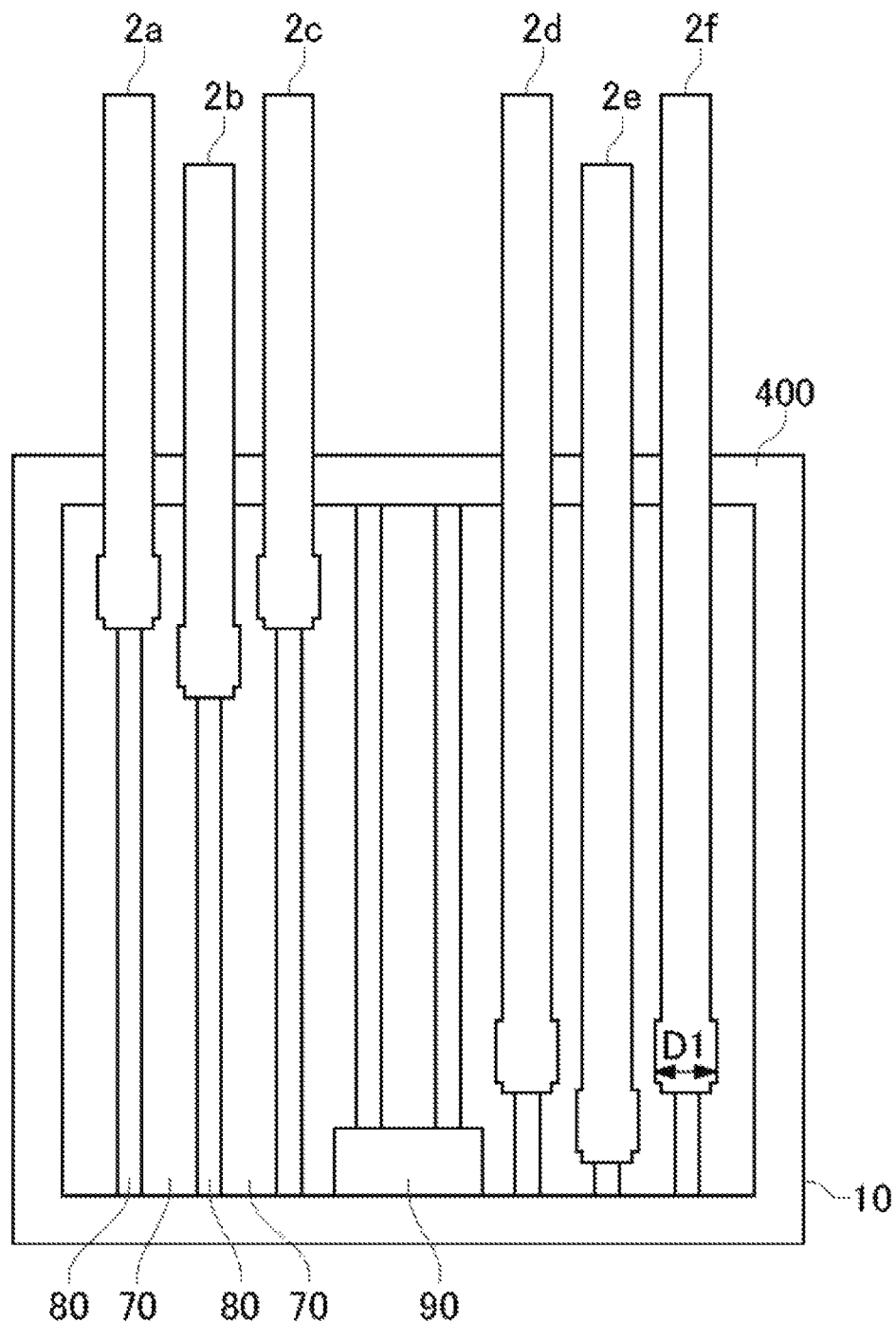
FIG. 23 shows the front surface of the semiconductor device 100 in another example.

FIG. 23 shows the front surface of the semiconductor device 100 in another example. FIG. 23 is a modification example of the semiconductor device 100 shown in FIG. 18. The external wiring 2 of the present example includes at least one first external wiring (2a, 2b, 2c) and at least one second external wiring (2d, 2e, 2f). The first external wiring (2a, 2b, 2c) and the second external wiring (2d, 2e, 2f) are joined to the opposite corners of the surface electrode 52 when viewed from the front surface direction of the semiconductor substrate 10. The first external wiring (2a, 2b, 2c) and the second external wiring (2d, 2e, 2f) are joined to the surface electrode 52 at different positions in the respective extending directions.

In FIG. 22 and FIG. 23, a case where the extending direction of the first external wiring (2a, 2b, 2c) and the extending direction of the second external wiring (2d, 2e, 2f) are the same is shown. However, the junction portions 4 of the plurality of external wirings 2 may be provided so as to be positioned at the opposite corners of the semiconductor device 100, and the extending direction of the first external wiring (2a, 2b, 2c) and the extending direction of the second external wiring (2d, 2e, 2f) may also be different from each other.

Heat generated during the operation of the semiconductor device 100 is transmitted to the junction portion 4 (the contact region in which the external wiring 2 is in contact with the surface electrode 52) from the surface electrode 52. Therefore, if the plurality of external wirings 2 is positioned on one side of the surface electrode 52 as the case shown in FIG. 1 and FIG. 18, for example, heat is easily concentrated on the side with which the plurality of external wirings 2 are in contact. As FIG. 22 and FIG. 23, by arranging the first external wiring (2a, 2b, 2c) and the second external wiring (2d, 2e, 2f) on the opposite corners within the surface electrode 52 of the semiconductor device 100, heat within the semiconductor device 100 can be further dispersed. As the number of the external wirings 2 is larger, heat within the semiconductor device 100 is easily dispersed.

Figure 24:
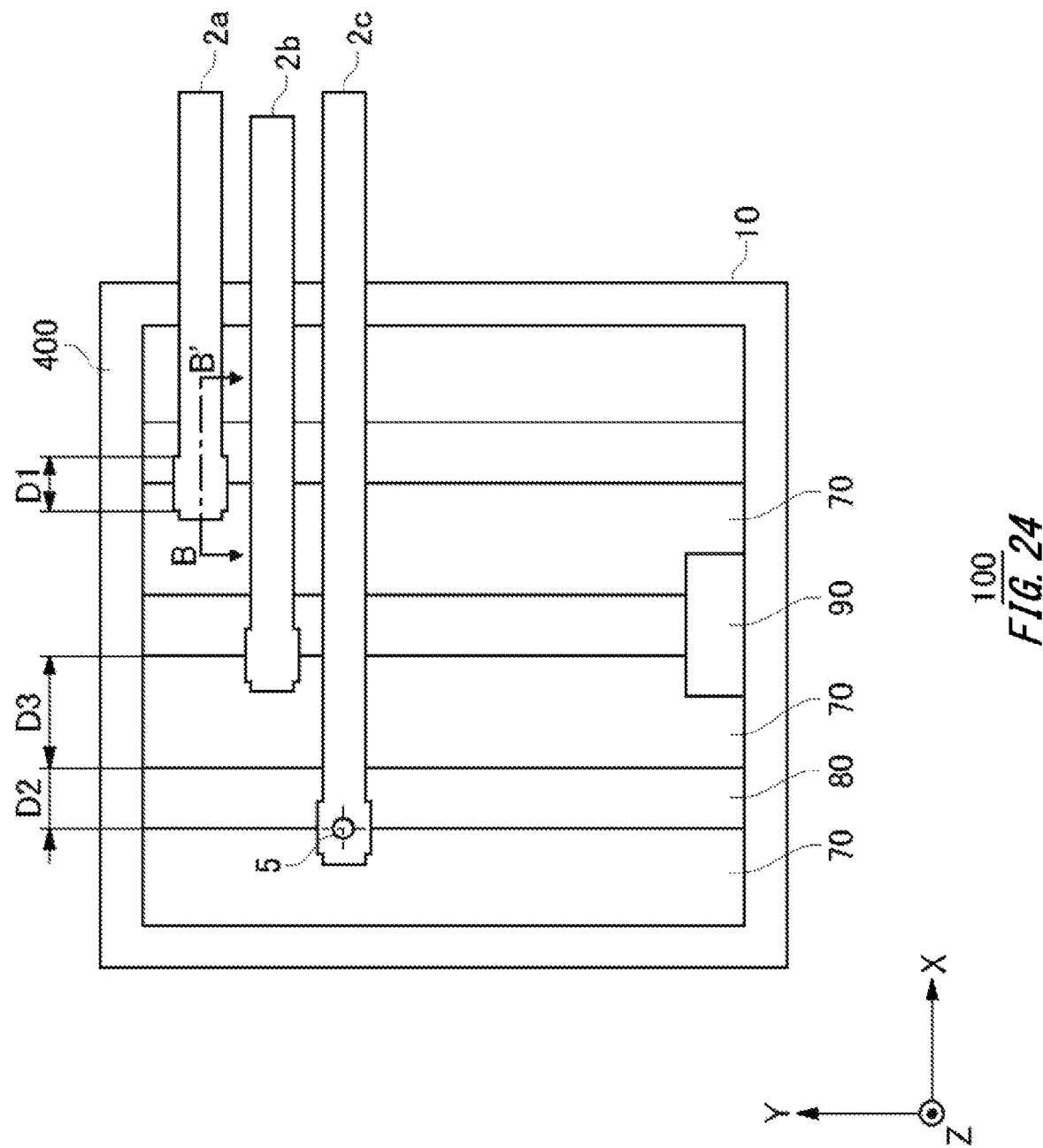
FIG. 24 shows the front surface of the semiconductor device 100 in another example.

FIG. 24 shows the front surface of the semiconductor device 100 in another example. As shown in FIG. 24, the external wirings 2a, 2b and 2c are respectively joined to three positions. In FIG. 24, the junction portions of the external wirings 2a, 2b and 2c are each disposed across the boundary between the transistor portion 70 and the diode portion 80. In the present example as well, the transistor portion 70 and the diode portion 80 are alternately arranged along the X-axis direction. The external wirings 2a, 2b and 2c may be each joined above a different boundary between the transistor portion 70 and the diode portion 80.

Figure 25:
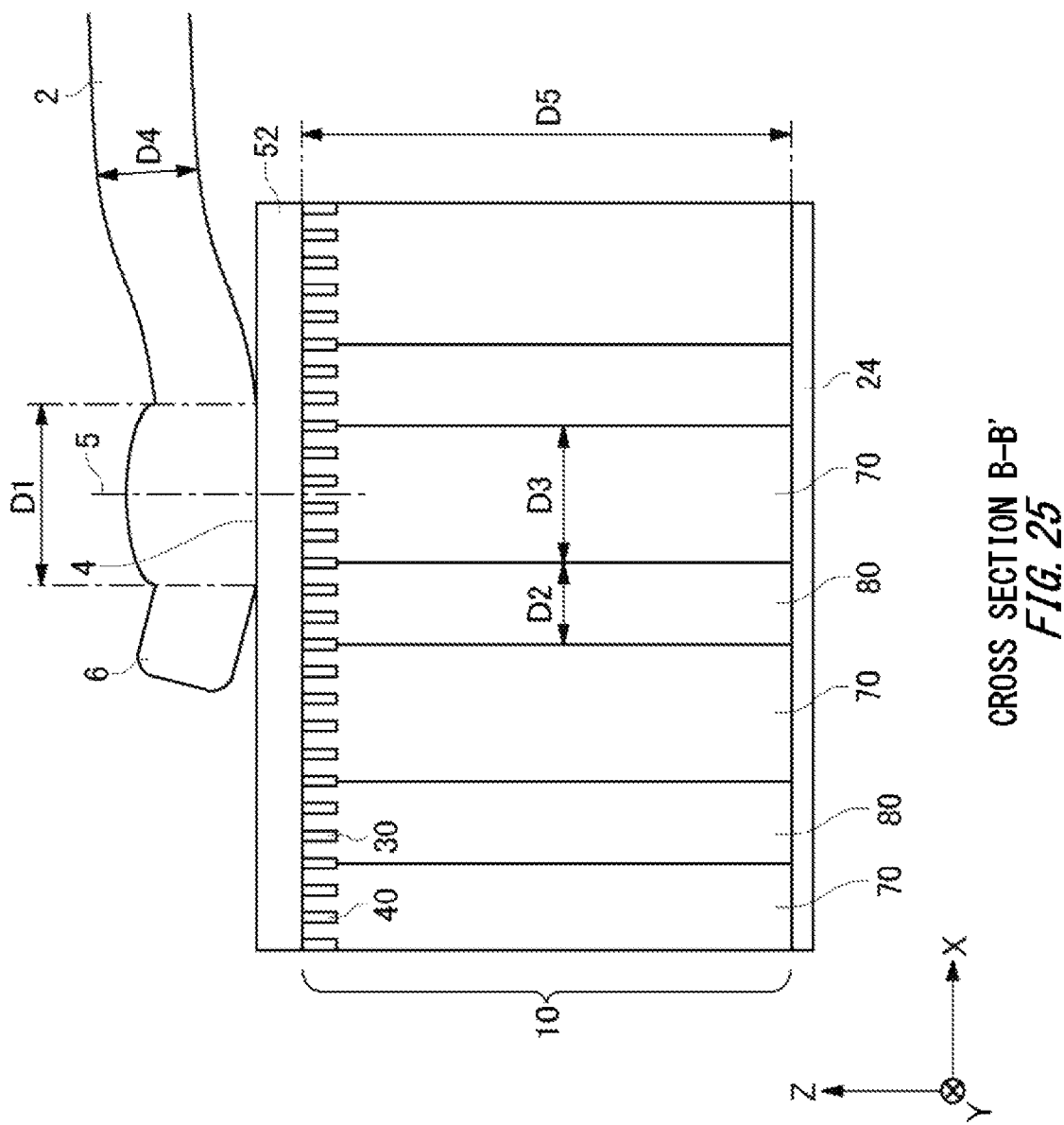
FIG. 25 shows one example of the cross section B-B' in FIG. 24 when a wire bonding position is on the transistor portion 70.

FIG. 25 shows one example of the cross section B-B' of FIG. 24 when the wire bonding position is on the transistor portion 70. In FIG. 25, a center 5 in the first direction of the junction portion 4 in which the external wiring 2 is in contact with the surface electrode 52 (in the present example, the X direction) is positioned above a center in the first direction of the region of the transistor portion 70.

Figure 26:
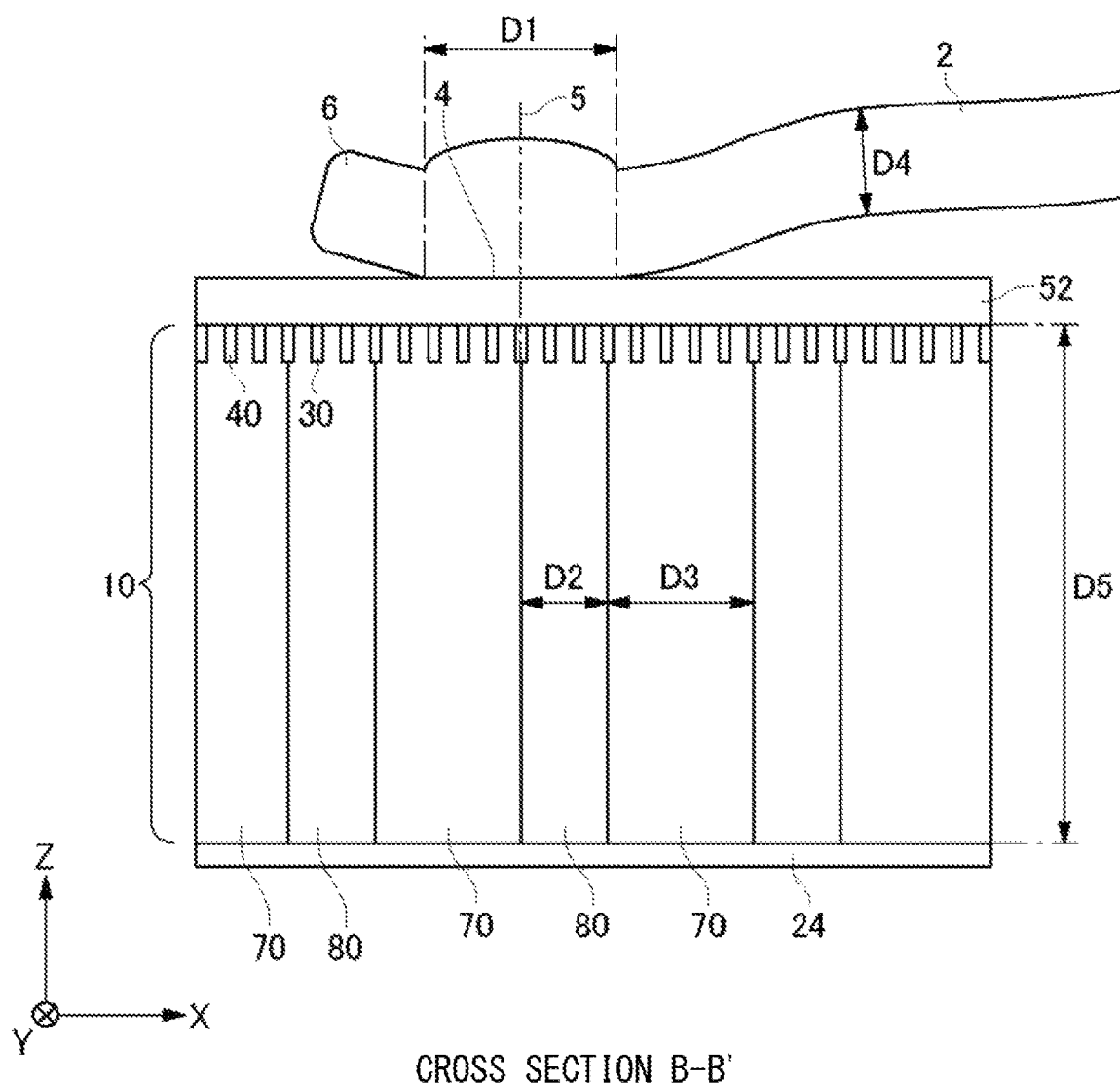
FIG. 26 shows one example of the cross section B-B' in FIG. 24 when the wire bonding position is on the boundary between the transistor portion and the diode portion.

FIG. 26 shows one example of the cross section B-B' of FIG. 24 when the wire bonding position is on the boundary between the transistor portion and the diode portion. In FIG. 26, the center 5 in the first direction of the junction portion 4 in which the external wiring 2 is in contact with the surface electrode 52 (in the present example, the X direction) is arranged above the boundary between the transistor portion 70 and the diode portion 80. When the center 5 is arranged above the boundary between the transistor portion 70 and the diode portion 80, not only a case where the center 5 is completely matched with the position of the boundary but also a case where when viewed from the front surface side of the semiconductor substrate 10 a distance in the first direction between the center 5, and the boundary is within 10% of the contact width D1 and the center 5 in the first direction of the junction portion 4 is positioned between a center of the transistor portion 70 in the first direction and a center if the diode portion 80 in the first direction that are adjacent to each other may be included. Also, a case where a position deviation in the first direction between the center 5 and the boundary is within ±5% of the contact width D1 may be included, where the position of the boundary is taken as a reference. Because there is a positional error in the wire bonding step, it may be difficult to cause the center 5 to be completely matched with the position of the boundary.

Figure 27:
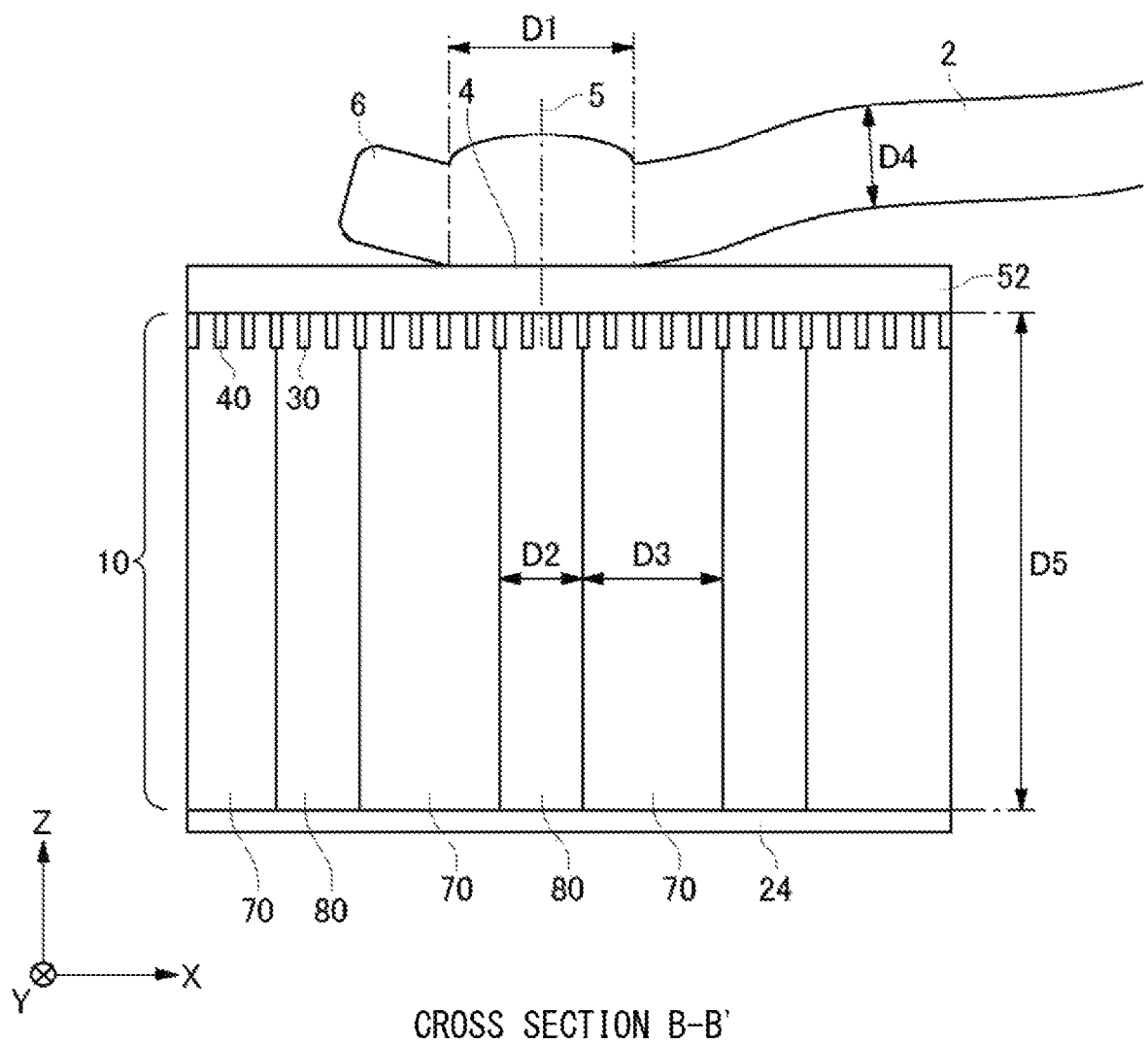
FIG. 27 shows one example of the cross section B-B' in FIG. 24 when the wire bonding position is on the diode portion.

FIG. 27 shows one example of the cross section B-B' of FIG. 24 when the wire bonding position is on the diode portion 80. In FIG. 27, the center 5 in the first direction of the junction portion 4 in which the external wiring 2 is in contact with the surface electrode 52 (in the present example, the X direction) is positioned above the center in the first direction of the region of the diode portion 80.

Figure 28:
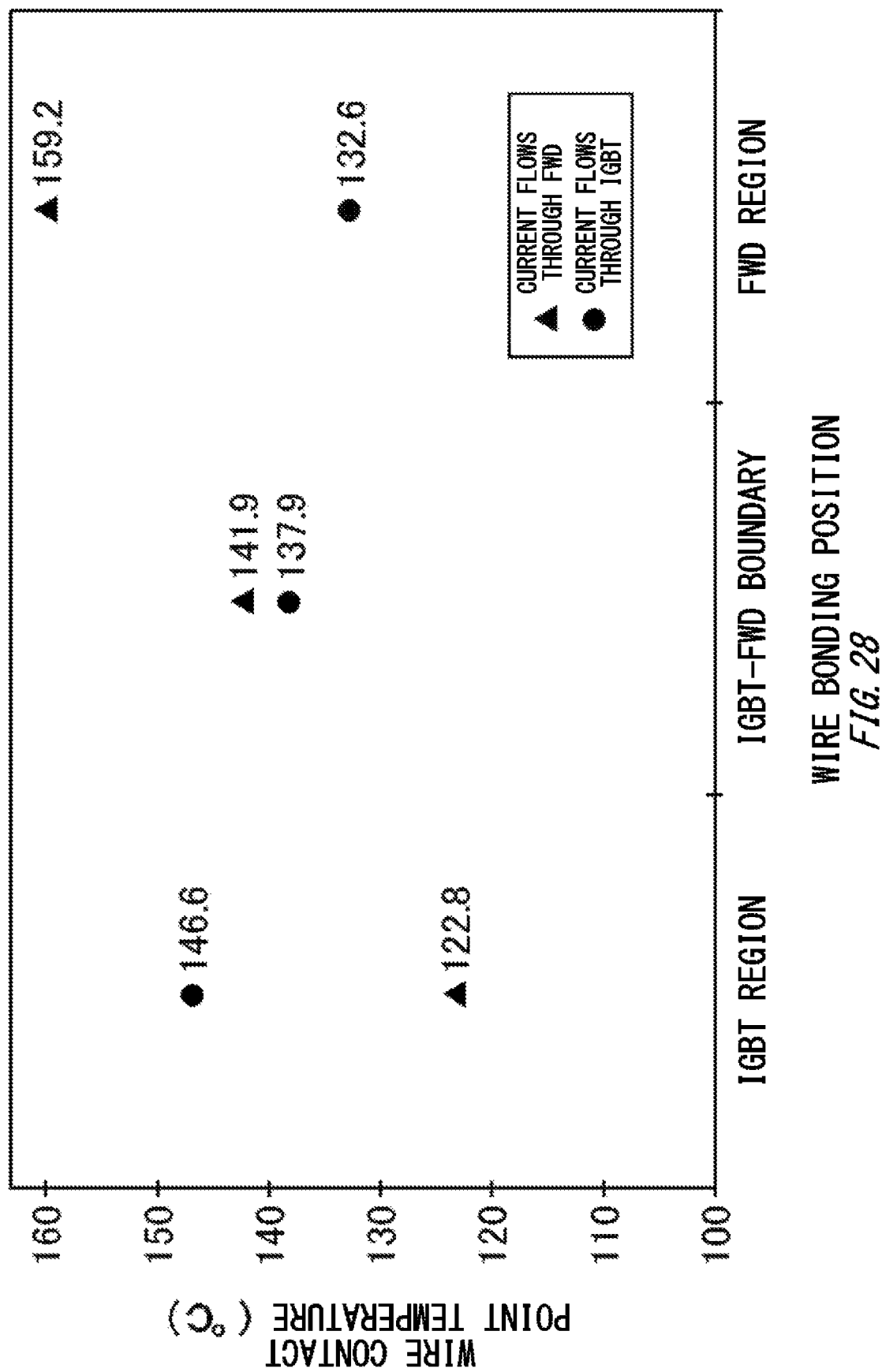
FIG. 28 shows a relation between the wire bonding position and a wire contact point temperature.

FIG. 28 shows a relation between the wire bonding position and the wire contact point temperature. The vertical axis indicates the wire contact point temperature (° C.). The wire contact point temperature (° C.) indicates the temperature of the surface electrode 52 that is immediately below and in contact with the external wiring 2b in the center at which the contact point temperature is the highest among the external wirings 2a, 2b and 2c shown in FIG. 24. The horizontal axis indicates the wire bonding position. On the horizontal axis, an IGBT region corresponds to the case shown in FIG. 25, a boundary between the IGBT and the FWD corresponds to the case shown in FIG. 26 and a FWD region corresponds to the case shown in FIG. 27.

Data shown in FIG. 28 is data in a case where the semiconductor device 100 with a size of 7 mm×7 mm when viewed from the front surface is used. The width D2 of the FWD region that is the diode portion 80 is 550 and the width D3 of the IGBT region that is the transistor portion 70 is 1050 μm. The thickness of the surface electrode 52 is 5 μm. The diameter of the external wiring 2 is 500 μm. The contact width D1 along the first direction of the junction portion 4 in which the external wiring 2 is in contact with the semiconductor device 100 is 1100 μm. The crushed width of the junction portion 4 is 650 μm. The surface electrode 52 is an Al—Si electrode in which silicon (Si) atoms at a solid solubility limit or more are added to aluminum (Al). The collector electrode 24 is an electrode in which titanium (Ti), nickel (Ni), gold (Au) are stacked in this order on Al—Si in which silicon (Si) atoms at the solid solubility limit or more are added to aluminum (Al).

As shown in FIG. 28, it can be learned that when the center 5 in the first direction of the contact width D1 of the external wiring 2 is arranged above the boundary between the transistor portion 70 and the diode portion 80 (denoted as the boundary between the IGBT and the FWD), a temperature difference due to generated heat between the case where current flows through the transistor portion 70 (IGBT) and the case where current flows through the diode portion 80 (FWD) is the smallest. Specifically, the temperature difference is 141.9° C.-137.9° C.=4° C. On the other hand, when the center 5 in the first direction of the contact width D1 of the external wirings 2 is arranged above the center of the transistor portion 70 (denoted as the IGBT region), the temperature difference is 146.6° C.-122.8° C.=23.8° C. Also, when the center 5 in the first direction of the contact width D1 of the external wirings 2 is arranged above the center of the diode portion 80 (denoted as the FWD region), the temperature difference is 159.2° C.-132.6° C.=26.6° C. By making the temperature difference due to the generated heat between the case where current flows through the IGBT and the case where current flows through the FWD small, thermal fatigue in the junction portion 4 in which the external wirings 2 of the semiconductor device 100 is in contact with the surface electrode 52 is reduced. Accordingly, even if the D3 and the D2 are larger, specifically, even if the width D3 of the transistor portion 70 is 1050 µm and the width D2 of the diode portion 80 is 550 µm, the long-term reliability of the semiconductor device 100 can be enhanced.

Note that in the other embodiments described above as well, as FIG. 26, the semiconductor device 100 may be configured such that the center 5 in the first direction of the junction portion 4 in which the external wirings 2 is in contact with the surface electrode 52 is arranged above the boundary between the transistor portion 70 and the diode portion 80.

Figure 29:
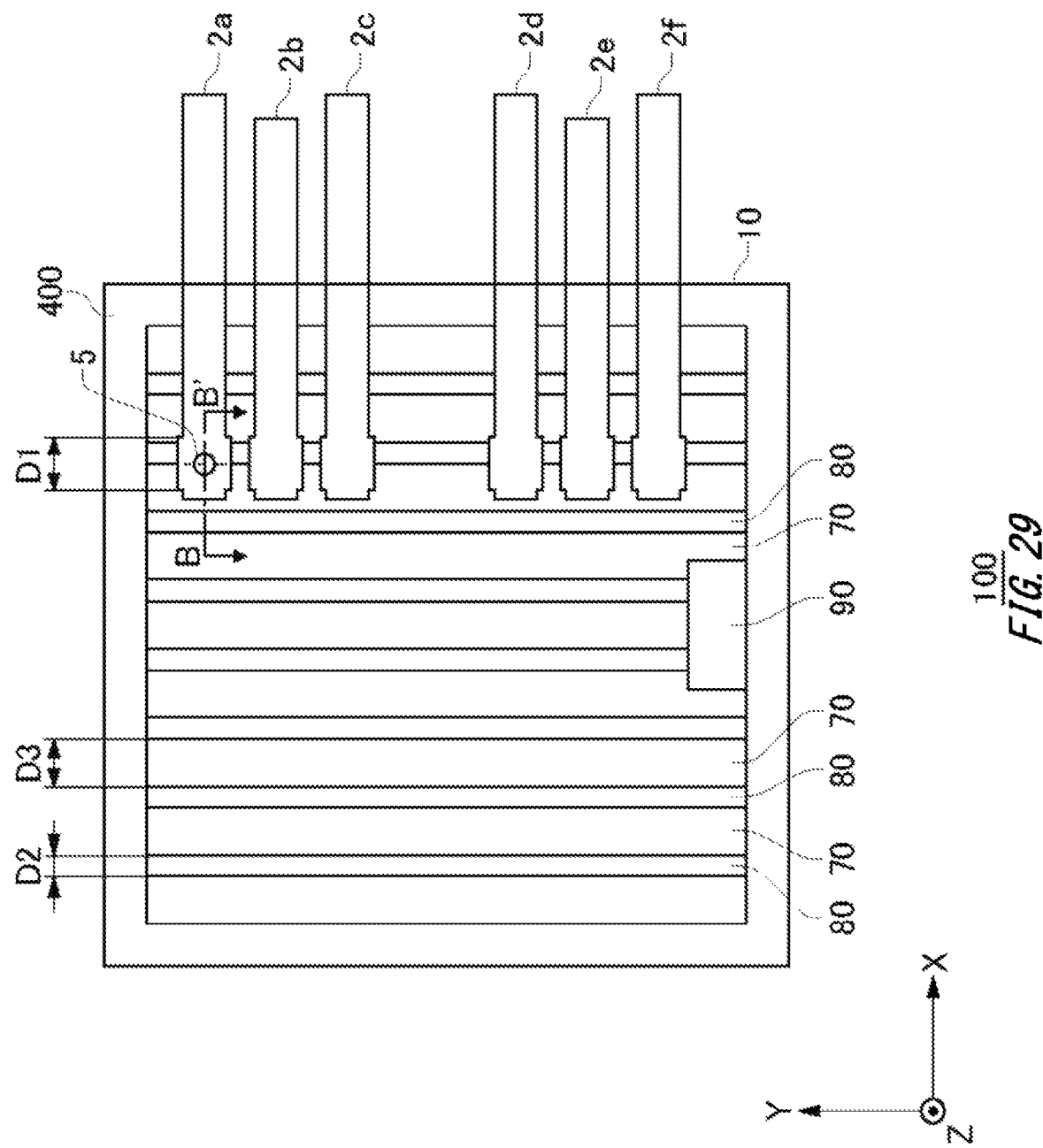
FIG. 29 shows the front surface of the semiconductor device 100 in another example.

FIG. 29 shows the front surface of the semiconductor device 100 in another example. FIG. 29 is a modification example of the semiconductor device 100 of FIG. 1. The semiconductor device 100 shown in FIG. 29 has the same structure as that of the semiconductor device 100 shown in FIG. 1, except the junction position of the junction portion 4. Therefore, the repeated description is omitted. In the present example as well, similar to the case shown in FIG. 26, the center 5 in the first direction of the junction portion 4 in which the external wirings 2 is in contact with the surface electrode 52 (in the present example, the X direction) is arranged above the boundary between the transistor portion 70 and the diode portion 80. The case where the center 5 is arranged above the boundary between the transistor portion 70 and the diode portion 80 may include not only a case where the center 5 is completely matched with the position of the boundary but also a case where when viewed from the front surface side of the semiconductor substrate 10, a distance in the first direction between the center 5 and the position of the boundary is within 10% of the contact width D1 and the center 5 in the first direction of the junction portion 4 is positioned between the center of the transistor portion 70 in the first direction and the center of the diode portion 80 in the first direction that are adjacent to each other. Also, a case where a position deviation in the first direction between the center 5 and the position of the boundary is within ±5% of the contact width D1 may be included, where the position of the boundary is taken as the reference.

Figure 30:
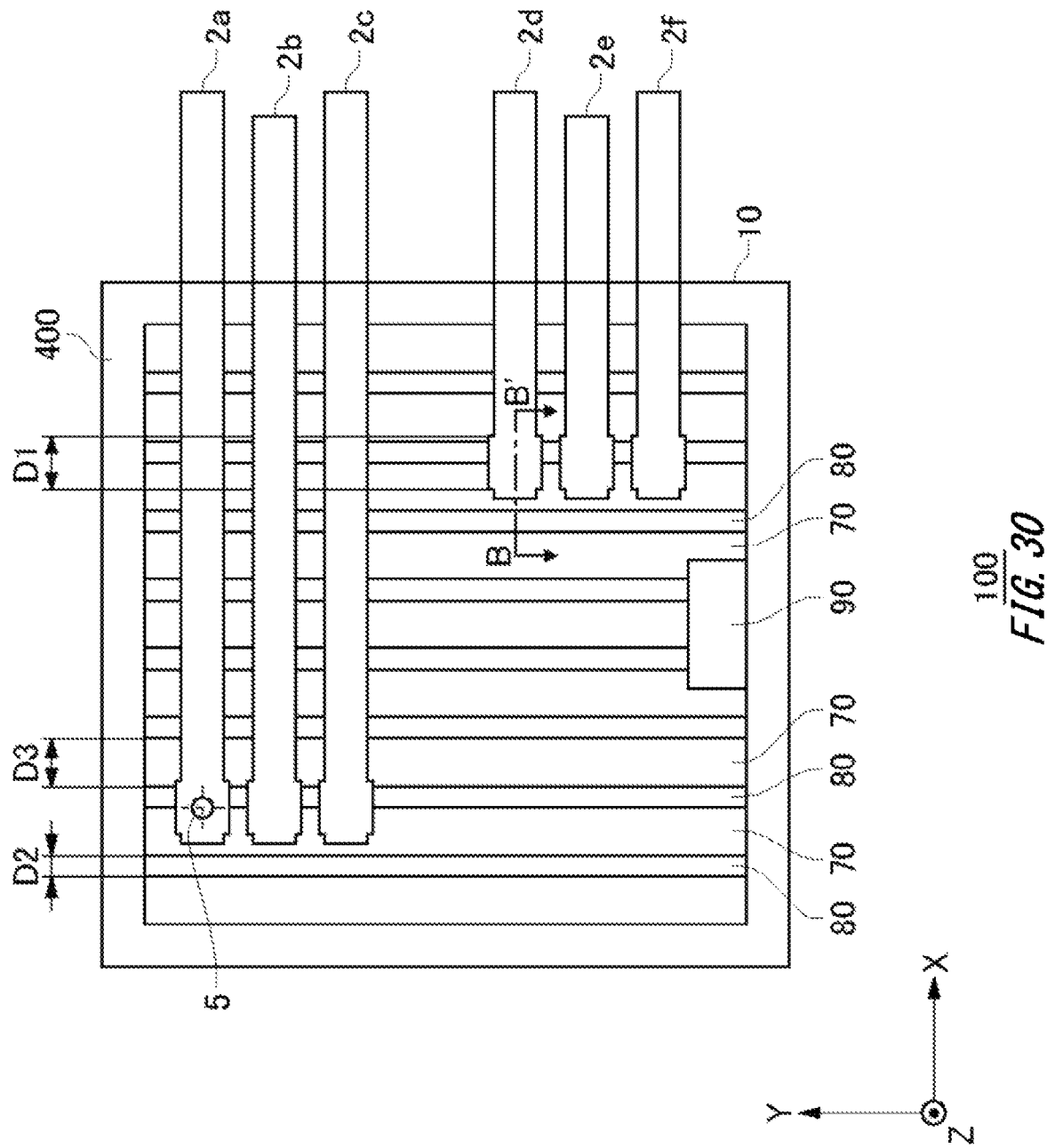
FIG. 30 shows the front surface of the semiconductor device 100 in another example.

FIG. 30 shows the front surface of the semiconductor device 100 in another example. FIG. 30 is a modification example of the semiconductor device 100 of FIG. 22. The semiconductor device 100 shown in FIG. 30 has the same structure as that of the semiconductor device 100 shown in FIG. 22, except the junction position of the junction portion 4. Therefore, the repeated description is omitted. In the present example as well, the center 5 in the first direction of the junction portion 4 in which the external wirings 2 is in contact with the surface electrode 52 (in the present example, the X direction) is arranged above the boundary between the transistor portion 70 and the diode portion 80.

According to the configuration shown in FIG. 29 and FIG. 30, the center 5 of the contact width D1 of the external wirings 2 is arranged on the boundary between the region of the transistor portion 70 and the region of the diode portion 80 of the semiconductor device 100. Accordingly the temperature difference of the surface electrode 52 that is immediately below the junction portion 4 of the external wirings 2 between the case where current flows through the transistor portion 70 and the case where current flows through the diode portion 80 can be made small. Also, according to the configuration shown in FIG. 30, by arranging the first external wiring (2a, 2b, 2c) and the second external wiring (2d, 2e, 2f) on the opposite corners within the semiconductor device 100, heat within the semiconductor device 100 can be further dispersed. Accordingly, thermal fatigue in the junction portion 4 in which the external wirings 2 of the semiconductor device 100 is in contact with the surface electrode 52 is reduced, and the long-term reliability can be further enhanced.

Figure 31:
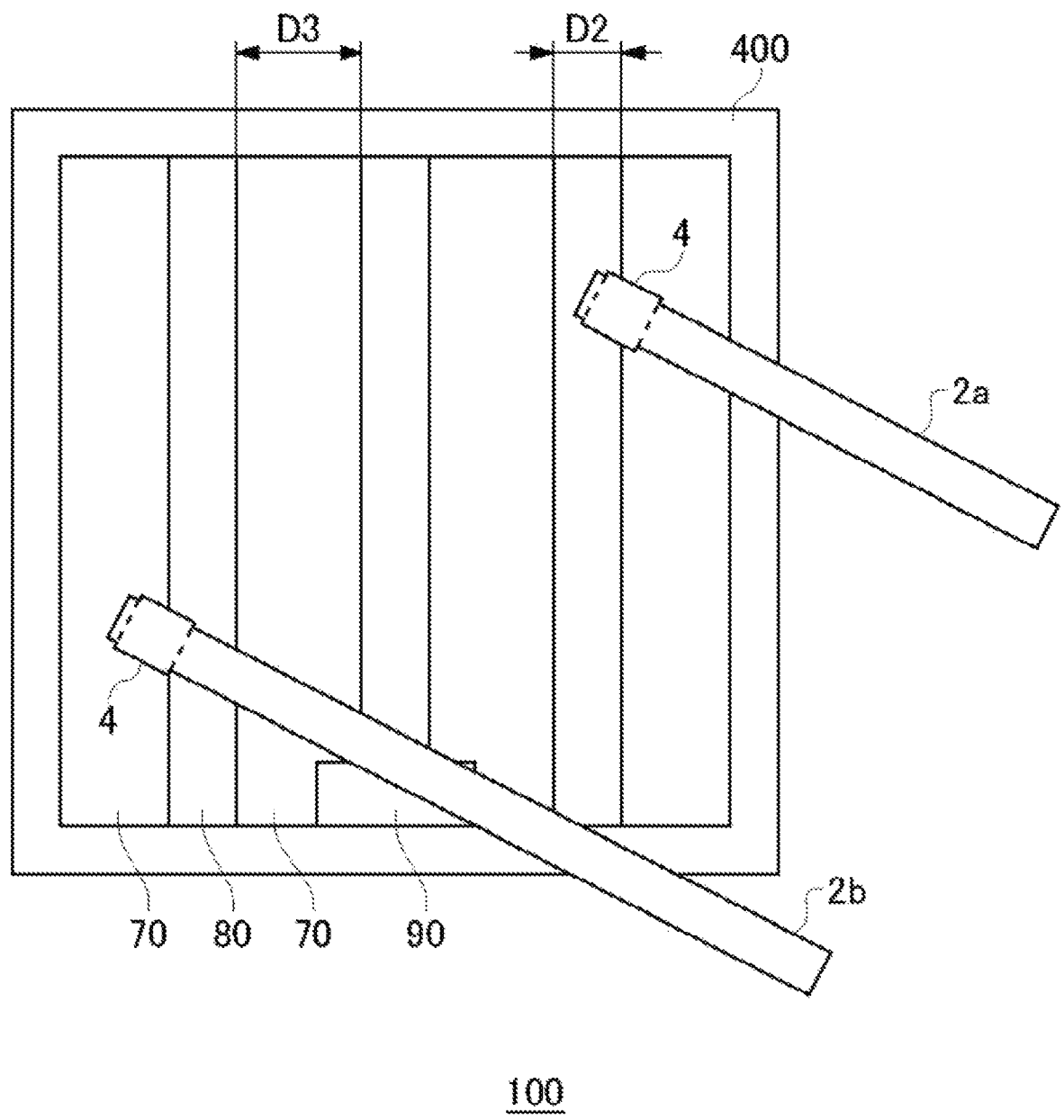
FIG. 31 shows the front surface of the semiconductor device 100 in another example.

FIG. 31 shows the front surface of the semiconductor device 100 in another example. In the above-described semiconductor device 100, the case where the external wiring 2 extends in the direction parallel to the first direction and the case where the external wiring 2 extends in the direction orthogonal to the first direction have been described. However, the semiconductor device 100 is not limited to these cases. As shown in FIG. 31, the external wiring 2 may also extend in a direction oblique to the first direction. In the case of FIG. 31 as well, the junction portion 4 in which the external wiring 2 is in contact with the surface electrode 52 is disposed across the regions of the transistor portion 70 and the diode portion 80. The external wiring 2 may be provided such that the region in which the external wirings 2 is in contact with the surface electrode 52 overlaps the boundary between the transistor portion 70 and the diode portion 80 when viewed from the front surface side of the semiconductor substrate 10.

According to the semiconductor device 100 shown in FIG. 31 as well, the junction portion 4 in which the external wirings 2 is in contact with the surface electrode 52 is disposed across the regions of the transistor portion 70 and the diode portion 80. Therefore, the temperature difference between the case where current flows through the transistor portion 70 and the case where current flows through the diode portion 80 can be made small. Accordingly, thermal fatigue in the junction portion 4 is reduced, and the long-term reliability of the semiconductor device 100 can be enhanced.

Figure 32:
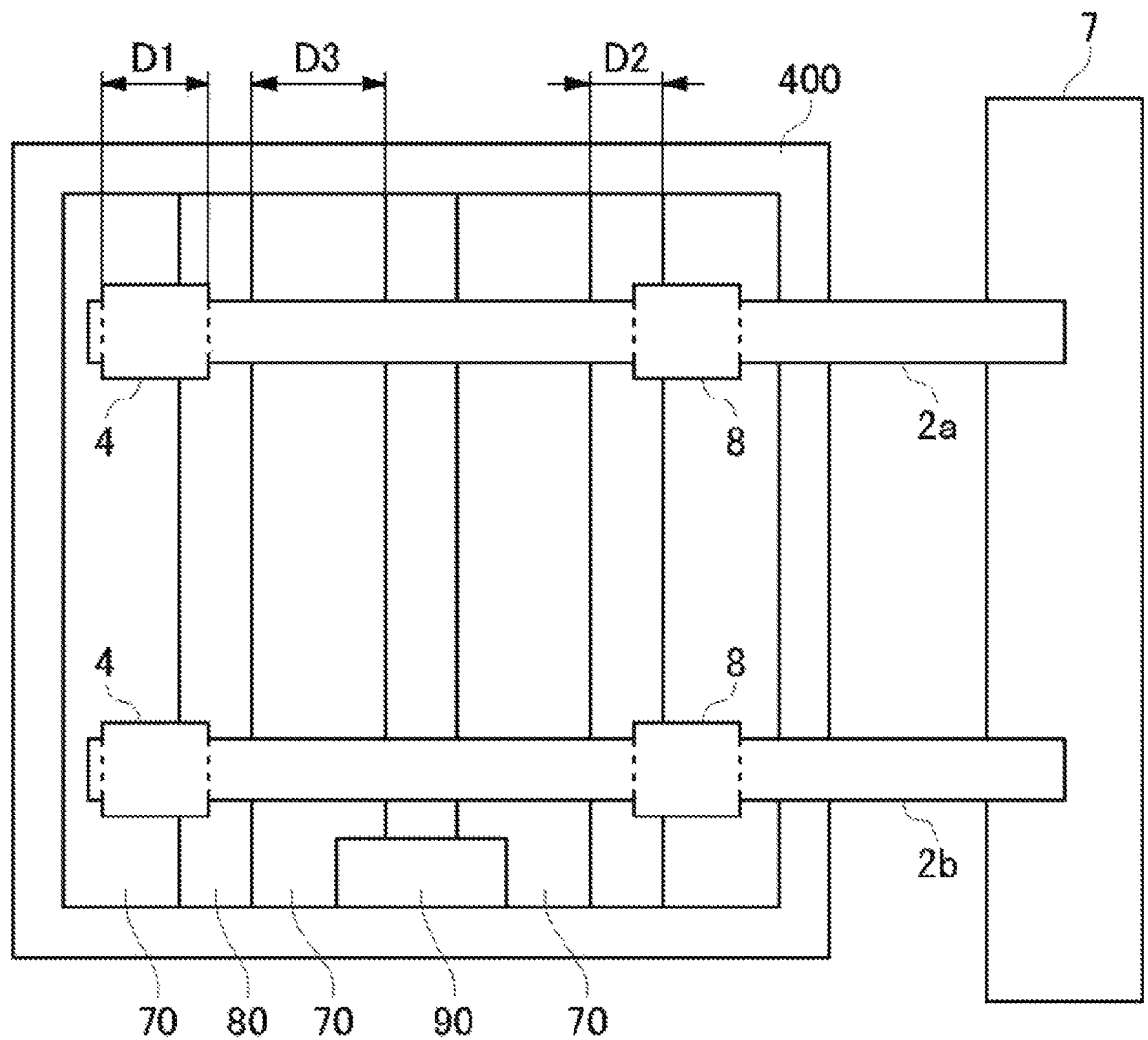
FIG. 32 shows the front surface of the semiconductor device 100 in another example.

FIG. 32 shows the front surface of the semiconductor device 100 in another example. In the present example, each of the external wirings 2a and 2b includes a plurality of external wirings each of which extends while being in contact with the surface electrode 52 in a plurality of junction portions 4 and a plurality of junction portions 8. In the present example, each external wiring 2 is in contact with the surface electrode 52 in two junction portions 4 and two junction portions 8. However, different from the present example, each of the external wirings 2a and 2b may be in contact with the surface electrode 52 in three or more of junction portions. In the wire bonding step, the plurality of junction portions 4 and 8 may be constituted by forming stitches at a plurality of positions. When viewed from the front surface direction of the semiconductor substrate 10, the semiconductor substrate 10 may have a planar shape in which the transistor portion 70 and the diode portion 80 are alternately arranged in a stripe pattern. The transistor portion 70 and the diode portion 80 are alternately arranged along the first direction.

Each of the external wirings 2a and 2b may extend in a direction parallel to the first direction. At least one of the junction portion 4 and the junction portion 8 may be disposed across the regions of the transistor portion 70 and the diode portion 80. In the present example, both of the junction portion 4 and the junction portion 8 may be disposed across the regions of the transistor portion 70 and the diode portion 80. In other words, the junction portion 4 overlaps the boundary between the transistor portion and the diode portion when viewed from the front surface side of the semiconductor substrate. Similarly, the junction portion 8 overlaps the boundary between the transistor portion and the diode portion when viewed from the front surface side of the semiconductor substrate. Similar to the example shown in FIG. 26, the center 5 in the first direction of the junction portion 4 may be arranged above the boundary between the transistor portion 70 and the diode portion 80, and the center 5 in the first direction of the junction portion 8 may be arranged above the boundary between another transistor portion 70 and another diode portion 80.

When viewed from the front surface of the semiconductor substrate 10, a first junction portion 4 may be provided along one side of the surface electrode 52 of the semiconductor device 100 and a second junction portion 8 is provided along the other side opposite to the one side. In particular, the plurality of junction portions 4 and junction portions 8 may be provided corresponding to four corner portions of the surface electrode 52.

Because the number of contact points between the external wiring and the surface electrode 52 increases as the number of the external wirings 2 is larger, heat within the semiconductor device 100 is easily dispersed. However, the number of the external wirings 2 may be limited according to constraint conditions of a circuit pattern of a Direct Copper Bond (DCB) substrate 7 to which the external wirings 2 is connected, and the like. According to the present example, because the plurality of junction portions 4 and 8 are provided to one external wiring 2, the number of the contact points between the external wiring and the surface electrode 52 can be increased without increasing the number of the external wirings 2. Therefore, even if the number of the external wirings 2 is limited, thermal fatigue in the junction portion of the external wiring can be reduced and the long-term reliability can be enhanced.

Figure 33:
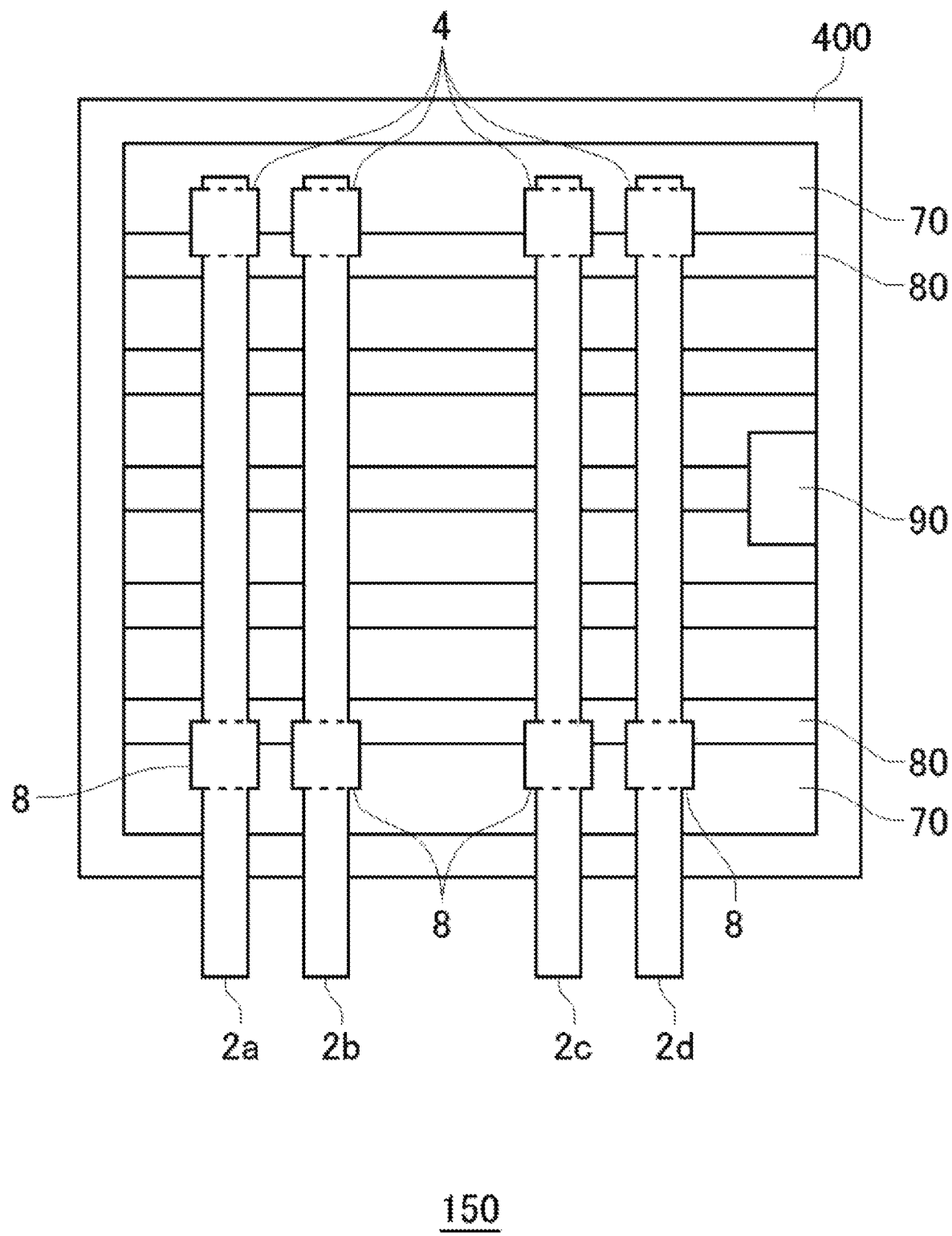
FIG. 33 shows the front surface of the semiconductor device 100 in another example.
Figure 34:
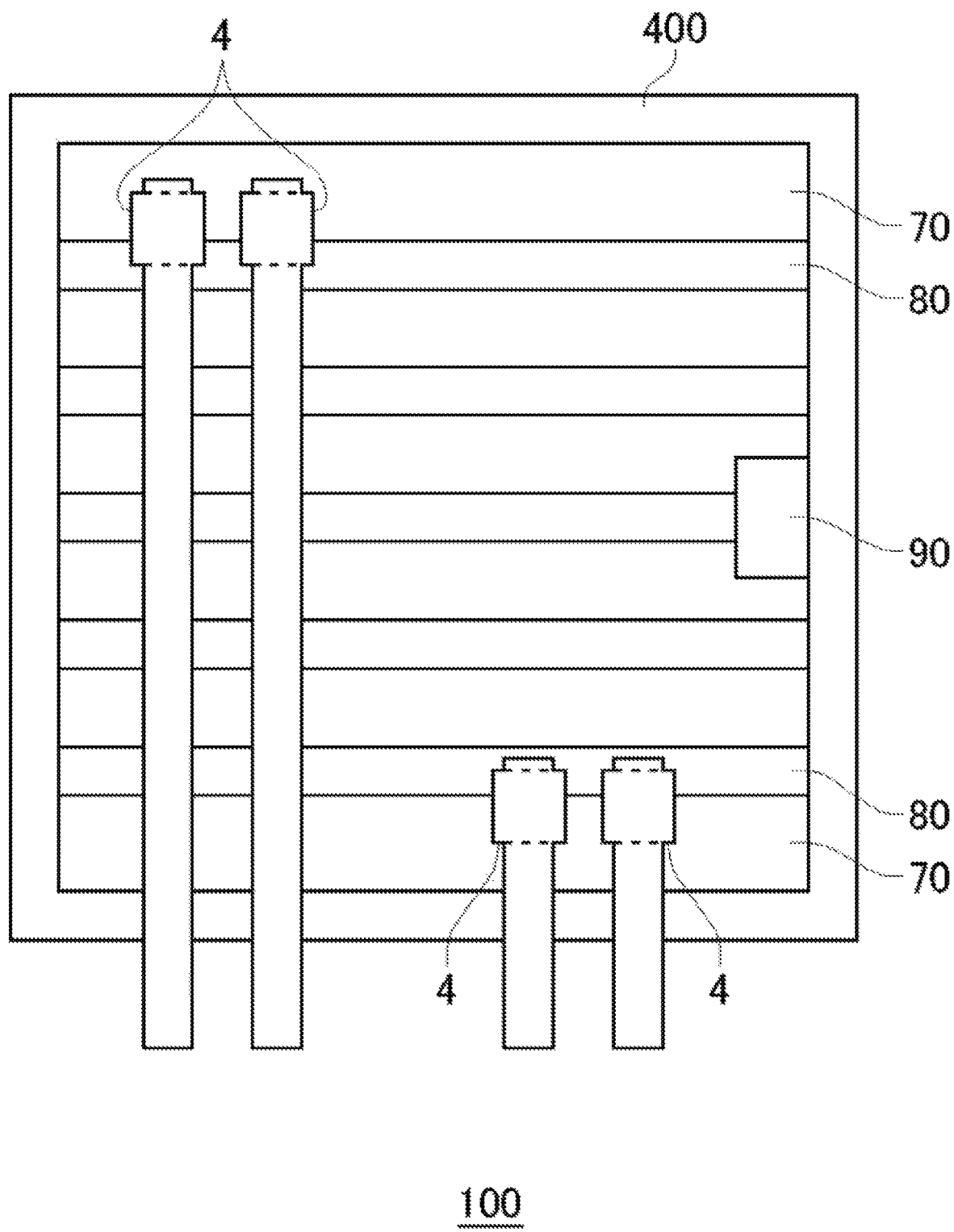
FIG. 34 shows the front surface of the semiconductor device 100 in another example.

Note that the number of the external wirings 2 is not limited to the case of FIG. 32. FIG. 33 shows the front surface of the semiconductor device 100 in another example. The semiconductor device 100 shown in FIG. 33 has four external wirings 2a, 2b, 2c and 2d. The external wirings 2a, 2b, 2c and 2d are provided such as one external wiring 2 extends while being in contact with the surface electrode 52 in the plurality of junction portions 4 and the plurality of junction portions 8. FIG. 34 shows the front surface of the semiconductor device 100 in another example. In the semiconductor device 100 shown in FIG. 34 one piece of the external wiring is provided with one junction portion.

In the semiconductor device 100 shown in FIG. 34, the junction portion 4 of the external wiring 2 is not provided symmetrically on the X axis and the Y axis within the chip surface of the semiconductor device 100. In the case shown in FIG. 34, the junction portion 4 is provided on positions corresponding to two corner portions present on the opposite corners among the four corner portions of the surface electrode 52; however, the junction portion 4 is not provided on positions corresponding to the other two corner portions. Taking the center of the surface electrode 52 as the origin, when the surface electrode 52 is equally divided into four regions that are the first quadrant (X>0, Y>0), the second quadrant (X<0, Y>0), the third quadrant (X<0, Y<0) and the fourth quadrant (X>0, Y<0), the junction portion 4 is present on the second quadrant and the third quadrant, but the junction portion 4 is not present on the first quadrant and the fourth quadrant.

On the other hand, in the semiconductor device 100 shown in FIG. 33, the junction portions 4 and 8 of each external wiring 2 are provided symmetrically to each of the X axis and the Y axis within the chip surface of the semiconductor device 100. When viewed from the front surface of the semiconductor substrate 10, the first junction portion 4 may be provided along one side of the surface electrode 52 of the semiconductor device 100, and the second junction portion 8 may be provided along the other side opposite to the one side. In particular, the plurality of junction portions 4 and the plurality of junction portions 8 may be provided corresponding to the four corner portions of the surface electrode 52.

Figure 35:
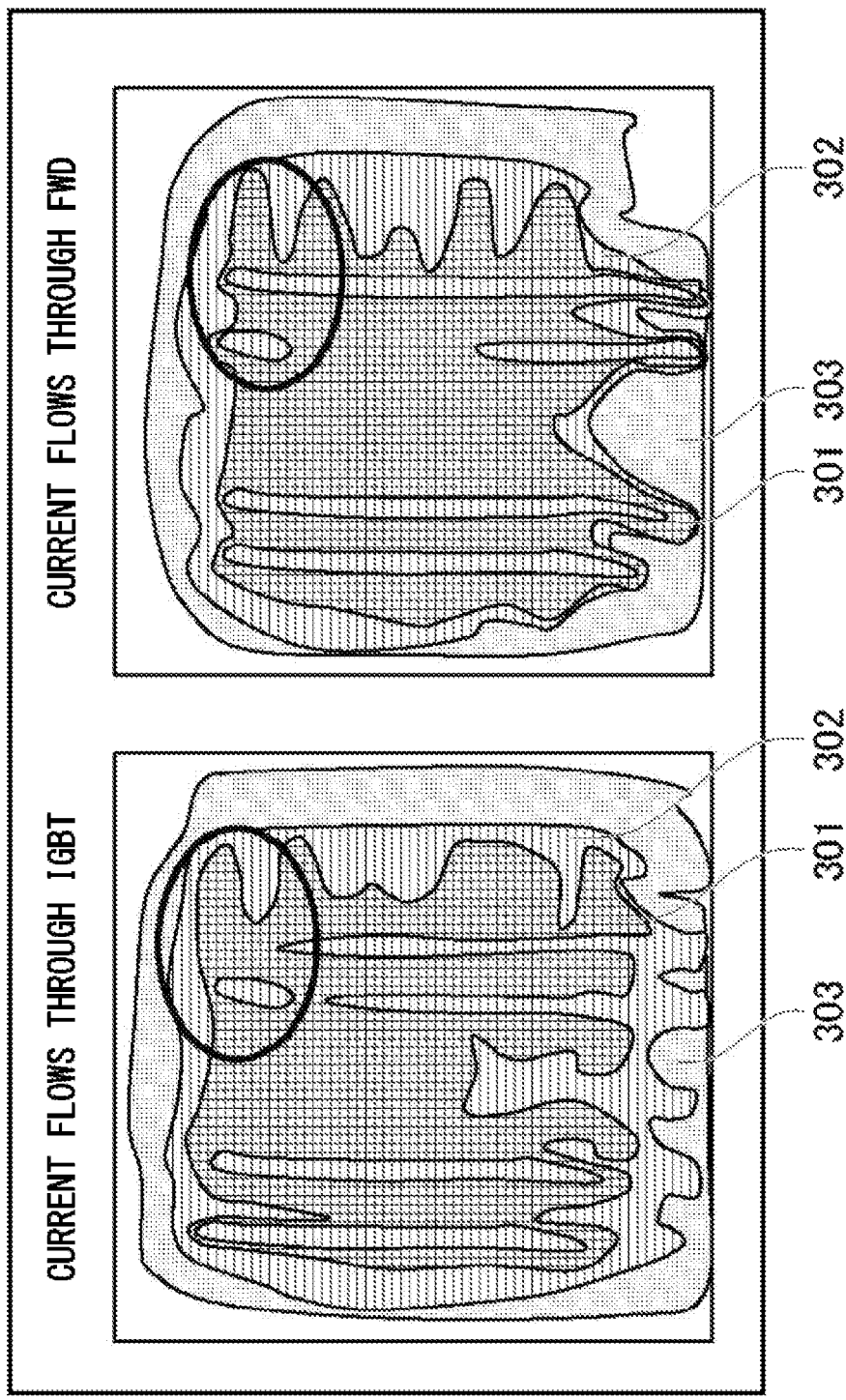
FIG. 35 shows one example of heat diffusion of the semiconductor device 100 shown in FIG. 33.
Figure 36:
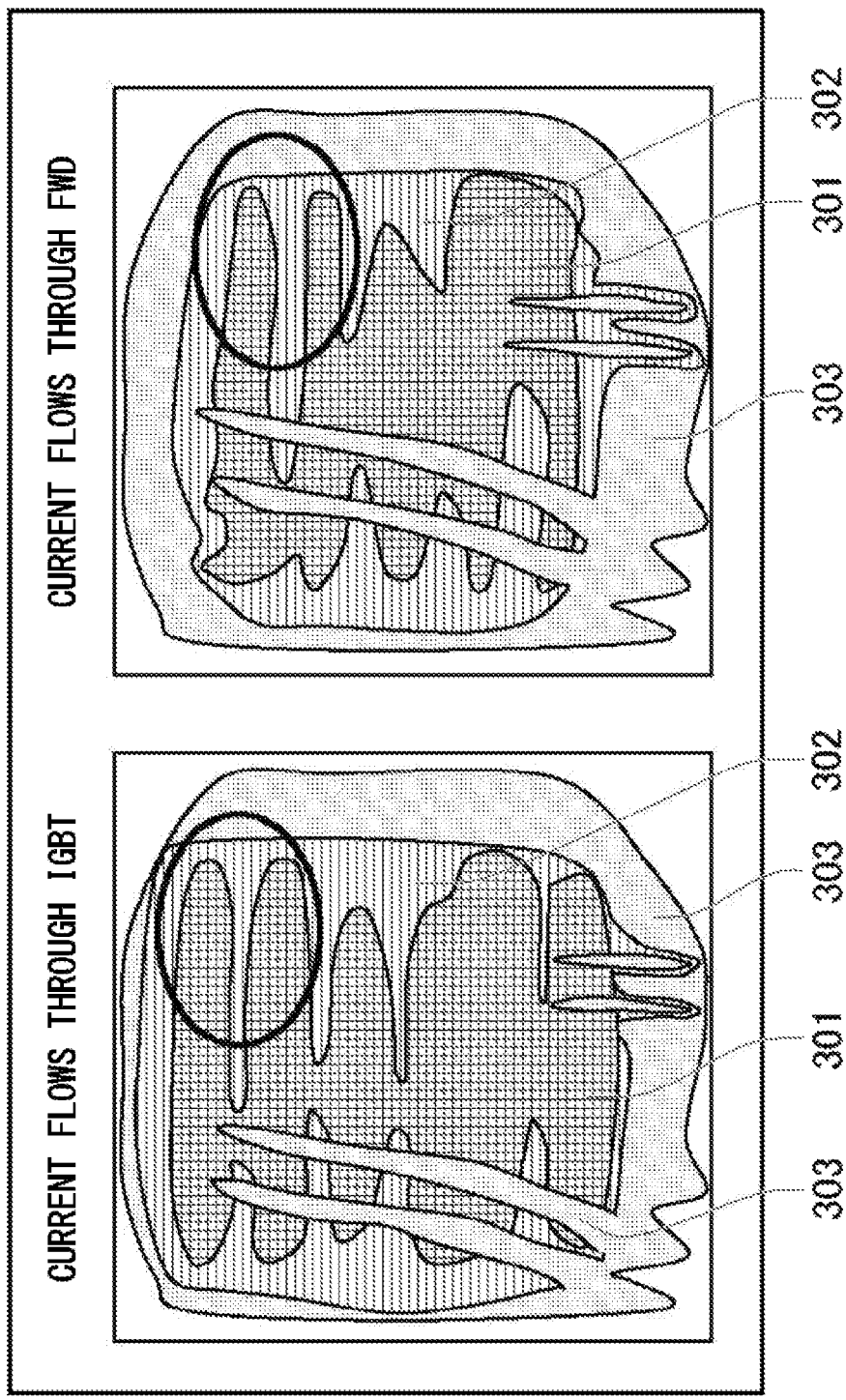
FIG. 36 shows one example of heat diffusion of the semiconductor device 100 shown in FIG. 34.

FIG. 35 shows one example of heat diffusion of the semiconductor device 100 shown in FIG. 33. FIG. 36 shows one example of heat diffusion of the semiconductor device 100 shown in FIG. 34. FIG. 35 shows a temperature distribution while current flows through the transistor portion 70 (IGBT) and a temperature distribution while current flows through the diode portion 80 (FWD). Similarly, FIG. 36 also shows the temperature distribution in a case where current flows through the transistor portion 70 (IGBT) and the temperature distribution in a case where current flows through the diode portion 80 (FWD).

In a case where one junction portion 4 is provided to one piece of the external wirings 2, according to the number of the external wirings 2, the junction portions 4 are unevenly positioned in the plane of the surface electrode 52. Because current flows from the surface electrode 52 to the external wirings 2 through the junction portion 4, a temperature in a region tends to be higher as the number of the junction portions 4, present in the region, in which the external wirings 2 is in contact with the surface electrode 52 is larger. Therefore, when the junction portions 4 is unevenly provided in the plane of the surface electrode 52, an imbalance of the temperature in the plane of the surface electrode 52 occurs. As shown by the circle marks in FIG. 36, in the semiconductor device 100 including the external wirings 2, where one piece of external wiring 2 has one junction portion 4, an imbalance of the temperature in the plane may occur.

On the other hand, in the semiconductor device 100 in which one piece of external wiring 2 has a plurality of junction portions 4 and a plurality of junction portions 8, the plurality of junction portions 4 and the plurality of junction portions 8 may be provided corresponding to four corner portions of the surface electrode 52. Therefore, even if the number of external wirings 2 is limited, the junction portions 4 and the junction portions 8 can be arranged in a wide area without an uneven arrangement. Therefore, the imbalance of the temperature in the plane of the surface electrode 52 due to the uneven arrangement of the junction portions can be prevented from occurring. As shown in FIG. 35, when one piece of external wiring 2 has the plurality of junction portions 4 and the plurality of junction portions 8, compared to the case shown in FIG. 36, the imbalance of the temperature in the plane is reduced.

In particular, the plurality of junction portions 4 and the plurality of junction portions 8 are respectively disposed across the regions of the transistor portion 70 and the diode portion 80, and accordingly, the temperature difference due to generated heat between the case where current flows through the IGBT and the case where current flows through the FWD becomes small. As the present example, by increasing the number of the junction portions 4 and the number of the junction portions 8, the temperature difference can be further reduced. Therefore, thermal fatigue in the junction portion 4 in which the external wirings 2 of the semiconductor device 100 is in contact with the surface electrode 52 is reduced.

Figure 37:
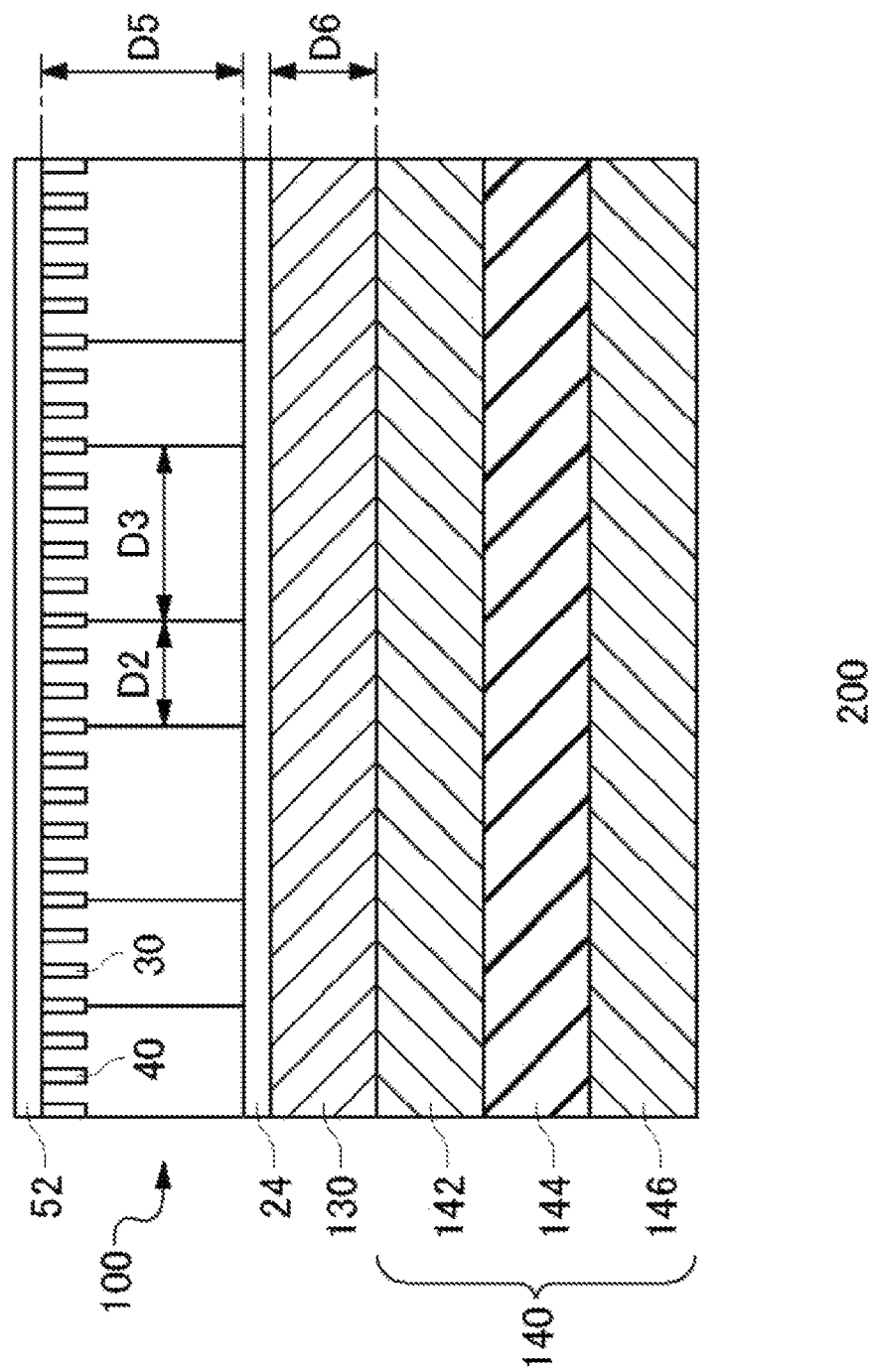
FIG. 37 shows one example of the cross section of a semiconductor module 200 including the semiconductor device 100.

FIG. 37 shows one example of a cross section of a semiconductor module 200 including the semiconductor device 100. The semiconductor module 200 of FIG. 37 may include the semiconductor device 100, a solder layer 130 and a DCB substrate 140. The semiconductor device 100 may be similar to the above-described semiconductor device 100 shown in FIG. 1 to FIG. 3, FIG. 18 and FIG. 19, FIG. 20 or FIG. 21 to FIG. 27 and FIG. 29 to FIG. 34. Therefore, the repeated descriptions are omitted.

In the DCB substrate 140, a copper substrate 142 is in a direct junction on the front side of the insulating substrate 144. On the other hand, a copper substrate 146 is in a direct junction on a back surface side of the insulating substrate 144. The insulating substrate 144 may be configured with at least one insulating material selected from the group of aluminum oxide ($Al_2O_3$), aluminum nitride (AlN) and silicon nitride (SiN).

The semiconductor device 100 includes the solder layer 130 below the semiconductor substrate 10. Specifically, the solder layer 130 may be joined between a collector electrode 24 provided on the back surface of the semiconductor device 100 and the copper substrate 142 of the DCB substrate 140. A thickness of the solder layer 130 may be 70 μm or more and 200 μm or less. When the thickness of the solder layer 130 is 70 μm or less, it is difficult to form an alloy layer between the copper substrate 142 and the solder layer 130, and the copper substrate 142 and the solder layer 130 may not be able to be joined to each other. A sintering treatment by mixing silver (Ag) particulates may also be performed on the solder layer 130.

The thickness D5 of the semiconductor substrate 10 may be 100 μm or more. The thickness D6 of the solder layer 130 may be 50 μm or more and 200 μm or less, and more preferably, may be 100 μm or more and 200 μm or less. Then, a sum (D5+D6) of the thickness D5 of the semiconductor substrate 10 and the thickness D6 of the solder layer 130 may be larger than the width D3 of the transistor portion 70 in the X-axis direction. Similarly, the sum (D5+D6) of the thickness D5 of the semiconductor substrate 10 and the thickness D6 of the solder layer 130 may be larger than the width D2 of the diode portion 80 in the X-axis direction.

In the present example, the solder layer 130 also contributes to heat transmission. As the sum of the thickness D5 of the semiconductor substrate 10 and the thickness D6 of the solder layer 130 is small, heat conduction from a region that is generating heat to an adjacent region is difficult and the temperature distribution is easily nonuniform. Therefore, it is preferable that if the sum of the thickness D5 and the thickness D6 is small, the width D2 of the diode portion 80 in the X-axis direction and the width D3 of the transistor portion 70 in the X-axis direction are set small to achieve the uniformity of the temperature distribution.

According to the present example, the width D3 of the transistor portion 70 and the width D2 of the diode portion 80 can be set by considering the thickness D5 of the semiconductor substrate 10 and the thickness D6 of the solder layer 130. Therefore, the width D3 of the transistor portion 70 and the width D2 of the diode portion 80 can be set by considering heat conduction by the semiconductor substrate 10 and the solder layer 130 in the semiconductor device 100.

Figure 38B:
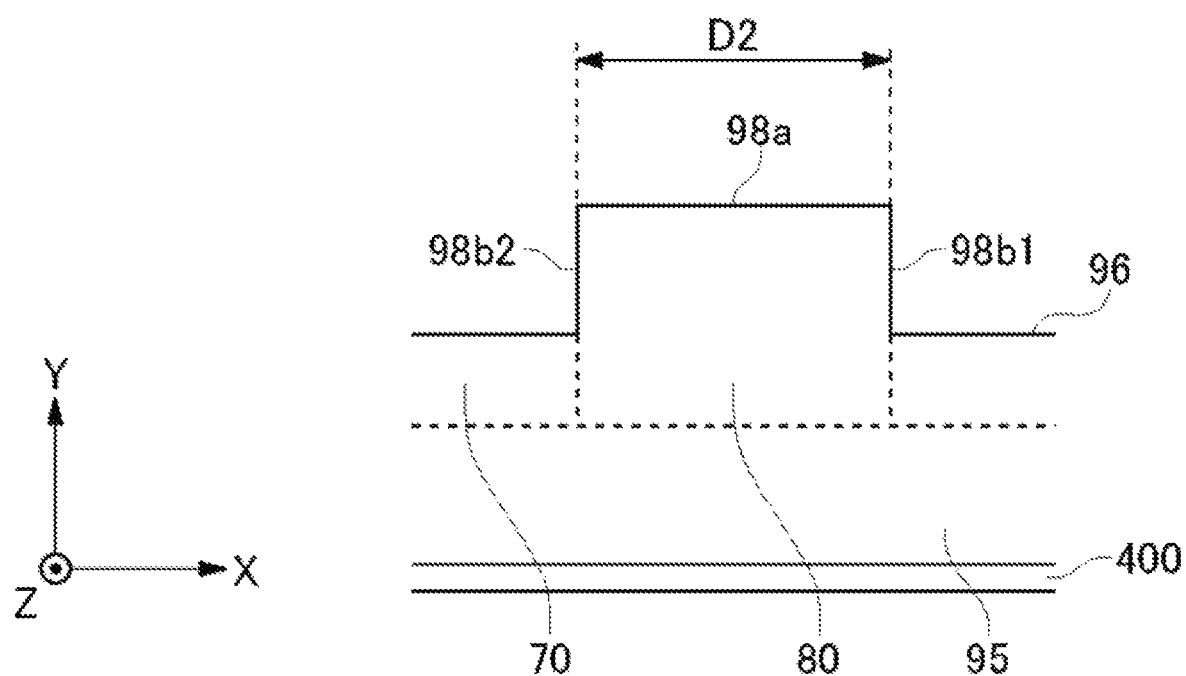
FIG. 38B shows an enlarged view of the portion V of FIG. 38A.

FIG. 38A and FIG. 38B show one example of wire bonding positioning of the semiconductor device 100. FIG. 38A shows the front surface of the semiconductor device 100, and FIG. 38B shows an enlarged view of the portion V of FIG. 38A.

To arrange the center 5 in the first direction (the X direction) of the junction portion 4 in which the external wirings 2 is in contact with the surface electrode 52 shown in FIG. 26 above the boundary between the transistor portion 70 and the diode portion 80, a bonding position of the external wiring needs to be correctly determined.

A protective film 95 is provided on an upper surface of the surface electrode 52 of the semiconductor device 100. The protective film 95 includes a first opening 96 that exposes the surface electrode 52 connecting the external wirings 2, and a second opening 97 that exposes a gate electrode 90. The protective film 95 can be any film that can have insulating property, such as polyimide, epoxy resin or a silicon nitride film, for example, to protect the surface of the semiconductor device 100.

The protective film 95 includes, in the first opening 96, a protruded portion 98 that protrudes toward the central portion of the semiconductor device 100. That is, the first opening 96 includes the protruded portion 98 in a plan view. The plan view may mean a view when viewed from the front surface side of the semiconductor device 100. The protruded portion 98 has an edge portion 98a parallel to the first direction (the X direction) and an edge portion 98b1 and an edge portion 98b2 parallel to a direction (the Y direction) perpendicular to the first direction. The edge portion 98b1 and the edge portion 98b2 parallel to a direction (the Y direction) perpendicular to the first direction of the protruded portion 98 are arranged along the boundary between the diode portion 80 and the transistor portion 70.

The position to connect the external wirings 2 and the surface electrode 52 is determined by using a wire bonding apparatus to detect the edge portion 98a arranged parallel to the first direction of the protruded portion 98 and either the edge portion 98b1 or the edge portion 98b2 arranged parallel to a direction perpendicular to the first direction. By arranging the edge portion 98b1 and the edge portion 98b2 arranged parallel to the direction perpendicular to the first direction along the boundary between the diode portion 80 and the transistor portion 70, the center 5 in the first direction of the junction portion 4 of the external wirings 2 can be connected with high accuracy above the boundary between the transistor portion 70 and the diode portion 80.

A width of the protruded portion 98 (a width between the edge portion 98b1 and the edge portion 98b2) may be the same as the width D2 of the diode portion 80.

Note that although FIG. 38A shows that the protruded portion 98 is provided on the upper surface of every diode portion 80 on the side on which the gate electrode 90 of the semiconductor device 100 is provided, it is sufficient that at least one or more protruded portions 98 are provided on the upper surface of the diode portion 80 of the semiconductor device 100. Also, the protruded portion 98 may also be provided on the protective film 95 on the opposite side to the side on which the gate electrode 90 of the semiconductor device 100 is provided.

Also, it is sufficient that one of the edge portion 98b1 and the edge portion 98b2 parallel to the direction (the Y direction) perpendicular to the first direction of the protruded portion 98 is arranged along the boundary between the diode portion 80 and the transistor portion 70.

Figure 39A:
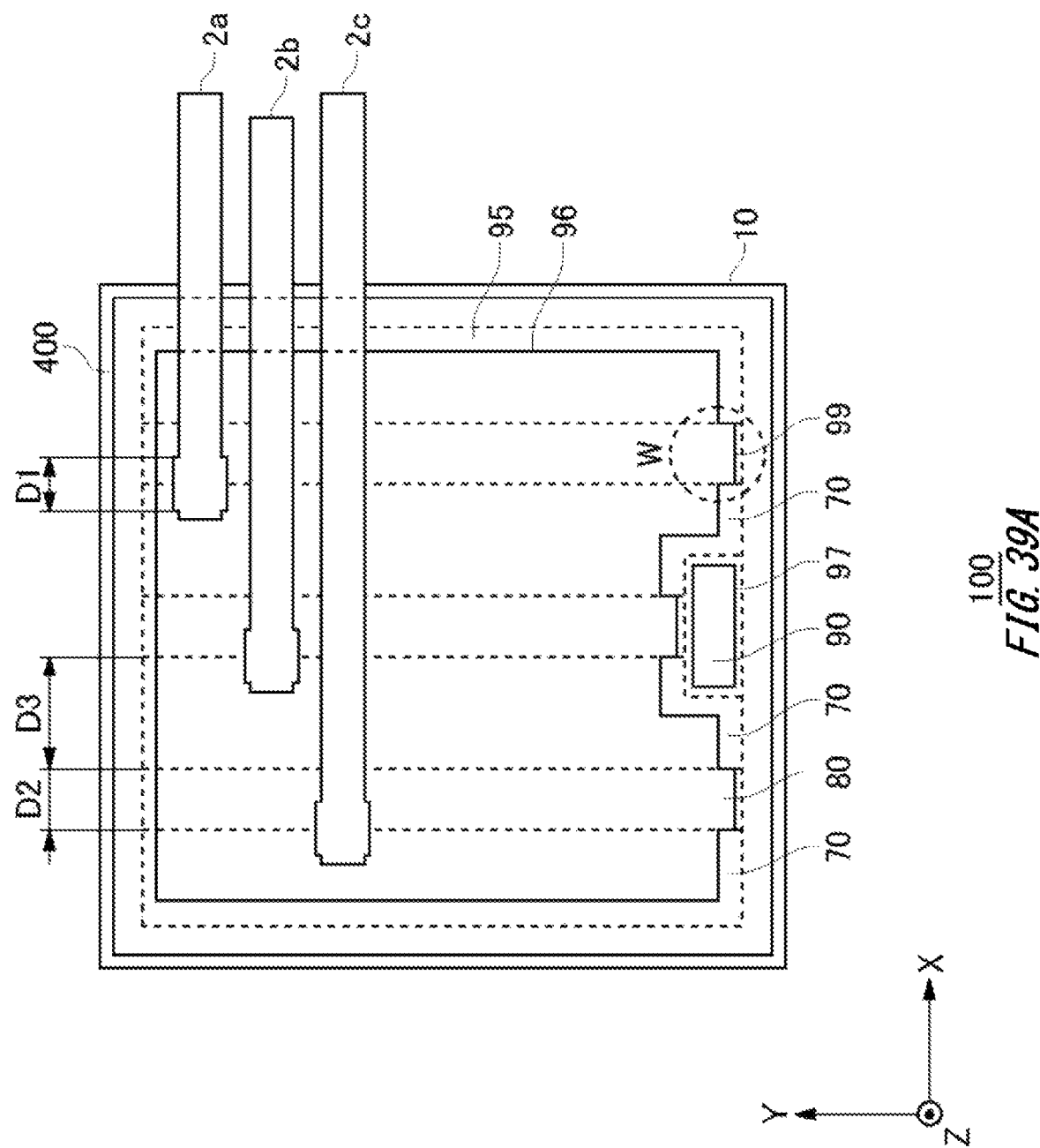
FIG. 39A shows another example of the positioning of the wire bonding of the semiconductor device 100.
Figure 39B:
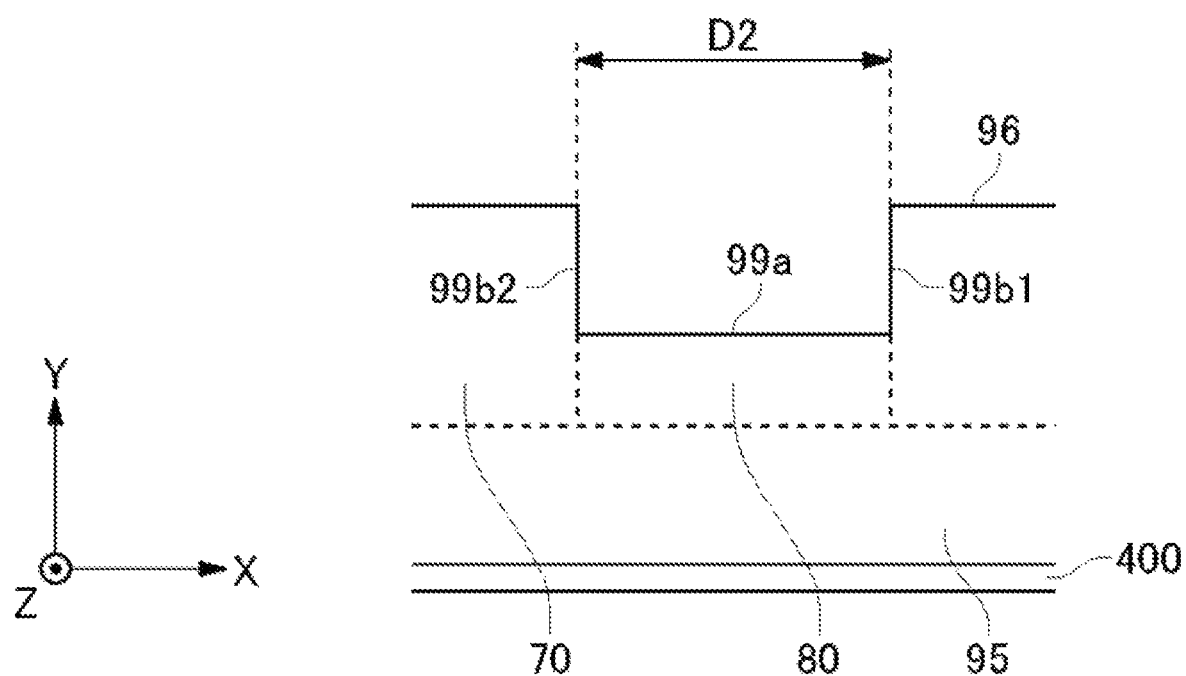
FIG. 39B shows an enlarged view of the portion W of FIG. 39A.

FIG. 39A and FIG. 39B show another example of the wire bonding positioning of the semiconductor device 100. FIG. 39A shows the front surface of the semiconductor device 100, and FIG. 39B shows an enlarged view of the portion W of FIG. 39A. A different respect from FIG. 38A and FIG. 38B is that the first opening 96 included in the protective film 95 has a recessed portion 99.

The protective film 95 includes, in the first opening 96, the recessed portion 99 that is recessed toward the outer circumference of the semiconductor device 100. The recessed portion 99 has 99a parallel to the first direction (the X direction), and 99b1 and 99b2 parallel to a direction (the Y direction) perpendicular to the first direction. 99b1 and 99b2 parallel to the direction (the Y direction) perpendicular to the first direction of the recessed portion 99 are arranged along the boundary between the diode portion 80 and the transistor portion 70.

The position to connect the external wirings 2 to the surface electrode 52 is determined by using a wire bonding apparatus to detect 99a arranged parallel to the first direction of the recessed portion 99 and either 99b1 or 99b2 arranged parallel to the direction perpendicular to the first direction. By arranging 99b1 and 99b2 arranged parallel to the direction perpendicular to the first direction along the boundary between the diode portion 80 and the transistor portion 70, the center 5 in the first direction of the junction portion 4 of the external wirings 2 can be connected with high accuracy above the boundary between the transistor portion 70 and the diode portion 80.

A width of the recessed portion 99 (a width between 99b1 and 99b2) may be the same as the width D2 of the diode portion 80. Note that although FIG. 39A shows that the recessed portion 99 is provided on the upper surface of every diode portion 80 on the side on which the gate electrode 90 of the semiconductor device 100 is provided, it is sufficient that at least one or more recessed portion 99 is provided on the upper surface of the diode portion 80 of the semiconductor device 100.

Also, the recessed portion 99 may also be provided on the protective film 95 on the opposite side to the side on which the gate electrode 90 of the semiconductor device 100 is provided. Also, it is sufficient that one of 99b1 and 99b2 parallel to the direction (the Y direction) perpendicular to the first direction of the recessed portion 99 is arranged along the boundary between the diode portion 80 and the transistor portion 70.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

2 . . . external wiring; 4 . . . junction portion; 5 . . . center; 6 . . . feed portion; 7 . . . DCB substrate; 8 . . . junction portion; 10 . . . semiconductor substrate; 12 . . . emitter region; 14 . . . base region; 15 . . . accumulating layer; 18 . . . drift region; 20 . . . buffer region; 22 . . . collector region; 24 . . . collector electrode; 30 . . . dummy trench portion; 32 . . . dummy insulating film; 34 . . . dummy conductive portion; 38 . . . interlayer dielectric film; 40 . . . gate trench portion; 42 . . . gate insulating film; 44 . . . gate conductive portion; 52 . . . surface electrode; 61 . . . mesa portion; 70 . . . transistor portion; 80 . . . diode portion; 82 . . . cathode region; 90 . . . gate electrode; 95 . . . protective film; 96 . . . first opening; 97 . . . second opening; 98 . . . protruded portion; 99 . . . recessed portion; 100 . . . semiconductor device; 101 . . . semiconductor device; 104 . . . central portion; 106 . . . outer circumferential portion; 110 . . . heat diffused region; 120 . . . heat-not-diffused region; 130 . . . layer; 140 . . . DCB substrate; 142 . . . copper substrate; 144 . . . insulating substrate; 200 . . . semiconductor module; 301 . . . region; 302 . . . region; 303 . . . region; 400 . . . edge termination structure portion

What is claimed is:

1. A semiconductor device comprising:
   a semiconductor substrate;
   a transistor portion and a diode portion that are alternately arranged along a first direction parallel to a front surface of the semiconductor substrate inside the semiconductor substrate;
   a surface electrode that is provided above the transistor portion and the diode portion and that is electrically connected to the transistor portion and the diode portion; and
   an external wiring that is joined to the surface electrode and that has a contact width with the surface electrode in the first direction, the contact width being larger than at least one of a width of the transistor portion in the first direction and a width of the diode portion in the first direction.

2. The semiconductor device according to claim 1, wherein
   the contact width is larger than each of the width of the transistor portion in the first direction and the width of the diode portion in the first direction.

3. The semiconductor device according to claim 1, wherein
   the width of the transistor portion in the first direction is larger than the width of the diode portion in the first direction.

4. The semiconductor device according to claim 1, wherein
   a thickness of the semiconductor substrate is larger than a half of the width of the diode portion in the first direction.

5. The semiconductor device according to claim 1, wherein
   a thickness of the semiconductor substrate is larger than a half of the width of the transistor portion in the first direction.

6. The semiconductor device according to claim 1, wherein
   the external wiring extends along the first direction.

7. The semiconductor device according to claim 1, wherein
   the external wiring is provided such that a region in which the external wiring is in contact with the surface electrode overlaps a boundary between the transistor portion and the diode portion when viewed from the front surface side of the semiconductor substrate.

8. The semiconductor device according to claim 1, wherein
if the surface electrode is distinguished into a central portion and an outer circumferential portion that surrounds the central portion when viewed from the front surface of the semiconductor substrate, the external wiring is joined to the outer circumferential portion.

9. The semiconductor device according to claim 1, wherein
the external wiring includes at least one first external wiring and at least one second external wiring, and
the first external wiring and the second external wiring are joined to opposite corners of the surface electrode when viewed from the front surface of the semiconductor substrate.

10. The semiconductor device according to claim 1, further comprising a solder layer below the semiconductor substrate, wherein
a sum of a thickness of the semiconductor substrate and a thickness of the solder layer is larger than the width of the transistor portion in the first direction.

11. The semiconductor device according to claim 1, further comprising a solder layer below the semiconductor substrate, wherein
a sum of a thickness of the semiconductor substrate and a thickness of the solder layer is larger than the width of the diode portion in the first direction.

12. The semiconductor device according to claim 1, wherein
the width of the diode portion in the first direction is smaller than 540 µm.

13. The semiconductor device according to claim 1, wherein
the width of the diode portion in the first direction is smaller than 320 µm.

14. The semiconductor device according to claim 1, wherein
the width of the transistor portion in the first direction is two times or more and three times or less as large as the width of the diode portion in the first direction.

15. The semiconductor device according to claim 1, wherein
a junction portion in which the external wiring is in contact with the surface electrode is disposed across the transistor portion and the diode portion.

16. The semiconductor device according to claim 1, wherein
a center in the first direction of a junction portion in which the external wiring is in contact with the surface electrode is arranged above a boundary between the transistor portion and the diode portion.

17. The semiconductor device according to claim 1, wherein
a junction portion in which the external wiring is in contact with the surface electrode extends in a direction orthogonal to the first direction.

18. The semiconductor device according to claim 1, wherein
a junction portion in which the external wiring is in contact with the surface electrode extends in a direction parallel to the first direction.

19. The semiconductor device according to claim 1, wherein
the surface electrode is made of a conductive material including aluminum.

20. The semiconductor device according to claim 1, wherein
the external wiring includes a plurality of external wirings each of which extends while being in contact with the surface electrode on a plurality of junction portions.

21. The semiconductor device according to claim 16, comprising a protective film on an upper surface of the surface electrode, wherein
the protective film comprises a first opening that exposes the surface electrode,
the first opening has a protruded portion in a plan view,
a protruded part of the protruded portion is arranged in a direction parallel to the first direction, and
an edge portion that is of the protruded portion and that is perpendicular to the first direction is arranged along the boundary between the transistor portion and the diode portion.

22. The semiconductor device according to claim 16, comprising a protective film on an upper surface of the surface electrode, wherein
the protective film comprises a first opening that exposes the surface electrode,
the first opening has a recessed portion in a plan view,
a bottom portion of the recessed portion is arranged in a direction parallel to the first direction, and
an edge portion that is of the recessed portion and that is perpendicular to the first direction is arranged along the boundary between the transistor portion and the diode portion.

23. The semiconductor device according to claim 20, wherein
each of the plurality of junction portions overlaps a boundary between the transistor portion and the diode portion when viewed from the front surface side of the semiconductor substrate.

24. A method of manufacturing a semiconductor device, the semiconductor device comprising: a semiconductor substrate; a transistor portion and a diode portion that are alternately arranged along a first direction parallel to a front surface of the semiconductor substrate inside the semiconductor substrate; a surface electrode that is provided above the transistor portion and the diode portion and that is electrically connected to the transistor portion and the diode portion; and an external wiring that is joined to the surface electrode and that has a contact width with the surface electrode in the first direction, the contact width being larger than at least one of a width of the transistor portion in the first direction and a width of the diode portion in the first direction, the method comprising:
forming a protective film on an upper surface of the surface electrode; and
forming, in the protective film, a first opening that exposes the surface electrode after forming the protective film, wherein
the external wiring is positioned by using the first opening to be connected to the surface electrode.

25. The method of manufacturing the semiconductor device according to claim 24, wherein
the first opening has a protruded portion in a plan view,
a protruded part of the protruded portion is formed in a direction parallel to the first direction, and
an edge portion that is of the protruded portion and that is perpendicular to the first direction is formed along a boundary between the transistor portion and the diode portion.

26. The method of manufacturing the semiconductor device according to claim 24, wherein
the first opening has a recessed portion in a plan view,
a bottom portion of the recessed portion is formed in a direction parallel to the first direction, and
an edge portion that is of the recessed portion and that is perpendicular to the first direction is formed along a boundary between the transistor portion and the diode portion.

* * * * *